(12) United States Patent
Yun et al.

(10) Patent No.: US 11,626,428 B2
(45) Date of Patent: Apr. 11, 2023

(54) PIXEL AND DISPLAY DEVICE INCLUDING THE SAME

(71) Applicant: Samsung Display Co., LTD., Yongin-si (KR)

(72) Inventors: Hae Ju Yun, Yongin-si (KR); Yong Sub Shim, Yongin-si (KR); Min Seong Yi, Yongin-si (KR); Kyung Bae Kim, Yongin-si (KR); Jin Yool Kim, Yongin-si (KR); Jung Gun Nam, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 133 days.

(21) Appl. No.: 17/335,653

(22) Filed: Jun. 1, 2021

(65) Prior Publication Data

US 2022/0068973 A1    Mar. 3, 2022

(30) Foreign Application Priority Data

Aug. 26, 2020    (KR) .......................... 10-2020-0108120

(51) Int. Cl.
*H01L 25/16*    (2006.01)
*H01L 27/12*    (2006.01)
(Continued)

(52) U.S. Cl.
CPC .......... *H01L 27/124* (2013.01); *H01L 25/167* (2013.01); *H01L 24/24* (2013.01); *H01L 33/62* (2013.01); *H01L 2224/24011* (2013.01); *H01L 2224/24146* (2013.01); *H01L 2924/12041* (2013.01)

(58) Field of Classification Search
CPC ........................... H01L 27/124; H01L 25/167
See application file for complete search history.

(56) References Cited

U.S. PATENT DOCUMENTS

| 9,570,480 B2 | 2/2017 | Lee et al. |
|---|---|---|
| 2019/0114958 A1 | 4/2019 | Shin et al. |

(Continued)

FOREIGN PATENT DOCUMENTS

| EP | 3 002 626 | 1/2019 |
|---|---|---|
| EP | 3 855 496 | 7/2021 |

(Continued)

*Primary Examiner* — James A Dudek
(74) *Attorney, Agent, or Firm* — Kile Park Reed & Houtteman PLLC

(57) ABSTRACT

A display device includes a pixel disposed in a display area. The pixel includes a first electrode and a second electrode spaced apart from each other; a light emitting element disposed between the first electrode and the second electrode and including a first end portion and a second end portion; a third electrode disposed on the first end portion of the light emitting element and electrically connecting the first end portion to the first electrode; and a fourth electrode disposed on the second end portion of the light emitting element and electrically connecting the second end portion to the second electrode. An opening is formed in at least one of the first to fourth electrodes and disposed in a first area and a second area that are adjacent to the first end portion and the second end portion of the light emitting element.

20 Claims, 44 Drawing Sheets

(51) Int. Cl.
    *H01L 23/00*     (2006.01)
    *H01L 33/62*     (2010.01)

(56) References Cited

U.S. PATENT DOCUMENTS

| | | |
|---|---|---|
| 2020/0286421 A1* | 9/2020 | Tzeng ................. H01L 25/0753 |
| 2021/0249392 A1 | 8/2021 | Woo et al. |
| 2021/0327862 A1 | 10/2021 | Bae et al. |
| 2021/0358393 A1 | 11/2021 | Kang et al. |
| 2022/0005979 A1 | 1/2022 | Kang |

FOREIGN PATENT DOCUMENTS

| | | |
|---|---|---|
| EP | 3 890 020 | 10/2021 |
| KR | 10-2021-0102560 | 8/2021 |
| KR | 10-2021-0129790 | 10/2021 |
| WO | 2020/060015 | 3/2020 |
| WO | 2020/111413 | 6/2020 |

* cited by examiner

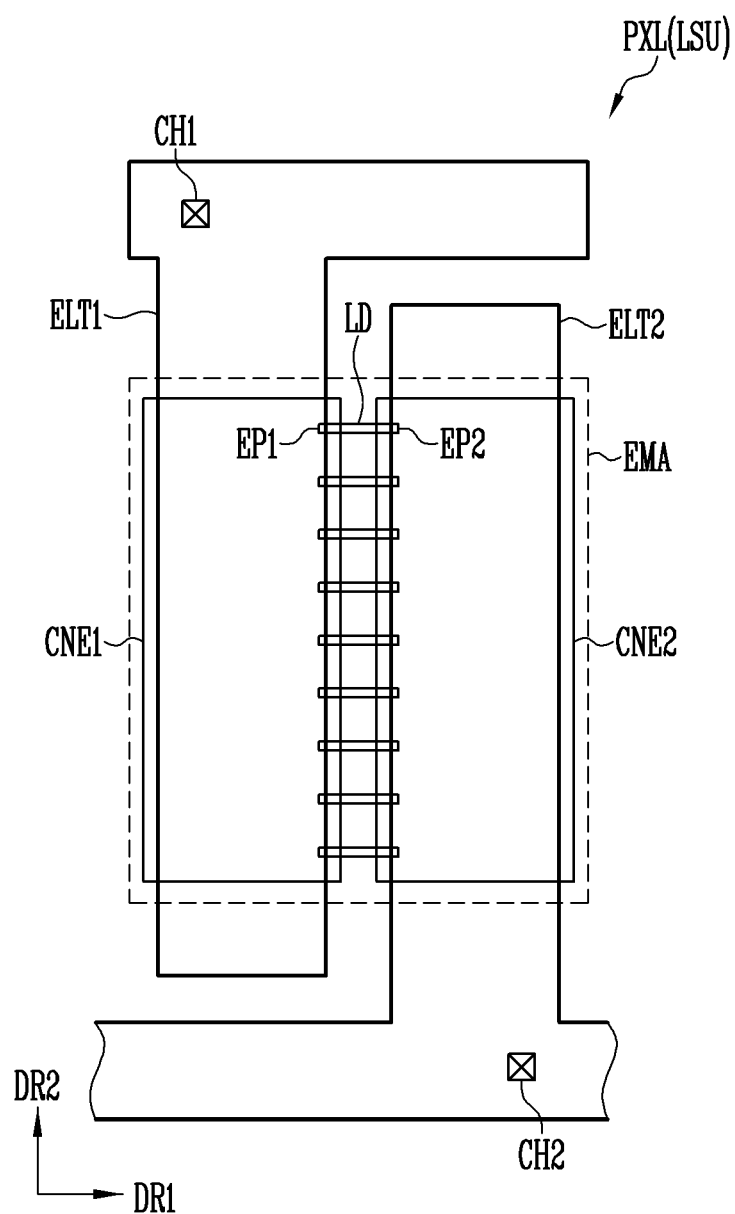

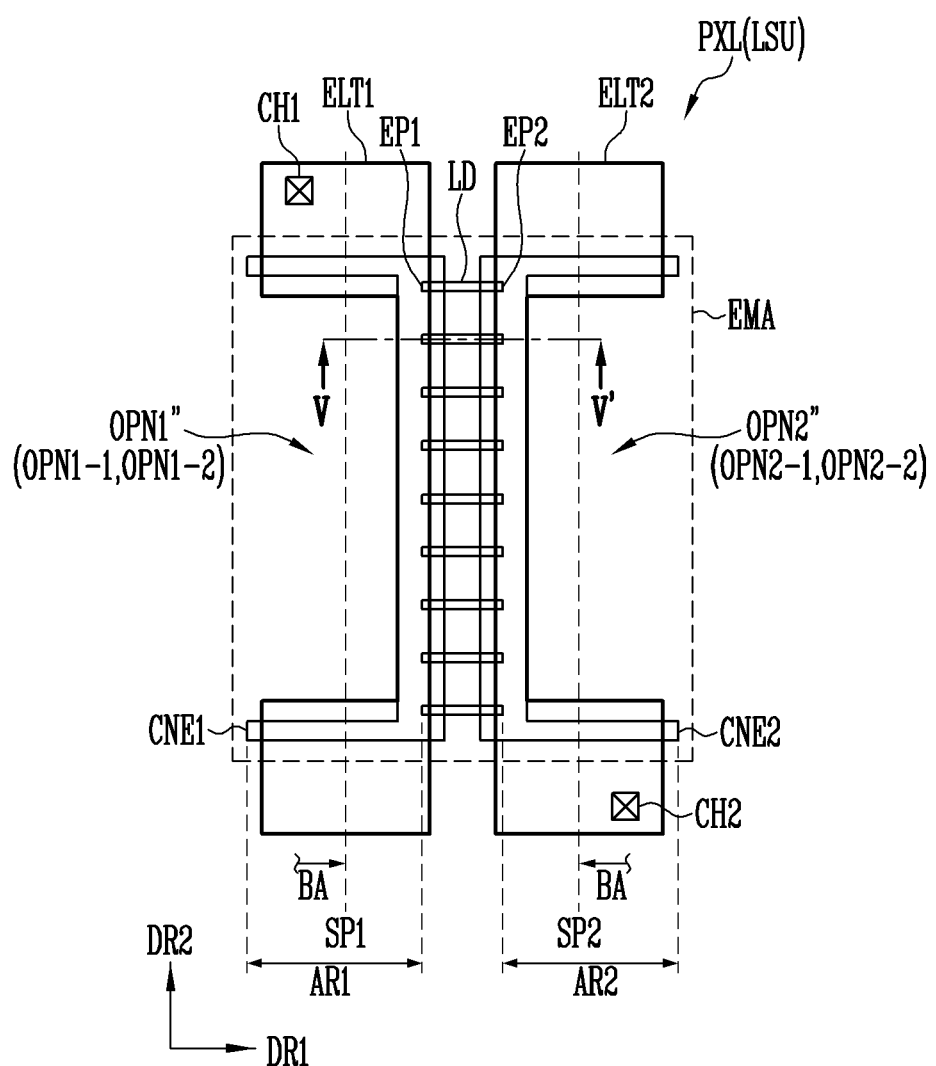

PIXEL AND DISPLAY DEVICE INCLUDING THE SAME

CROSS-REFERENCE TO RELATED APPLICATION(S)

This application claims priority to and benefits of Korean Patent Application No. 10-2020-0108120 under 35 U.S.C. § 119 filed on Aug. 26, 2020 in the Korean Intellectual Property Office, the entire contents of which are incorporated herein by reference.

BACKGROUND

(a) Technical Field

The disclosure relates to a pixel and a display device including the same.

(b) Description of the Related Art

Recently, interest in an information display is increasing. Accordingly, research and development on display devices are continuously being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a pixel including a light emitting element and a display device including the same.

A display device according to an embodiment may include a pixel disposed in a display area. The pixel may include a first electrode and a second electrode spaced apart from each other; a light emitting element disposed between the first electrode and the second electrode, the light emitting element including a first end portion and a second end portion; a third electrode disposed on the first end portion of the light emitting element and electrically connecting the first end portion of the light emitting element to the first electrode; and a fourth electrode disposed on the second end portion of the light emitting element and electrically connecting the second end portion light emitting element to the second electrode. An opening may be formed in at least one of the first electrode, the second electrode, the third electrode, and the fourth electrode and disposed in a first area and a second area that are adjacent to the first end portion and the second end portion of the light emitting element.

The opening may include a first opening formed in at least one of the first electrode and the third electrode in the first area; and a second opening formed in at least one of the second electrode and the fourth electrode in the second area.

The first opening and the second opening may be substantially symmetrical to each other in an area in which the light emitting element may be disposed.

The first opening may be spaced apart from a side of the first electrode facing the second electrode by a first distance. The second opening may be spaced apart from a side of the second electrode facing the first electrode by a second distance, the second distance may be identical to the first distance.

The first electrode and the third electrode may be disposed at a side of the light emitting element, and the second electrode and the fourth electrode may be disposed at another side of the light emitting element. An opening in an area of the first electrode or the third electrode may form the first opening; and an opening in an area of the second electrode or the fourth electrode may form the second opening.

The first opening may be formed inside the first electrode and the third electrode in a plan view; and
The second opening may be formed inside the second electrode and the fourth electrode in a plan view.

The pixel may further include a bank disposed below the first electrode and the second electrode.

The opening may extend from an area between a bank area in which the bank is disposed and the light emitting element to an area overlapping the bank area, in each of the first area and the second area.

The opening may be formed in an area between a bank area in which the bank may be disposed and the light emitting element, in each of the first area and the second area.

The opening may include a plurality of first openings formed in the first area, each of the plurality of first openings extending in a horizontal direction, a vertical direction, or a diagonal direction; and a plurality of second openings formed in the second area, each of the plurality of second openings extending in a horizontal direction, a vertical direction, or a diagonal direction.

The opening may include a first opening formed in the first electrode in the first area; and a second opening formed in the second electrode in the second area.

The opening may include a first opening formed in the third electrode in the first area; and a second opening formed in the fourth electrode in the second area.

The opening may include a first opening formed in the first electrode and the third electrode in the first area; and a second opening formed in the second electrode and the fourth electrode in the second area.

The display device may further include at least one of a first insulation layer disposed on an area of the first electrode and the second electrode and exposing another area of the first electrode and the second electrode; a second insulation layer disposed on an area of the light emitting element and exposing the first end portion and the second end portion of the light emitting element; a third insulation layer disposed on the second insulation layer and the fourth electrode; and a fourth insulation layer disposed on the first electrode, the second electrode, the third electrode, and the fourth electrode, and the light emitting element.

The third insulation layer may be opened in the second area.

The second insulation layer and the third insulation layer may include a same material, and the second insulation layer may be disposed on an area of the light emitting element and not disposed in the first area and the second area.

The display device may further include a filler layer disposed on the fourth insulation layer.

The first electrode may be electrically connected to the third electrode in an edge area of the third electrode; and the second electrode may be electrically connected to the fourth electrode in an edge area of the fourth electrode.

An embodiment provides a pixel that may include a first electrode; a second electrode spaced apart from the first electrode; a light emitting element disposed between the first electrode and the second electrode, the light emitting element including a first end portion and a second end portion;

a third electrode disposed on the first end portion of the light emitting element and electrically connecting the first end portion of the light emitting element to the first electrode; and a fourth electrode disposed on the second end portion of the light emitting element and electrically connecting the second end portion of the light emitting element to the second electrode. The pixel may include an opening formed in at least one of the first electrode, the second electrode, the third electrode, and the fourth electrode and disposed in a first area and a second area that may be adjacent to the first end portion and the second end portion of the light emitting element.

The pixel may further include an insulation layer disposed on the fourth electrode, the insulation layer may include an end disposed between the third electrode and the fourth electrode, and the insulation layer may be opened in the second area.

The pixel according to various embodiments may include a light emitting element and an opening formed in at least one pixel electrode in an area adjacent to the light emitting element. According to the pixel and the display device including the same, it is possible to improve light efficiency of the pixel by reducing or preventing loss of light emitted from the light emitting element.

BRIEF DESCRIPTION OF THE DRAWINGS

The above and other aspects and features of the disclosure will become more apparent by describing in detail embodiments thereof with reference to the attached drawings, in which:

FIG. 7A to FIG. 7D respectively illustrate a top plan view of a pixel according to an embodiment.

FIG. 15A and FIG. 15B respectively illustrate a top plan view of a pixel according to an embodiment.

DETAILED DESCRIPTION OF THE EMBODIMENTS

Figure 1A:
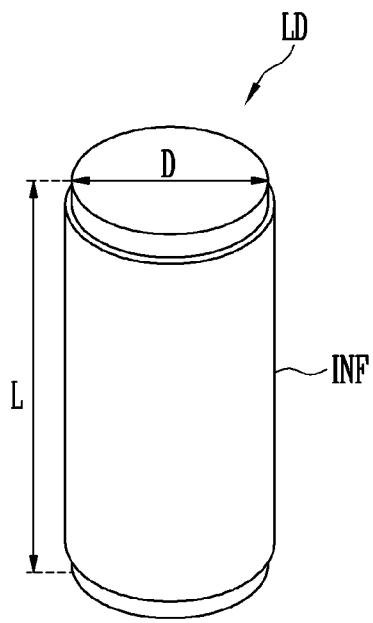
FIG. 1A and FIG. 1B illustrate a perspective view and a schematic cross-sectional view of a light emitting element according to an embodiment, respectively.

Since the disclosure may be variously modified and have various forms, embodiments will be illustrated and described in detail in the following. In the description below, singular forms are to include plural forms unless the context clearly indicates only the singular.

However, the disclosure is not limited to the embodiments disclosed hereinafter and may be implemented in various forms. In addition, each embodiment disclosed below may be implemented alone, or may be implemented in combination with at least one other embodiment.

Some or a number of the elements not directly related to the features of the disclosure in the drawing may be omitted in order to clearly illustrate the disclosure. In addition, some or a number of the elements in the drawing can be illustrated in somewhat exaggerated sizes, ratios, and the like within the spirit and the scope of the disclosure. The same reference numerals and symbols are used to describe the same or similar elements throughout the drawings so that duplicate descriptions may be omitted.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1A and FIG. 1B, FIG. 2A and FIG. 2B, and FIG. 3A and FIG. 3B respectively illustrate perspective and schematic cross-sectional views of a light emitting element LD according to an embodiment. FIG. 1A to FIG. 3B illustrate a circular columnar light emitting element LD, but a type and/or shape of the light emitting element LD according to the disclosure is not limited thereto.

Referring to FIG. 1A to FIG. 3B, the light emitting element LD may include a first semiconductor layer 11 and a second semiconductor layer 13, and an active layer 12 interposed between the first and second semiconductor layers 11 and 13. For example, the light emitting element LD may include the first semiconductor layer 11, the active layer 12, and the second semiconductor layer 13 sequentially stacked each other along a length L direction.

The light emitting element LD may be provided to have a substantially rod shape extending along one or a direction. In a case that the extending direction of the light emitting element LD is the length L direction, the light emitting element LD may have a first end portion EP1 and a second end portion EP2 along the length L direction.

One of the first and second semiconductor layers 11 and 13 may be disposed on the first end portion EP1 of the light emitting element LD. For example, the remaining one of the first and second semiconductor layers 11 and 13 may be disposed on the second end portion EP1 of the light emitting element LD.

In an embodiment, the light emitting element LD may be a substantially rod-shaped light emitting element (also referred to as a "rod-shaped light emitting diode") manufactured in a rod shape through an etching method or the like within the spirit and the scope of the disclosure. In the specification, "rod shape" refers to a rod-like shape or bar-like shape (for example, with an aspect ratio greater than 1) that may be long in the length L direction, such as a substantially circular cylinder or a substantially polygonal cylinder, but a shape of a cross section thereof is not particularly limited. For example, the length L of the light emitting element LD may be larger than a diameter D thereof (or a width of a lateral cross-section thereof).

The light emitting element LD may have a size as small as a nano-scale or a micro-scale. For example, the light emitting element LD may each have the diameter D (or width) and/or the length L ranging from a nano scale to a micro scale. However, the size of the light emitting element LD in the disclosure is not limited thereto. For example, the size of the light emitting element LD may be variously changed according to design conditions of various devices using a light emitting device using the light emitting element LD as a light source, for example, a display device.

The first semiconductor layer 11 may be a first conductive semiconductor layer. For example, the first semiconductor layer 11 may include at least one N-type semiconductor layer. For example, the first semiconductor layer 11 may include a semiconductor material of one of InAlGaN, GaN, AlGaN, InGaN, AlN, and InN, and may include a N-type semiconductor layer doped with a first conductive dopant such as Si, Ge, Sn, or the like within the spirit and the scope of the disclosure. However, the material included in the first semiconductor layer 11 is not limited thereto, and the first semiconductor layer 11 may be made of various materials.

The active layer 12 is disposed on the first semiconductor layer 11, and may be formed to have a single or multi-quantum well (MQW) structure. A position of the active layer 12 may be variously changed according to a type of the light emitting element LD. The active layer 12 may emit light having a wavelength in a range of about 400 nm to about 900 nm, and may have a double heterostructure.

A clad layer (not illustrated) doped with a conductive dopant may be formed or disposed at an upper portion and/or a lower portion of the active layer 12. For example, the clad layer may be formed as an AlGaN layer or an InAlGaN layer. In an embodiment, a material such as AlGaN and AlInGaN may be used to form the active layer 12, and for example, various materials may form the active layer 12.

The second semiconductor layer 13 is disposed to on the active layer 12, and may include a semiconductor layer of a type different from that of the first semiconductor layer 11. For example, the second semiconductor layer 13 may include at least one p-type semiconductor layer. For example, the second semiconductor layer 13 may include at least one semiconductor material of InAlGaN, GaN, AlGaN, InGaN, AlN, and InN, and may include a P-type semiconductor layer doped with a second conductive dopant such as Mg. However, the material included in the second semiconductor layer 13 is not limited thereto, and the second semiconductor layer 13 may be formed of various materials.

Figure 1B:
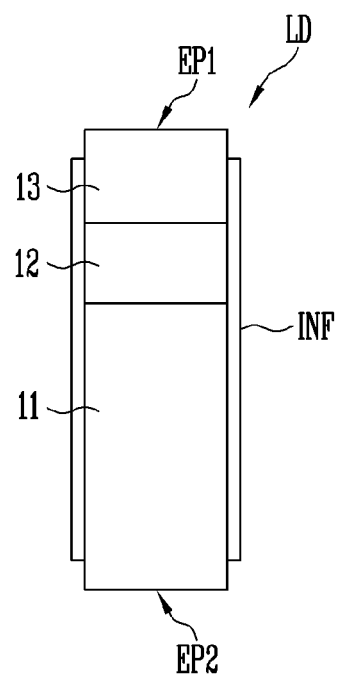

In an embodiment, the first semiconductor layer 11 and the second semiconductor layer 13 may have different lengths (or thicknesses) in the length L direction of the light emitting element LD. For example, the first semiconductor layer 11 may have a longer length (or thicker thickness) than that of the second semiconductor layer 13 along the length L direction of the light emitting element LD. Accordingly, the active layer 12 of the light emitting element LD may be disposed closer to the upper surface of the second semiconductor layer 13 than the lower surface of the first semiconductor layer 11 as illustrated in FIG. 1A and FIG. 1B.

In a case that a voltage of a threshold voltage or more is applied to respective ends of the light emitting element LD, the light emitting element LD emits light while electron-hole pairs are combined in the active layer 12. By controlling the light emission of the light emitting element LD by using this principle, the light emitting element LD may be used as a light source for various light emitting devices in addition to pixels of a display device.

In an embodiment, the light emitting element LD may further include an additional component in addition to the first semiconductor layer 11, the active layer 12, the second semiconductor layer 13 and/or an insulating film INF. For example, the light emitting element LD may additionally include one or more of a phosphor layer, an active layer, a semiconductor layer, and/or an electrode layer disposed on one or an end side of the first semiconductor layer 11, the active layer 12, and/or the second semiconductor layer 13.

Figure 2A:
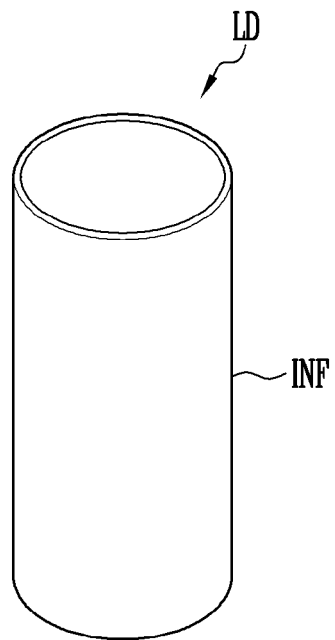
FIG. 2A and FIG. 2B illustrate a perspective view and a schematic cross-sectional view of a light emitting element according to an embodiment, respectively.
Figure 2B:
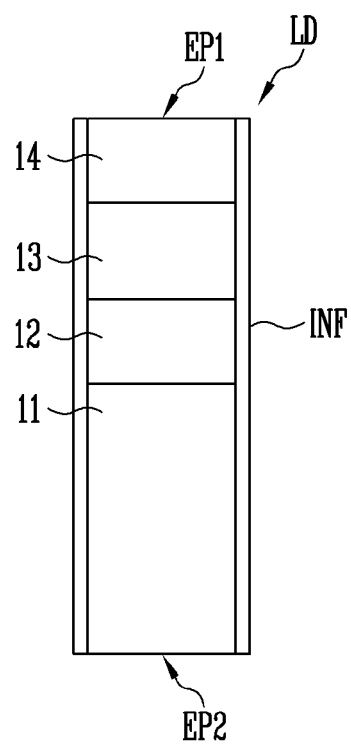

For example, the light emitting element LD may further include an electrode layer 14 disposed at one or an end side of the second semiconductor layer 13 as illustrated in FIG. 2A and FIG. 2B. The electrode layer 14 may be disposed at the first end portion EP1 of the light emitting element LD.

Figure 3A:
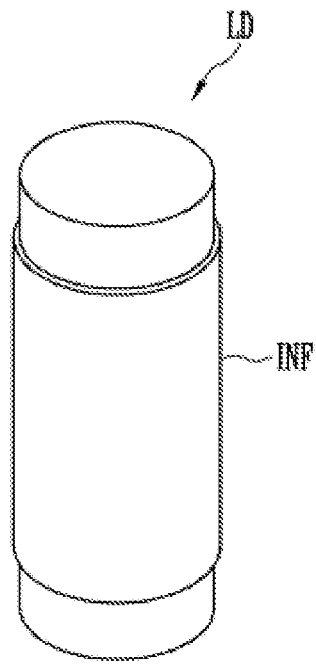
FIG. 3A and FIG. 3B illustrate a perspective view and a schematic cross-sectional view of a light emitting element according to an embodiment, respectively.
Figure 3B:
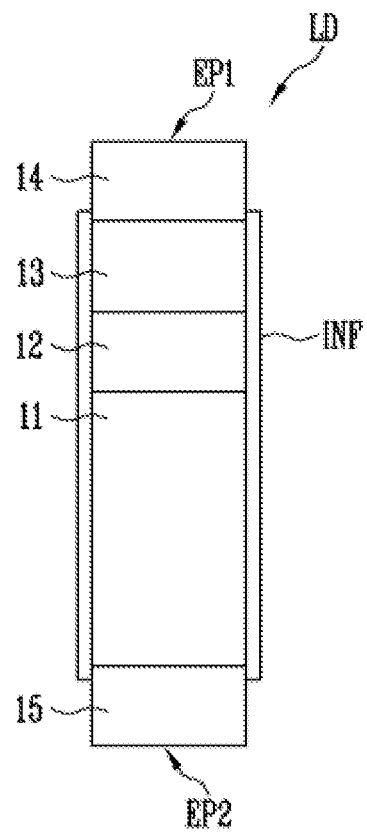

For example, the light emitting element LD may further include another electrode layer 15 disposed at one or an end side of the first semiconductor layer 11 as illustrated in FIG. 3A and FIG. 3B. For example, the electrode layers 14 and 15 may be disposed at the first and second end portions EP1 and EP2 of the light emitting element LD.

The electrode layers 14 and 15 may be an ohmic contact electrode, but are not limited thereto. For example, the electrode layers 14 and 15 may be a short Schottky contact electrode.

For example, the electrode layers 14 and 15 may include a metal or metal oxide. For example, the electrode layers 14 and 15 may be formed by singly using or mixing chromium (Cr), titanium (Ti), aluminum (Al), gold (Au), nickel (Ni), an oxide thereof or alloy thereof, and ITO. Materials included in each of the electrode layers 14, and 15 may be the same or different from each other.

The electrode layers 14, and 15 may be substantially transparent or translucent. Accordingly, light generated by the light emitting element LD may pass through the electrode layers 14 and 15 and may be emitted to the outside of the light emitting element LD. In an embodiment, in a case that the light generated by the light emitting element LD does not transmit through the electrode layers 14 and 15 and is emitted to the outside of the light emitting element LD through an area excluding respective end portions of the light emitting element LD, the electrode layers 14 and 15 may include an opaque metal.

In an embodiment, the light emitting element LD may further include an insulating film INF provided or disposed on a surface thereof. The insulating film INF may be formed or disposed on the surface of the light emitting element LD to surround at least an outer circumferential surface of the active layer 12, and may further surround one or an area of the first and second semiconductor layers 11 and 13.

In a case that the light emitting element LD may include the electrode layers 14 and 15, the insulating film INF may at least partially or may not cover or overlap outer surfaces of the electrode layers 14 and 15. For example, the insulating film INF may be selectively formed or disposed on the surfaces of the electrode layers 14 and 15.

The insulating film INF may expose respective end portions of the light emitting element LD in the length (L) direction of the light emitting element LD. For example, the insulating film INF exposes at least one of the first and second semiconductor layers 11 and 13 and of the electrode layers 14 and 15 at the first and second end portions EP1 and EP2 of the light emitting element LD. For example, in an embodiment, the insulating film INF may not be provided or disposed in the light emitting element LD.

In a case that the insulating film INF is provided or disposed to cover or overlap a surface of the light emitting element LD, for example, an outer surface of the active layer 12, it is possible to prevent the active layer 12 from being short-circuited to at least one electrode (for example, a first or second electrode of a pixel) that is not illustrated. Accordingly, electrical stability of the light emitting element LD may be secured. In describing each embodiment, the term "connection (or coupling)" may substantially mean a physical and/or electrical connection (or coupling). For example, this may substantially mean a direct or indirect connection (or coupling), and an integrated or non-integrated connection (or coupling).

The insulating film INF may include a transparent insulating material. For example, the insulating film INF may include at least one insulating material of $SiO_2$ or a silicon oxide ($SiO_x$) not determined thereby, $Si_3N_4$ or a silicon nitride ($SiN_x$) not determined thereby, a silicon oxynitride ($SiO_xN_y$), ($Al_2O_3$) or an aluminum oxide ($Al_xO_y$) not determined thereby, and $TiO_2$ or a titanium oxide ($Ti_xO_y$) not determined thereby, but is not limited thereto. For example, a constituent material of the insulating film INF is not particularly limited, and the insulating film INF may be made of various insulating materials.

In a case that the insulating film INF is provided or disposed on the surface of the light emitting element LD, it is possible to improve the life-span and efficiency thereof by minimizing surface defects of the light emitting element LD. For example, in a case that the insulating film INF is formed or disposed on each light emitting element LD, it is possible to prevent an unwanted short circuit between the light emitting elements LD from occurring even in a case that a plurality of light emitting elements LD are disposed in close contact with each other.

In an embodiment, the light emitting element LD may be manufactured through a surface treatment process. For example, in a case that the plurality of light emitting elements LD are mixed with a fluid solution (or a solvent) and supplied to each light emitting area (for example, a light emitting area of each pixel), each light emitting element LD may be surface-treated so that the light emitting elements LD are not non-uniformly aggregated in the solution and are uniformly distributed.

As a non-limiting embodiment in this regard, the insulating film INF itself may be formed as a hydrophobic film using a hydrophobic material, or a hydrophobic film made of a hydrophobic material may be additionally formed or disposed on the insulating film INF. In an embodiment, the hydrophobic material may be a material containing fluorine to be hydrophobic. For example, in an embodiment, the hydrophobic material may be applied to the light emitting elements LD in a form of a self-assembled monolayer (SAM). The hydrophobic material may include octadecyl trichlorosilane, fluoroalkyl trichlorosilane, perfluoroalkyl triethoxysilane, or the like within the spirit and the scope of the disclosure. For example, the hydrophobic material may be a commercially available fluorine-containing material such as Teflon™ or Cytop™, or a material corresponding thereto.

A light emitting device including the light emitting element LD may be used in various types of devices that require a light source in addition to a display device. For example, a plurality of light emitting elements LD may be disposed in a light emitting area of each pixel of a display panel, and the light emitting elements LD may be used as a light source of each pixel. However, an application field of the light emitting element LD is not limited to the above-described example. For example, the light emitting element LD may be used in other types of devices that require a light source, such as a lighting device.

Figure 4A:
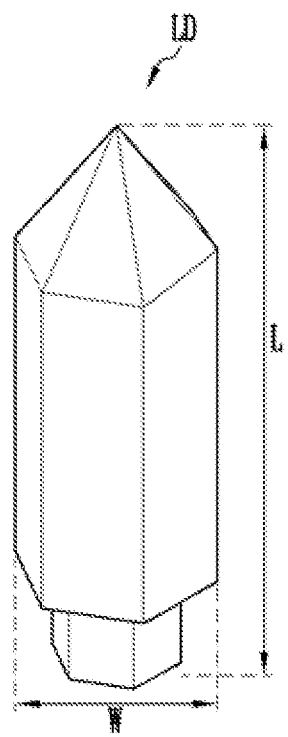
FIG. 4A and FIG. 4B illustrate a perspective view and a schematic cross-sectional view of a light emitting element according to an embodiment, respectively.
Figure 4B:
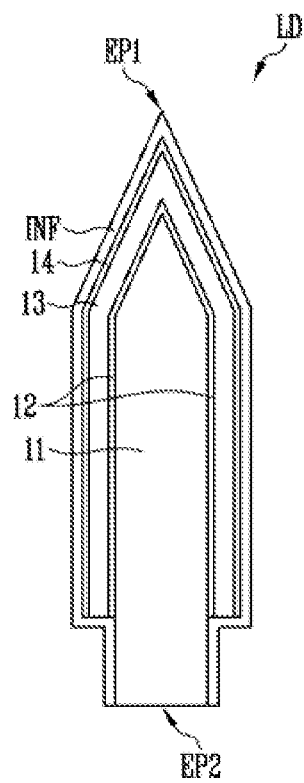

FIG. 4A and FIG. 4B illustrate a perspective views and a schematic cross-sectional view of a light emitting element LD according to an embodiment, respectively. In an embodiment, FIGS. 4A and 4B illustrate a light emitting element LD having a structure different from the light emitting elements LD illustrated in FIG. 1A to FIG. 3B, for example, a light emitting element having a core-shell structure. For example, in the disclosure, a type, structure, and/or shape of the light emitting element LD may be variously changed. In an embodiment of FIG. 4A and FIG. 4B, the same reference numerals are denoted to similar or identical constituent elements (for example, constituent elements corresponding to each other) as those of FIG. 1A to FIG. 3B, and detailed descriptions thereof will be omitted.

Referring to FIG. 4A and FIG. 4B, the light emitting element LD may include a first semiconductor layer 11 and a second semiconductor layer 13, and an active layer 12 interposed between the first and second semiconductor layers 11 and 13. According to an embodiment, the first semiconductor layer 11 is disposed in a central area of the light emitting element LD, and the active layer 12 may be disposed on the surface of the first semiconductor layer 11 to surround at least one or an area of the first semiconductor layer 11. For example, the second semiconductor layer 13 may be disposed on a surface of the active layer 12 to surround at least one or an area of the active layer 12.

For example, the light emitting element LD may selectively further include an electrode layer 14 surrounding at least one or an area of the second semiconductor layer 13, and/or an insulating film INF disposed on an outermost surface of the light emitting element LD. For example, the light emitting element LD may include the electrode layer 14 disposed on a surface of the second semiconductor layer 13 to surround at least one or an area of the second semiconductor layer 13, and the insulating film INF disposed on a surface of the electrode layer 14 to surround at least one or an area of the electrode layer 14.

In an embodiment, the insulating film INF may be provided or disposed on the surface of the light emitting element LD to cover or overlap a portion of an outer surface of the first semiconductor layer 11 and an outer surface of the electrode layer 14. In an embodiment, after the insulating film INF is first formed or disposed to cover or overlap the entire outer circumferential surface of the electrode layer 14 included in the light emitting element LD, the insulating film INF may be partially removed to expose an area of the electrode layer 14 for electrical connection to an electrode (for example, a first electrode of a pixel), which is not illustrated. The insulating film INF may include a transparent insulating material.

The light emitting element LD according to the above-described embodiment may be a light emitting element having a core-shell structure (also referred to as a "core-shell light emitting diode") manufactured through a growth method or the like within the spirit and the scope of the disclosure. For example, the light emitting element LD may have a core-shell structure including the first semiconductor layer 11, the active layer 12, the second semiconductor layer 13, the electrode layer 14, and the insulating film INF sequentially disposed from a center to an outer direction. In an embodiment, the light emitting element LD may not include at least one of the electrode layer 14 and the insulating film INF.

In an embodiment, the light emitting element LD may have a substantially polygonal horn shape extending along one or a direction. For example, at least one or an area of the light emitting element LD may have a substantially hexagonal horn shape. However, the shape of the light emitting element LD may be variously changed according to embodiments.

In a case that the extending direction of the light emitting element LD is the length L direction, the light emitting element LD may have a first end portion EP1 and a second end portion EP2 along the length L direction. One of the first and second semiconductor layers 11 and 13 (or an electrode layer surrounding one of the first and second semiconductor layers 11 and 13) may be disposed at the first end portion EP1 of the light emitting element LD, and the other one of the first and second semiconductor layers 11 and 13 (or an electrode layer surrounding the other of the first and second semiconductor layers 11 and 13) may be disposed at the second end portion EP2 of the light emitting element LD.

In an embodiment, the light emitting element LD has a core-shell structure in which the first end portion EP1 protrudes to have a shape of a substantially polygonal horn (for example, a shape of a substantially hexagonal horn), and may be a light emitting diode having an ultra-small size. For example, the light emitting element LD may have a shape in which a hexagonal horn and a hexagonal column are combined, and may have a size as small as a nanometer scale to a micrometer scale, for example, a width W and/or a length L of a nanometer scale or a micrometer scale range. However, the size and/or shape of the light emitting element LD may be variously changed according to design conditions of various devices using the light emitting element LD as a light source, for example, a display device.

In an embodiment, both end portions of the first semiconductor layer 11 may have a shape substantially protruding along the length L direction of the light emitting element LD. The protruding shapes of both end portions of the first semiconductor layer 11 may be different from each other. For example, one or an end portion disposed at an upper side of both end portions of the first semiconductor layer 11 may have a substantially horn shape (for example, a hexagonal horn shape) contacting one or a vertex as a width thereof narrows toward an upper portion. For example, the other end portion disposed at a lower side of both end portions of the first semiconductor layer 11 may have a substantially polygonal column shape (for example, a substantially hexagonal column shape) having a constant width, but is not limited thereto. For example, in an embodiment, the first semiconductor layer 11 may have a cross section of a substantially polygonal shape or substantially a step shape, which may gradually decrease in width as it goes downward. The shapes of both end portions of the first semiconductor layer 11 may be variously changed according to embodiments.

The first semiconductor layer 11 may be disposed at a core of the light emitting element LD, for example, at a center (or central area). For example, the light emitting element LD may be provided to have a shape substantially corresponding to a shape of the first semiconductor layer 11. For example, in a case that the first semiconductor layer 11 has a substantially hexagonal horn shape at one or an end portion of an upper side thereof, the light emitting element LD may have a substantially hexagonal horn shape at one or an end portion (for example, the first end portion EP1) of an upper side thereof.

The active layer 12 may be provided and/or formed or disposed to surround the outer circumferential surface of the first semiconductor layer 11. For example, the active layer 12 may be provided and/or formed or disposed to surround a remaining area excluding an end portion of one or a side of the first semiconductor layer 11 (for example, one or an end portion of a lower side of the first semiconductor layer 11) in the length L direction of the light emitting element LD.

The second semiconductor layer 13 may be provided and/or formed or disposed to surround the outer circumferential surface of the active layer 12, and may include a semiconductor layer of a different type from the first semiconductor layer 11. For example, in a case that the first semiconductor layer 11 may include an N-type semiconductor layer, the second semiconductor layer 13 may include a P-type semiconductor layer.

In an embodiment, the light emitting element LD may further include an electrode layer 14 surrounding an outer circumferential surface of the second semiconductor layer 13. The electrode layer 14 may be an ohmic contact electrode or a Schottky key contact electrode electrically connected to the second semiconductor layer 13, but is not limited thereto.

As described above, the light emitting element LD may be formed to have a substantially core-shell structure having a shape in which both end portions substantially protrude, and it may include the first semiconductor layer 11 provided or disposed at the center thereof, the active layer 12 surrounding the first semiconductor layer 11, and the second semiconductor layer 13 surrounding the active layer 12. For example, the light emitting element LD may selectively further include the electrode layer 14 surrounding the second semiconductor layer 13. One or an end of the electrode layer 14 may be disposed at the first end portion EP1 of the light emitting element LD, and one or an end of the first semiconductor layer 11 may be disposed at the second end portion EP2 of the light emitting element LD.

The above-described light emitting element LD may be used in various types of devices that require a light source, including a display device. For example, at least one light emitting element LD may be disposed in each pixel of a display panel to be used as a light source.

In an embodiment, each pixel may include at least one rod-like light emitting element LD or at least one core-shell structured light emitting element LD, or may include a combination of a rod-like light emitting element LD and a core-shell structured light emitting element LD. In an embodiment, each pixel may include another light emitting element having a different type and/or shape from that of the rod-like light emitting element LD or the core-shell structured light emitting element LD.

Figure 5:
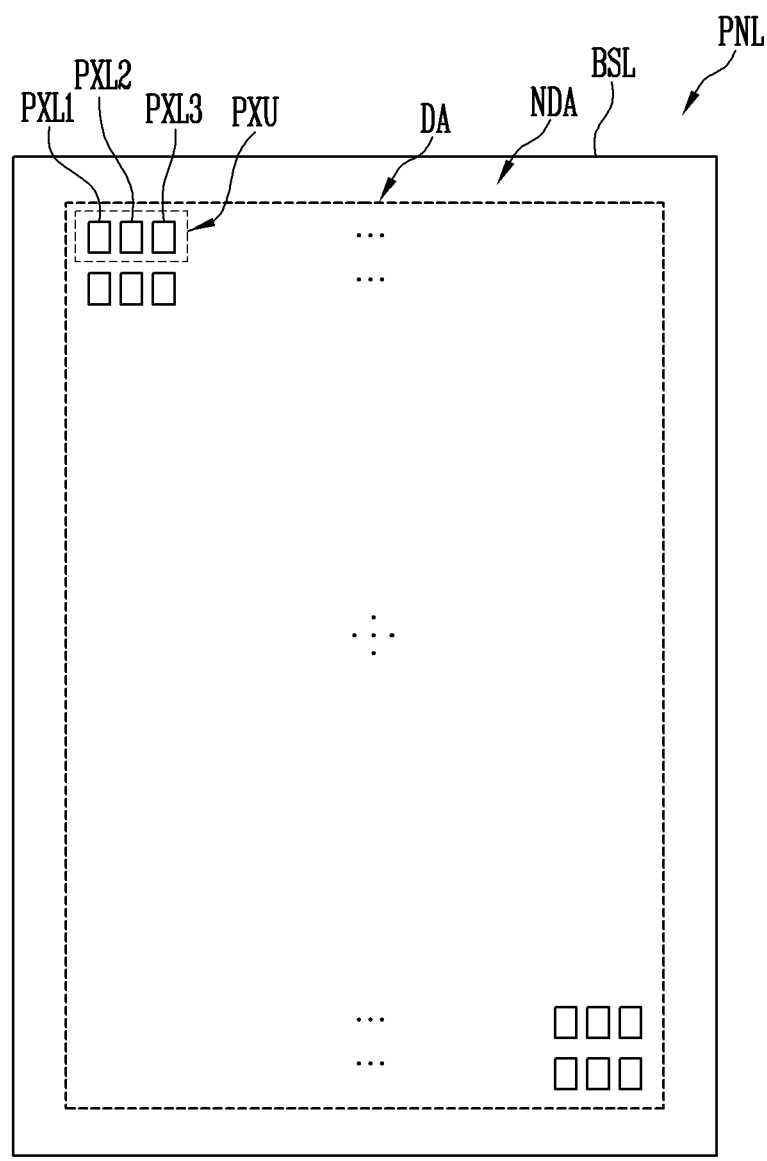
FIG. 5 illustrates a top plan view of a display device according to an embodiment.

FIG. 5 illustrates a top plan view of a display device according to an embodiment. FIG. 5 illustrates a display device, for example, a display panel PNL provided or disposed in the display device as an example of an electronic device that may use the light emitting element LD described in embodiments of FIG. 1A to FIG. 4B as a light source. For example, each pixel unit PXU of the display panel PNL and each pixel configuring the same may include at least one light emitting element LD.

For convenience, FIG. 5 briefly illustrates a structure of the display panel PNL based on a display area DA. However, in an embodiment, at least one driving circuit portion (for example, a scan driver), wires (also referred to as lines), and/or pads, which are not illustrated, may be further disposed in the display panel PNL.

Referring to FIG. 5, the display panel PNL according to an embodiment may include a base layer BSL and pixels disposed on the base layer BSL. The pixels may include first color pixels PXL1, second color pixels PXL2, and/or third color pixels PXL3. Hereinafter, when arbitrarily referring to one or more pixels among the first color pixels PXL1, the second color pixels PXL2, and the third color pixels PXL3, or when collectively referring to two or more types of pixels, they will be referred to as the "pixel PXL" or "pixels PXL".

For example, the display panel PNL and the base layer BSL for forming the display panel include a display area DA for displaying an image and a non-display area NDA excluding the display area DA. The pixels PXL may be disposed in the display area DA on the base layer BSL.

The display area DA may be disposed in a central area of the display panel PNL, and the non-display area NDA may be disposed in an edge area of the display panel PNL to surround or to be adjacent to the display area DA. However, the positions of the display area DA and the non-display area NDA are not limited thereto, and they may be changed. The display area DA may include a screen on which an image may be displayed, and the non-display area NDA may be the remaining area except for the display area DA.

The base layer BSL configures or forms a base member of the display panel PNL, and may be a rigid or flexible substrate or film. For example, the base layer BSL may be a hard substrate made of glass or tempered glass, a flexible substrate (or a thin film) made of a plastic or metallic material, or at least one layered insulating film. The material and/or physical properties of the base layer BSL are not particularly limited.

In an embodiment, the base layer BSL may be substantially transparent. Here, "substantially transparent" may mean that light may be transmitted at a predetermined transmittance or more. In an embodiment, the base layer BSL may be translucent or opaque. For example, in an embodiment, the base layer BSL may include a reflective material.

One or an area on the base layer BSL may be defined as the display area DA in which the pixels PXL are disposed, and the remaining area may be defined as the non-display area NDA. For example, the base layer BSL may include the display area DA including a plurality of pixel areas in which respective pixels PXL are formed or disposed, and the non-display area NDA disposed outside the display area DA. In the non-display area NDA, various wires electrically connected to the pixels PXL of the display area DA, pads, and/or internal circuit parts may be disposed.

The pixels PXL may be arranged or disposed in the display area DA. For example, the pixels PXL may be regularly arranged or disposed in the display area DA in a stripe or PenTile® arrangement structure. However, the arrangement structure of the pixels PXL is not limited thereto, and the pixels PXL may be arranged or disposed in the display area DA in various structures and/or methods.

In an embodiment, two or more types of pixels PXL emitting light of different colors may be disposed in the display area DA. For example, the first color pixels PXL1 emitting light of the first color, the second color pixels PXL2 emitting light of the second color, and the third color pixels PXL3 emitting light of the third color may be arranged or disposed in the display area DA. For example, at least one first color pixel PXL1, at least one second color pixel PXL2, and at least one third color pixel PXL3 disposed adjacent to each other may configure or form one pixel unit PXU that may emit light of various colors.

In an embodiment, the first color pixel PXL1 may be a red pixel that emits red light, the second color pixel PXL2 may be a green pixel that emits green light, and the third color pixel PXL3 may be a blue pixel that emits blue light. In an embodiment, the first color pixel PXL1, the second color pixel PXL2, and the third color pixel PXL3 are each provided with a first color light emitting element, a second color light emitting element, and a third color light emitting element as a light source, respectively, so that they respectively emit light of the first color, second color, and third color. In an embodiment, the first color pixel PXL1, the second color pixel PXL2, and the third color pixel PXL3 are provided with light emitting elements of the same color, and include light conversion layers and/or color filters of different colors disposed on respective light emitting elements, so that they may emit light of the first color, the second color, and the third color, respectively.

However, the color, type, and/or number of pixels PXL configuring each pixel unit PXU are not particularly limited. For example, the color of light emitted by each pixel PXL may be variously changed.

Each pixel PXL may include at least one light source driven by a predetermined control signal (for example, a scan signal and a data signal) and/or a predetermined power source (for example, a first power source and a second power source). In an embodiment, the light source may include at least one light emitting element LD according to one of embodiments of FIG. 1A to FIG. 3B, for example, at least one substantially ultra-small rod-shaped light emitting element LD having a size as small as a nanoscale to a microscale, and/or at least one light emitting element LD according to an embodiment of FIG. 4A and FIG. 4B, for example, at least one substantially ultra-small core-shell structured light emitting element LD having a size as small as a nanoscale to a microscale. For example, various types of light emitting elements LD may be used as a light source of the pixel PXL.

In an embodiment, each pixel PXL may be configured or formed as an active pixel. However, the type, structure, and/or driving method of pixels PXL that may be applied to the display device of the disclosure are not particularly limited. For example, each pixel PXL may be configured or formed as a pixel of a passive or active light emitting display device of various structures and/or driving methods.

FIG. 6A to FIG. 6G respectively illustrate an equivalent circuit diagram of the pixel PXL according to an embodiment. For example, FIG. 6A to FIG. 6G illustrate different embodiments for the pixel PXL that may be applied to an active display device. However, the types of the pixel PXL and the display device to which an embodiment may be applied are not limited thereto.

In an embodiment, each pixel PXL illustrated in FIG. 6A to FIG. 6G may be one of the first color pixel PXL1, the second color pixel PXL2, and the third color pixel PXL3 provided or disposed in the display panel PNL of FIG. 5. For example, the first color pixel PXL1, the second color pixel PXL2, and the third color pixel PXL3 may have substantially the same or similar structure.

Figure 6A:
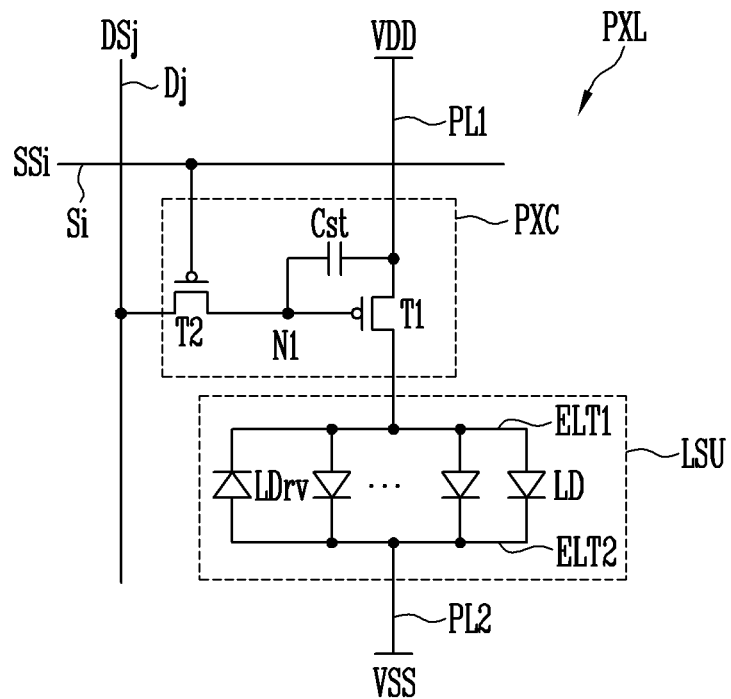
FIG. 6A to FIG. 6G respectively illustrate an equivalent circuit diagram of a pixel according to an embodiment.

First, referring to FIG. 6A, the pixel PXL may include a light source unit LSU for generating light with luminance corresponding to a data signal. For example, the pixel PXL may further selectively include a pixel circuit PXC for driving the light source unit LSU.

The light source unit LSU may include at least one light emitting element LD electrically connected between a first power source VDD and a second power source VSS, for example, a plurality of light emitting elements LD. For example, the light source unit LSU may include a first electrode ELT1 (also referred to as a "first pixel electrode" or "first alignment electrode") electrically connected to the first power VDD via the pixel circuit PXC and a first power line PL1, a second electrode ELT2 (also referred to as a "second pixel electrode" or "second alignment electrode") electrically connected to the second power VSS through a second power line PL2, and a plurality of light emitting elements LD electrically connected in parallel in the same direction between the first and second electrodes ELT1 and ELT2. In an embodiment, the first electrode ELT1 may be an anode electrode, and the second electrode ELT2 may be a cathode electrode.

Each of the light emitting elements LD may include a first end portion (for example, a P-type end portion) electrically connected to the first power source VDD through the first electrode ELT1 and/or the pixel circuit PXC, and a second end portion (for example, an N-type end portion) electrically connected to the second power source VSS through the second electrode ELT2. For example, the light emitting elements LD may be electrically connected in parallel in a forward direction between the first and second electrodes ELT1 and ET2. Respective light emitting elements LD electrically connected in the forward direction between the first power source VDD and the second power source VSS configure or form respective effective light sources, and these effective light sources may be combined to configure or form the light source unit LSU of the pixel PXL.

In an embodiment, the first and second power sources VDD and VSS may have different potentials so that the light emitting elements LD may emit light. For example, the first power source VDD may be set as a high potential power source, and the second power source VSS may be set as a low potential power source. A potential difference between the first and second power source sources VDD and VSS may be set to be equal to or higher than a threshold voltage of the light emitting elements LD during at least a light emitting period of the pixel PXL.

In an embodiment, one or an end portion or end portions (for example, P-type end portions) of the light emitting elements LD configuring each light source unit LSU may be commonly electrically connected to the pixel circuit PXC through one electrode (for example, the first pixel electrode ELT1 of each pixel PXL) of the light source unit LSU, and may be connected to the first power source VDD through the pixel circuit PXC and the first power line PL1. For example, the other end portions (for example, N-type end portions) of the light emitting elements LD may be commonly electrically connected to the second power source VSS through the other electrode (for example, the second electrode ELT2 of each pixel PXL) of the light source unit LSU and the second power wire PL2. In the specification, a wire may be referred to as a line.

The light emitting elements LD may emit light with luminance corresponding to a driving current supplied through the corresponding pixel circuit PXC. For example, during each frame period, the pixel circuit PXC may supply a driving current corresponding to a gray value to be displayed in the corresponding frame to the light source unit LSU. The driving current supplied to the light source unit LSU may be divided to flow in the light emitting elements LD that may be electrically connected in a forward direction. Therefore, while each light emitting element LD emits light with a luminance corresponding to the current flowing therein, the light source unit LSU may emit light having a luminance corresponding to the driving current.

In an embodiment, the light source unit LSU may further include at least one ineffective light source in addition to the light emitting elements LD configuring each effective light source. For example, at least one reverse direction light emitting element LDrv may be further electrically connected between the first and second electrodes ELT1 and ELT2.

Each reverse light emitting element may be electrically connected in parallel between the first and second electrodes ELT1 and EL2 together with the light emitting devices LD forming the effective light sources, but may be electrically connected between the first and second electrodes ELT1 and EL2 in the opposite direction with respect to the light emitting elements LD. For example, an N-type end portion of the reverse direction light emitting element LDrv may be electrically connected to the first power source VDD via the first electrode ELT1 and pixel circuit PXC, and a P-type end portion of the reverse direction light emitting element LDrv may be electrically connected to the second power source VSS via the second electrode ELT2. The reverse direction light emitting element LDrv may maintains a deactivated state even if a predetermined driving voltage (for example, driving voltage of forward direction) is applied between the first and second electrodes ELT1 and ELT2, and accordingly, the reverse direction light emitting element LDrv may maintain a substantially non-light emitting state.

For example, in an embodiment, at least one pixel PXL may further include at least one ineffective light source (not illustrated) that may not be fully electrically connected between the first and second electrodes ELT1 and ELT2. For example, at least one pixel PXL may further include at least one effective light emitting element that may be positioned or disposed within the light source unit LSU, and of which respective first and second end portions EP1 and EP2 may not be fully electrically connected to the first and second electrodes ELT1 and ELT2.

The pixel circuit PXC may be electrically connected between the first power source VDD and the first electrode ELT1. The pixel circuit PXC may be electrically connected to a scan line Si and a data line Dj of the pixel PXL. For example, in a case that the pixel PXL is disposed in an i-th horizontal line (row) (i is a natural number) and a j-th vertical line (column) (j is a natural number) of the display area DA, the pixel circuit PXC of the pixel PXL may be electrically connected to an i-th scan line Si and a j-th data line Dj of the display area DA.

In an embodiment, the pixel circuit PXC may include a plurality of transistors and at least one capacitor. For example, the pixel circuit PXC may include a first transistor T1, a second transistor T2, and a storage capacitor Cst.

The first transistor T1 may be electrically connected between the first power source VDD and the light source unit LSU. For example, a first electrode (for example, a source electrode) of the first transistor T1 may be electrically connected to the first power source VDD, and a second electrode (for example, a drain electrode) of the first transistor T1 may be electrically connected to the first electrode ELT1. For example, a gate electrode of the first transistor T1 may be electrically connected to a first node N1. The first transistor T1 controls a driving current supplied to the light source unit LSU in response to a voltage of the first node N1. For example, the first transistor T1 may be a driving transistor that controls a driving current of the pixel PXL.

The second transistor T2 may be electrically connected between the data line Dj and the first node N1. For example, a first electrode (for example, a source electrode) of the second transistor T2 may be electrically connected to the data line Dj, and a second electrode (for example, a drain electrode) of the second transistor T2 may be electrically connected to the first node N1. For example, a gate electrode of the second transistor T2 may be electrically connected to the scan line Si. In a case that a scan signal SSi of a gate-on voltage (for example, a low level voltage) is supplied from the scan line Si, the second transistor T2 is turned on to electrically connect the data line Dj and the first node N1.

For each frame period, a data signal DSj of the corresponding frame is supplied to the data line Dj, and the data signal DSj is transmitted to the first node N1 through the turned-on transistor T2 during a period in which the scan signal SSi of the gate-on voltage is supplied. For example, the second transistor T2 may be a switching transistor for transmitting each data signal DSj to the inside of the pixel PXL.

One electrode of the storage capacitor Cst may be electrically connected to the first power source VDD, and the other electrode thereof may be electrically connected to the first node N1. The storage capacitor Cst is charged with a voltage the corresponding to the data signal DSj supplied to the first node N1 during each frame period.

FIG. 6A illustrates the transistors included in the pixel circuit PXC, for example, the first and second transistors T1 and T2 as P-type transistors, but the disclosure is not limited thereto. For example, at least one of the first and second transistors T1 and T2 may be changed as an N-type transistor.

Figure 6B:
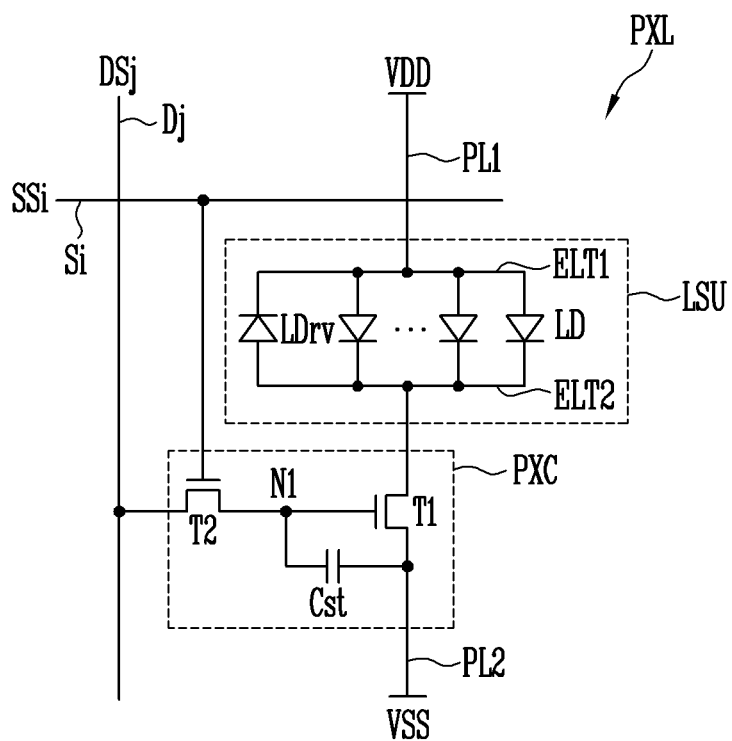

For example, as illustrated in FIG. 6B, each of the first and second transistors T1 and T2 may be an N-type transistor. A gate-on voltage of the scan signal SSi for writing the data signal DSj supplied to the data line Dj for each frame period to the pixel PXL may be a high level voltage (also referred to as a "gate-high voltage"). Similarly, a voltage of the data signal DSj for turning on the first transistor T1 may be a voltage of a level opposite to that in an embodiment of FIG. 6A. For example, in an embodiment of FIG. 6A, the data signal DSj of a lower voltage is supplied as a gray value to be expressed increases, whereas in an embodiment of FIG. 6B, the data signal of a higher voltage DSj may be supplied as a gray value to be expressed increases. In an embodiment, the first and second transistors T1 and T2 may be transistors of different conductive types. For example, one of the first and second transistors T1 and T2 may be a P-type transistor, and the other thereof may be an N-type transistor.

In an embodiment, interconnection positions of the pixel circuit PXC and the light source unit LSU may be changed. For example, as illustrated in FIG. 6B, in a case that both the first and second transistors T1 and T2 included in the pixel circuit PXC are N-type transistors, the pixel circuit PXC may be electrically connected between the light source unit LSU and the second power source VSS, the storage capacitor Cst may be electrically connected between the first node N1 and the second power source VSS. However, the disclosure is not limited thereto. For example, in an embodiment, even if the pixel circuit PXC is formed of N-type transistors, the pixel circuit PXC may be electrically connected between the first power source VDD and the light source unit LSU, and/or the storage capacitor Cst may be electrically connected between the first power source VDD and the first node N1.

The configuration and operation of the pixel PXL illustrated in FIG. 6B are substantially similar to those of the pixel PXL of FIG. 6A, except that except that connection positions of some or a number of circuit elements and voltage levels of control signals (for example, the scan signal SSi and the data signal DSj) are changed in a case that the type of the first and second transistors T1 and T2 is changed. Therefore, a detailed description of the pixel PXL of FIG. 6B will be omitted.

The structure of the pixel circuit PXC is not limited to embodiments illustrated in FIG. 6A and FIG. 6B. For example, the pixel circuit PXC may be configured or formed or structured as in an embodiment illustrated in FIG. 6C or 6D. For example, the pixel circuit PXC may be configured or formed as a pixel circuit having various structures and/or driving methods.

Figure 6C:
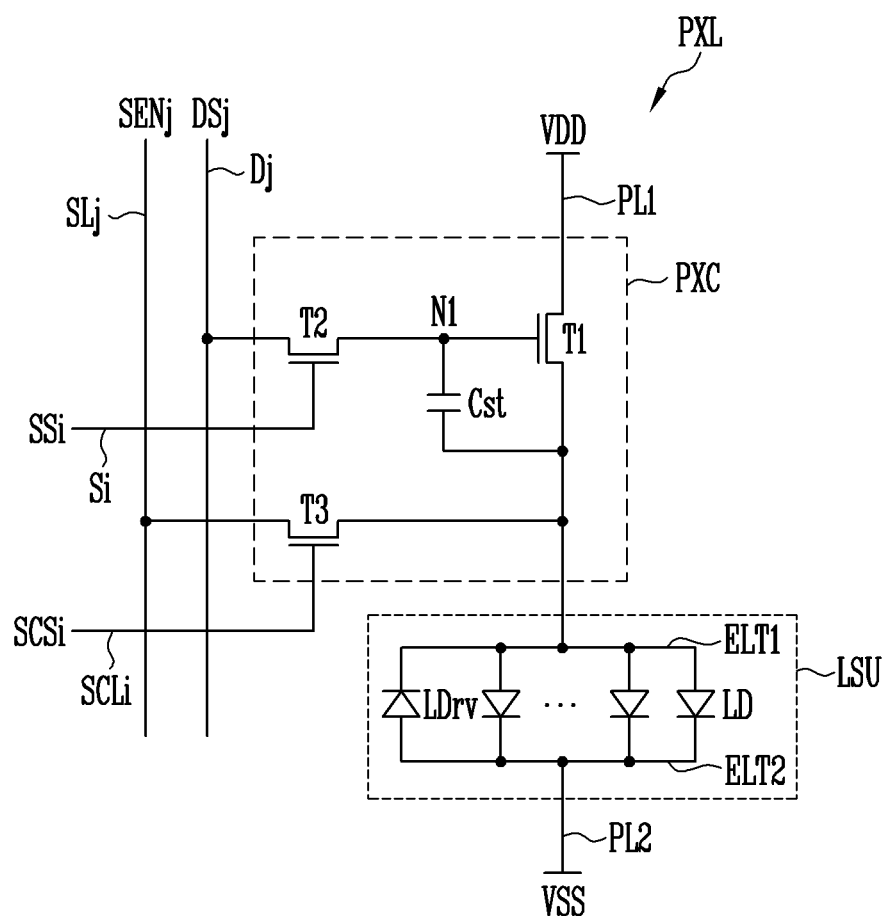

Referring to FIG. 6C, the pixel circuit PXC may be further electrically connected to a sensing control line SCLi and a sensing line SLj. For example, the pixel circuit PXC of the pixel PXL disposed at an i-th horizontal line and a j-th vertical line of the display area DA may be electrically connected to an i-th sensing control line SCLi and a j-th sensing line SLj of the display area DA. The pixel circuit PXC may further include a third transistor T3. For example, in an embodiment, the sensing line SLj may be omitted, and the characteristics of the pixel PXL may also be detected by detecting a sensing signal SENj through the data line Dj of the corresponding pixel PXL (or adjacent pixel), The third transistor T3 may be electrically connected between the first transistor T1 and the sensing line SLj. For example, one electrode of the third transistor T3 may be electrically connected to one electrode (for example, a source electrode) of the first transistor T1 electrically connected to the first electrode ELT1, and the other electrode thereof may be electrically connected to the sensing line SLj. In a case that the sensing line SLj is omitted, the other electrode of the third transistor T3 may also be electrically connected to the data line Dj.

A gate electrode of the third transistor T3 may be electrically connected to the sensing control line SCLi. In a case that the sensing control line SCLi is omitted, the gate electrode of the third transistor T3 may be electrically connected to the scan line Si. The third transistor T3 is turned on by a sensing control signal SCSi of a gate-on voltage (for example, a high level voltage) supplied to the sensing control line SCLi during a predetermined sensing period to electrically connect the sensing line SLj and the first transistor T1.

In an embodiment, the sensing period may be a period for extracting characteristics (for example, a threshold voltage of the first transistor T1) of each of the pixels PXL disposed in the display area DA. During the sensing period, the first transistor T1 may be turned on by supplying a predetermined reference voltage at which the first transistor T1 may be turned on to the first node N1 through the data line Dj and the second transistor T2 and by electrically connecting each pixel PXL to a current source or the like within the spirit and the scope of the disclosure. For example, by supplying the sensing control signal SCSi of a gate-on voltage to the third transistor T3 to turn on the third transistor T3, the first transistor T1 may be electrically connected to the sensing line SLj. Thereafter, the sensing signal SENj is obtained through the sensing line SLj, and the characteristics of each pixel PXL in addition to the threshold voltage of the first transistor T1 may be detected by using the sensing signal SENj. Information on the characteristics of each pixel PXL may be used to convert image data so that a characteristic difference between the pixels PXL disposed in the display area DA may be compensated.

FIG. 6C illustrates an embodiment in which the first, second, and third transistors T1, T2, and T3 are all N-type transistors, but the disclosure is not limited thereto. For example, at least one of the first, second, and third transistors T1, T2, and T3 may be changed to a P-type transistor. For example, FIG. 6C illustrates an embodiment in which the light source unit LSU may be electrically connected between the pixel circuit PXC and the second power source VSS, but the disclosure is not limited thereto. For example, in an embodiment, the light source unit LSU may be electrically connected between the first power source VDD and the pixel circuit PXC.

Figure 6D:
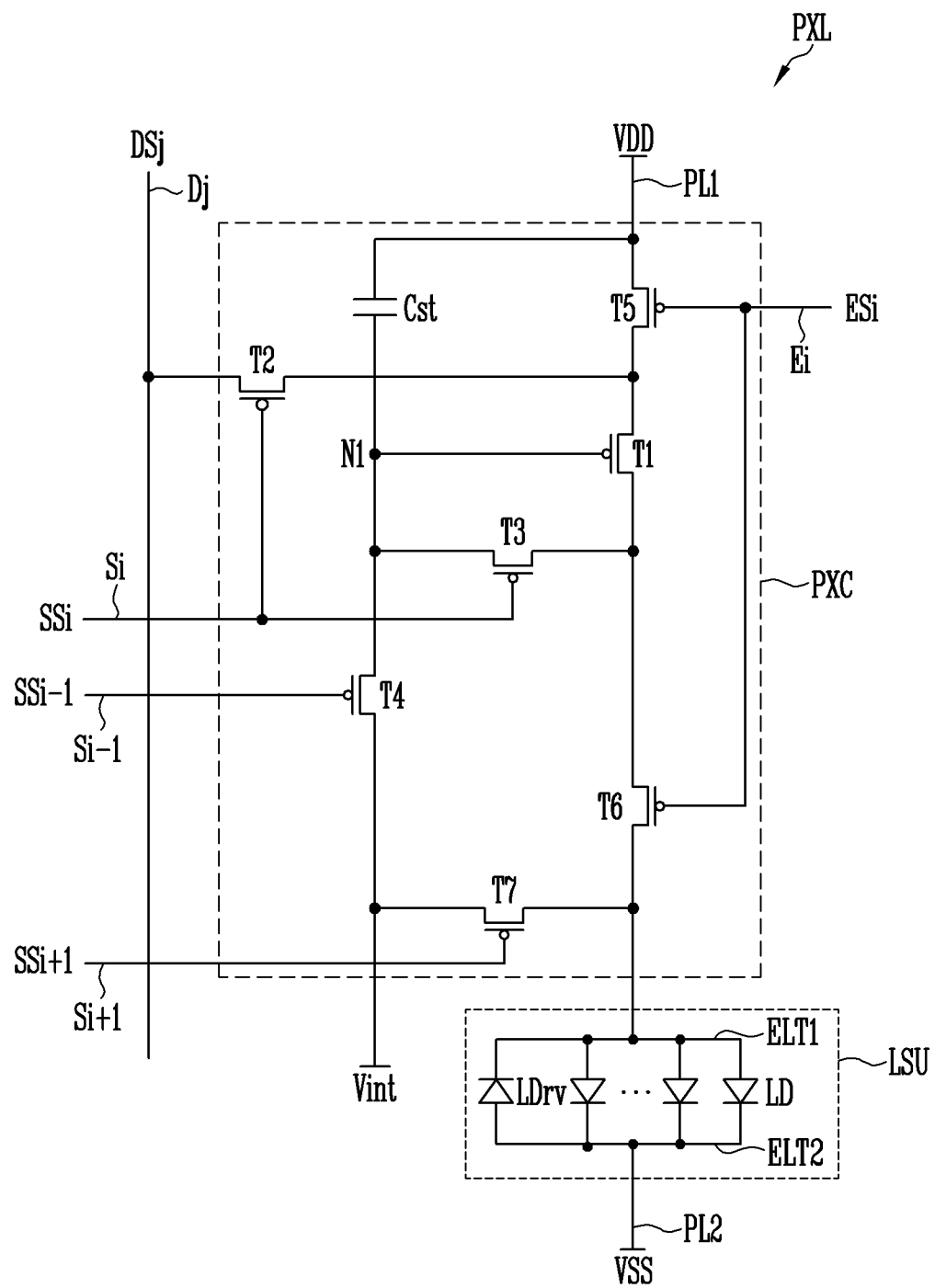

Referring to FIG. 6D, the pixel circuit PXC may be further electrically connected to at least one other scan line or control line in addition to the scan line Si of the corresponding horizontal line. For example, the pixel circuit PXC of the pixel PXL disposed in the i-th horizontal line of the display area DA may be further electrically connected to an (i−1)-th scan line Si−1 and/or an (i+1)-th scan line Si+1. For example, the pixel circuit PXC may be further electrically connected to another power source in addition to the first and second power sources VDD and VSS. For example, the pixel circuit PXC may also be electrically connected to an initialization power source Vint. In an embodiment, the pixel circuit PXC may include first to seventh transistors T1 to T7 and a storage capacitor Cst.

The first transistor T1 may be electrically connected between the first power source VDD and the light source unit LSU. For example, one electrode (for example, a source electrode) of the first transistor T1 may be electrically connected to the first power source VDD through the fifth transistor T5 and the first power line PL1, and the first transistor, and the other electrode (for example, a drain electrode) of the first transistor T1 may be electrically connected to one electrode (for example, the first electrode ELT1) of the light source unit LSU via the sixth transistor T6. For example, a gate electrode of the first transistor T1 may be electrically connected to a first node N1. The first transistor T1 controls a driving current supplied to the light source unit LSU in response to a voltage of the first node N1.

The second transistor T2 may be electrically connected between the data line Dj and one electrode (for example, the source electrode) of the first transistor T1. For example, a gate electrode of the second transistor T2 may be electrically connected to the corresponding scan line Si. In a case that a scan signal SSi of a gate-on voltage is supplied from the scan line Si, the second transistor T2 is turned on to electrically connect the data line Dj to one electrode of the first transistor T1. Therefore, in a case that the second transistor T2 is turned on, the data signal DSj supplied from the data line Dj is transmitted to the first transistor T1.

The third transistor T3 may be electrically connected between other electrode (for example, the drain electrode) of the first transistor T1 and the first node N1. For example, a gate electrode of the third transistor T3 may be electrically connected to the corresponding scan line Si. In a case that the scan signal SSi of the gate-on voltage is supplied from the scan line Si, the third transistor T3 is turned on to electrically connect the first transistor T1 in a form of a diode. Accordingly, during the period in which the scan signal SSi of the gate-on voltage is supplied, the first transistor T1 is turned on in a diode-connected form, and accordingly, the data signal DSj from the data line Dj sequentially passes through the second transistor T2, the first transistor T1, and the third transistor T3 to be supplied to the first node N1. Accordingly, the storage capacitor Cst is charged with a voltage corresponding to the data signal DSj and the threshold voltage of the first transistor T1.

The fourth transistor T4 may be electrically connected between the first node N1 and the initialization power source Vint. A gate electrode of the fourth transistor T4 may be electrically connected to a previous scan line, for example, the (i−1)-th scan line Si−1. In a case that the scan signal SSi−1 of the gate-on voltage is supplied to the (i−1)-th scan line Si−1, the fourth transistor T4 is turned on to transmit a voltage of the initialization power source Vint to the first node N1.

In an embodiment, the voltage of the initialization power source Vint may be equal to or less than the lowest voltage of the data signal DSj. Before the data signal DSj of the corresponding frame is supplied to each pixel PXL, the node N1 is initialized to the voltage of the initialization power source Vint by the first scan signal SSi−1 of the gate-on voltage supplied to the (i−1)-th scan line Si−1. Accordingly, regardless of the voltage of the data signal DSj of the previous frame, the first transistor T1 is diode-connected in the forward direction while the scan signal SSi of the gate-on voltage is supplied to the i-th scan line Si. Accordingly, the data signal DSj of the corresponding frame may be transmitted to the first node N1.

The fifth transistor T5 may be electrically connected between the first power source VDD and the first transistor T1. For example, a gate electrode of the fifth transistor T5 may be electrically connected to the corresponding emission control line, for example, an i-th emission control line Ei. In a case that an emission control signal ESi of a gate-off voltage (for example, a high level voltage) is supplied to the emission control line Ei, the fifth transistor T5 is turned off, and is turned on in other cases.

The sixth transistor T6 may be electrically connected between the first transistor T1 and the light source unit LSU. For example, a gate electrode of the sixth transistor T6 may be electrically connected to the corresponding emission control line, for example, the i-th emission control line Ei. In a case that the emission control signal ESi having the gate-off voltage is supplied to the emission control line Ei, the sixth transistor T6 is turned off, and is turned on in other cases.

The fifth and sixth transistors T5 and T6 may control an emission period of the pixel PXL. For example, in a case that the fifth and sixth transistors T5 and T6 are turned on, a current path in which a driving current may flow from the first power source VDD to the second power source VSS through the fifth transistor T5, the first transistor T1, the sixth transistor T6, and the light source unit LSU in sequence, may be formed or disposed. For example, in a case that the fifth and/or sixth transistors T5 and T6 are turned off, the current path is blocked, and light emission of the pixel PXL may be prevented.

The seventh transistor T7 may be electrically connected between one electrode of the light source unit LSU (for example, the first electrode ELT1) and the initialization power source Vint. A gate electrode of the seventh transistor T7 may be electrically connected to a scan line for selecting the pixels PXL of a next horizontal line, for example, to an (i+1)-th scan line Si+1. In a case that a scan signal SSi+1 of the gate-on voltage is supplied to the (i+1)-th scan line Si+1, the seventh transistor T7 is turned on to supply the voltage of the initialization power source Vint to one electrode of the light source unit LSU (for example, the first pixel electrode ELT1). Accordingly, during each initialization period in which the voltage of the initialization power source Vint is transmitted to the light source unit LSU, the voltage of one electrode of the light source unit LSU is initialized.

The control signal and/or the initialization power source Vint for controlling the operation of the seventh transistor T7 may be variously changed. For example, in an embodiment, the gate electrode of the seventh transistor T7 may also be electrically connected to the scan line of the corresponding horizontal line, for example, the i-th scan line Si or the scan line of the previous horizontal line, for example, the (i−1)-th scan line Si−1. In a case that the scan signal SSi or SSi−1 of the gate-on voltage is supplied to the i-th scan line Si or the (i−1)-th scan line Si−1, the seventh transistor T7 is turned on to supply the voltage of the initialization power source Vint to one electrode of the light source unit LSU. Accordingly, during each frame period, the pixel PXL may emit light with a more uniform luminance in response to the data signal DSj. For example, in an embodiment, the fourth transistor T4 and the seventh transistor T7 may be electrically connected to respective initialization power sources having different potentials. For example, in an embodiment, a plurality of initialization power sources may be supplied to the pixel, and the first node N1 and the first electrode ELT1 may be initialized by initialization power sources having different potentials.

The storage capacitor Cst may be electrically connected between the first power source VDD and the first node N1. The storage capacitor Cst stores the data signal DSj supplied to the first node N1 in each frame period and a voltage corresponding to the threshold voltage of the first transistor T1.

FIG. 6D illustrates the transistors included in the pixel circuit PXC, for example, the first to seventh transistors T1 to T7 as P-type transistors, but the disclosure is not limited thereto. For example, at least one of the first to seventh transistors T1 and T7 may be changed as an N-type transistor.

Figure 6E:
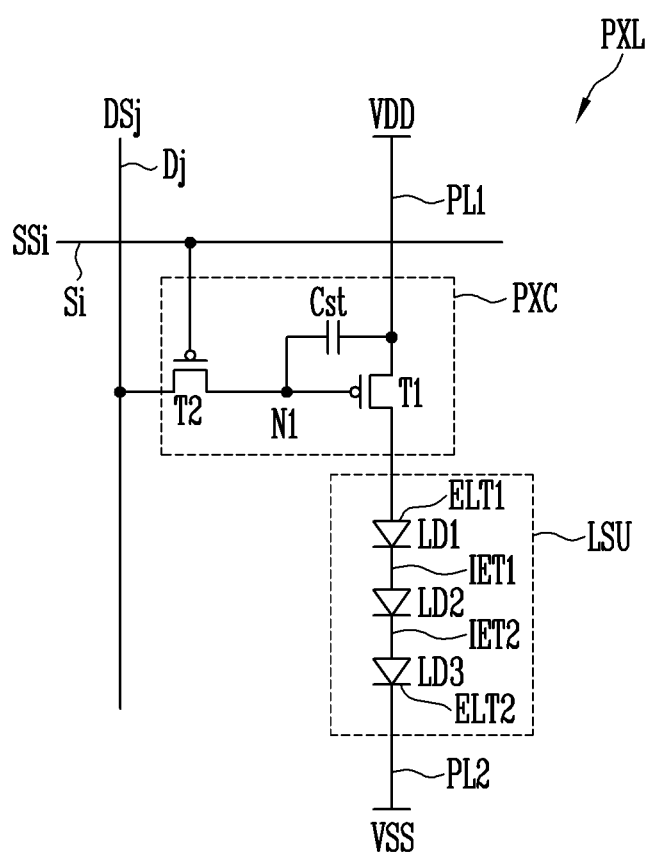
Figure 6F:
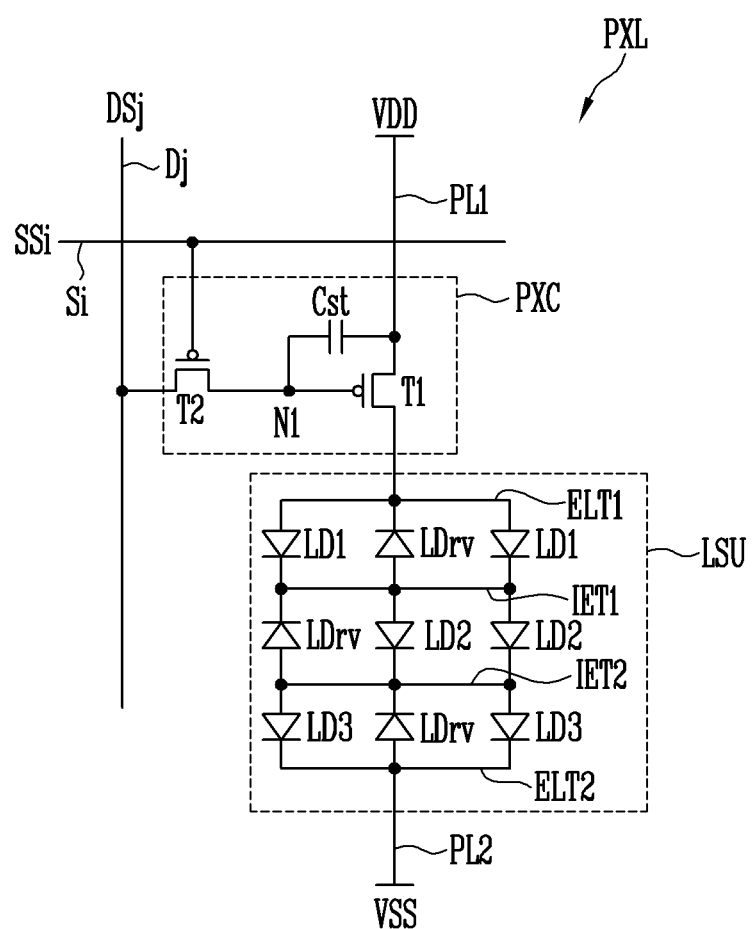
Figure 6G:
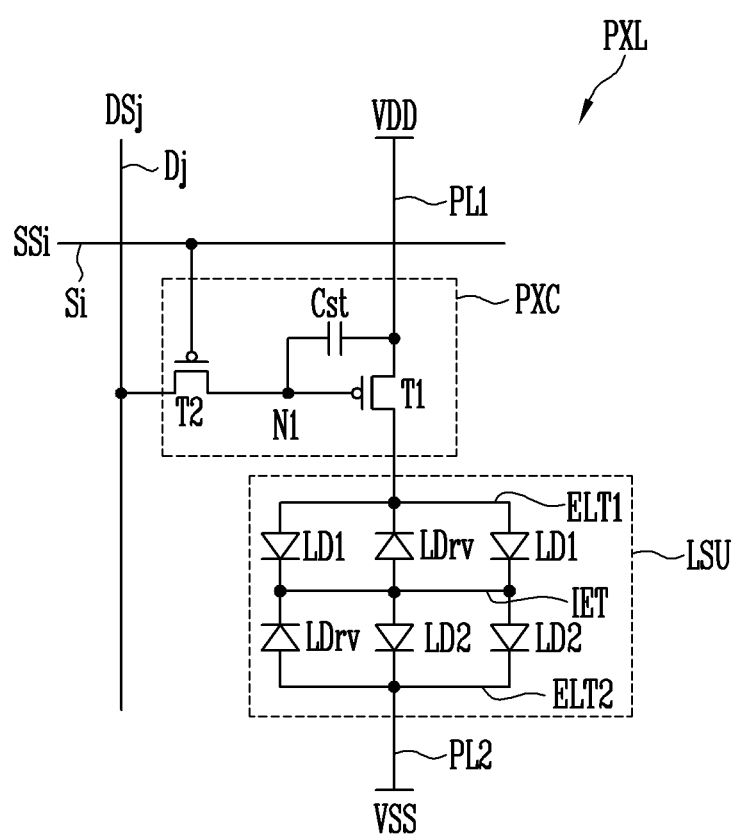

For example, FIG. 6A to FIG. 6D illustrate embodiments in which effective light sources forming each light source unit LSU, for example, the light emitting elements LD are all electrically connected in parallel, but the disclosure is not limited thereto. For example, in an embodiment, as illustrated in FIG. 6E to FIG. 6G, the light source unit LSU of each pixel PXL may include at least two stages in series. In describing embodiments of FIG. 6E to FIG. 6G, a detailed description of the configuration (for example, the pixel circuit PXC) that is similar to or the same as embodiments of FIG. 6A to FIG. 6D will be omitted.

Referring to FIG. 6E, the light source unit LSU may include at least two light emitting elements electrically connected in series to each other. For example, the light source unit LSU may include a first light emitting element LD1, a second light emitting element LD2, and a third light emitting element LD3 that may be electrically connected in series in a forward direction between the first power source VDD and the second power source VSS. Each of the first, second, and third light emitting elements LD1, LD2, and LD3 may configure or form an effective light source.

Hereinafter, in a case that referring to a light emitting element among the first, second, and third light emitting elements LD1, LD2, and LD3, the corresponding light emitting element may be referred to as a "first light emitting element LD1", "second light emitting element LD2", or "third light emitting element LD3". For example, in a case that arbitrarily referring to at least one light emitting element among the first, second, and third light emitting elements LD1, LD2, and LD3, or generically referring to the first, second, and third light emitting elements LD1, LD2, and LD3, it will be referred to as "light emitting element LD" or "light emitting elements LD".

A first end portion (for example, P-type end portion) of the first light emitting element LD1 may be electrically connected to the first power source VDD via the first electrode ELT1 (for example, first pixel electrode) of the light source unit LSU. For example, a second end portion (for example, N-type end portion) of the first light emitting element LD1 may be electrically connected to a first end portion (for example, P-type end portion) of the second light emitting element LD2 through a first middle electrode IET1.

The first end portion (for example, P-type end portion) of the second light emitting element LD2 may be electrically connected to a second end portion of the first light emitting element LD1. For example, the second end portion (for example, N-type end) of the second light emitting element LD2 may be electrically connected to a first end portion (for example, P-type end portion) of the third light emitting element LD3 through a second middle electrode IET2.

The first end portion of the third light emitting element LD3 (for example, P-type end portion) may be electrically connected to the second end portion of the second light emitting element LD2. For example, a second end portion of the third light emitting element LD3 (for example, N-type end portion) may be electrically connected to the second power source VSS via the second electrode (for example, second pixel electrode ELT2) of the light source unit LSU. In the above-described manner, the first, second, and third light emitting elements LD1, LD2, and LD3 may be sequentially electrically connected in series between the first and second electrodes ELT1 and ELT2 of the light source unit LSU.

FIG. 6E illustrates an embodiment of electrically connecting the light emitting elements LD in a three-stage series structure, but the disclosure is not limited thereto. For example, in an embodiment, two light emitting elements LD may be electrically connected in a two-stage series structure, or four or more light emitting elements LD may be electrically connected in a four-stage or more series structure.

Assuming that the same luminance is expressed using the light emitting elements LD of the same condition (for example, the same size and/or number), in the light source unit LSU having a structure in which the light emitting elements LD may be electrically connected in series compared to the light source unit LSU having a structure in which the light emitting elements LD may be electrically connected in parallel, a voltage applied between the first and second electrodes ELT1 and ELT2 may increase, but a driving current flowing through the light source unit LSU may decrease. Therefore, in a case that the light source unit LSU of each pixel (PXL) is configured or formed by applying the serial structure, a panel current flowing through the display panel PNL may be reduced.

In an embodiment, at least one serial stage may include a plurality of light emitting elements LD electrically connected in parallel to each other. The light source unit LSU may be in a series/parallel mixed structure. For example, the light source unit LSU may be configured as in an embodiment of FIG. 6F or FIG. 6G.

Referring to FIG. 6F, at least one serial stage configuring the light source unit LSU may include a plurality of light emitting elements LD electrically connected in parallel in a forward direction. For example, the light source unit LSU may include at least one first light emitting element LD1 disposed at a first serial stage (also referred to as a "first stage"), at least one second light emitting element LD2 disposed in a second serial stage (also referred to as a "second stage") subsequent to the first serial stage, and at least one third light emitting element LD3 disposed in a third serial stage (also referred to as the "third stage") subsequent to the second serial stage. For example, at least one of the first, second, and third serial stages may include a plurality of light emitting elements LD electrically connected in a forward direction.

FIG. 6F illustrates the light source unit LSU configured or formed of light emitting elements LD disposed in three serial stages, but the disclosure is not limited thereto. For example, as illustrated in FIG. 6G, the light source unit LSU may include a plurality of light emitting elements LD disposed in only two serial stages (for example, the first serial stage and the second serial stage). As an example, the light source unit LSU may include at least one first light emitting element LD1 disposed in the first serial stage and including a first end portion (for example, a P-type end portion) and a second end portion (for example, an N-type end portion) that are respectively electrically connected to the first electrode ELT1 and the middle electrode IET, and at least one second light emitting element LD2 disposed in the second serial stage and including a first end portion (for example, a P-type end portion) and a second end portion (for example, an N-type end portion) that are respectively electrically connected to the middle electrode IET and the second electrode ELT2. For example, at least one of the first and second serial stages may include a plurality of light emitting elements LD electrically connected in a forward direction.

For example, the number of serial stages configuring the light source unit LSU may be variously changed. For example, the light source unit LSU may include a plurality of light emitting elements LD distributed in four or more serial stages. For example, the number of light emitting elements LD electrically connected to each serial stage in a forward direction may be variously changed.

In an embodiment, the pixels PXL disposed in the display area DA may include the same or similar number of light emitting elements LD. For example, in a step of supplying the light emitting elements LD to each pixel PXL, by controlling a light emitting element ink (also referred to as a "light emitting element solution") including the light emitting elements LD to be applied in a uniform amount to the light emitting area of each pixel PXL, and by controlling a uniform electric field to be applied to each pixel PXL, the light emitting elements LD may be arranged in the display area DA. Accordingly, it is possible to relatively uniformly supply and arrange or disposed the light emitting elements LD to the pixels PXL.

In an embodiment, as illustrated in FIG. 6F and FIG. 6G, each pixel PXL may further include at least one reverse direction light emitting element LDrv disposed in at least one serial stage. For example, at least one of the plurality of serial stages may further include at least one reverse direction light emitting element LDrv electrically connected to the light emitting elements LD in a reverse direction.

However, even if the reverse direction light emitting element LDrv may be electrically connected to at least one serial stage, in a case that at least one effective light source electrically connected to the serial stage in forward direction (for example, the first, second, and/or third light emitting elements LD1, LD2, and LD3) are disposed, a driving current of the pixel PXL sequentially flows through respective serial stages. Accordingly, the light source unit LSU emits light with luminance corresponding to the driving current.

As in the above-described embodiment, each light source unit LSU may be electrically connected to the first and second power sources VDD and VSS in a forward direction to be able to include a plurality of light emitting elements LD configuring each effective light source. For example, the connection structure between the light emitting elements LD may be variously changed according to embodiments. For example, the light emitting elements LD may be electrically connected to each other only in series or in parallel, or may be electrically connected in a series/parallel mixed structure.

As described above, the pixel PXL may include a pixel circuit PXC and/or a light source unit LSU having various structures. For example, the structure of the pixel PXL that may be applied to the disclosure is not limited to embodiments illustrated in FIG. 6A to FIG. 6G, and each pixel PXL may have various other structures. For example, in a case that each pixel PXL is formed or disposed in a passive light emitting display device, the pixel circuit PXC is omitted, and each of the first and second electrodes ELT1 and ELT2 may be electrically connected (or, directly electrically connected) to the scan line Si, the data line Dj, the first power line PL1, the second power line PL2, or other signal or power lines.

Figure 7A:
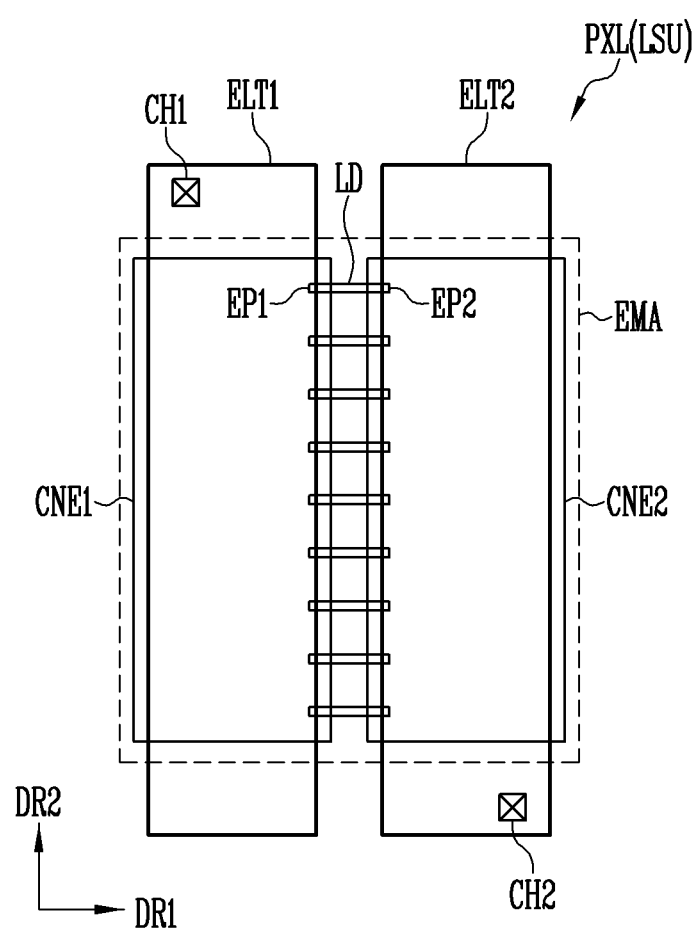
Figure 7B:
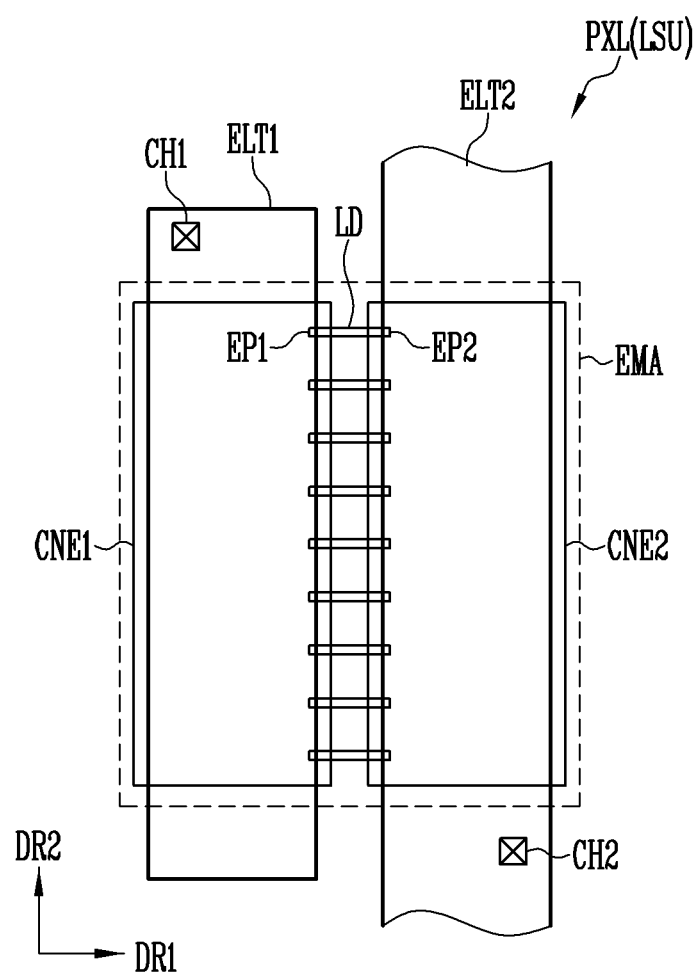
Figure 7D:
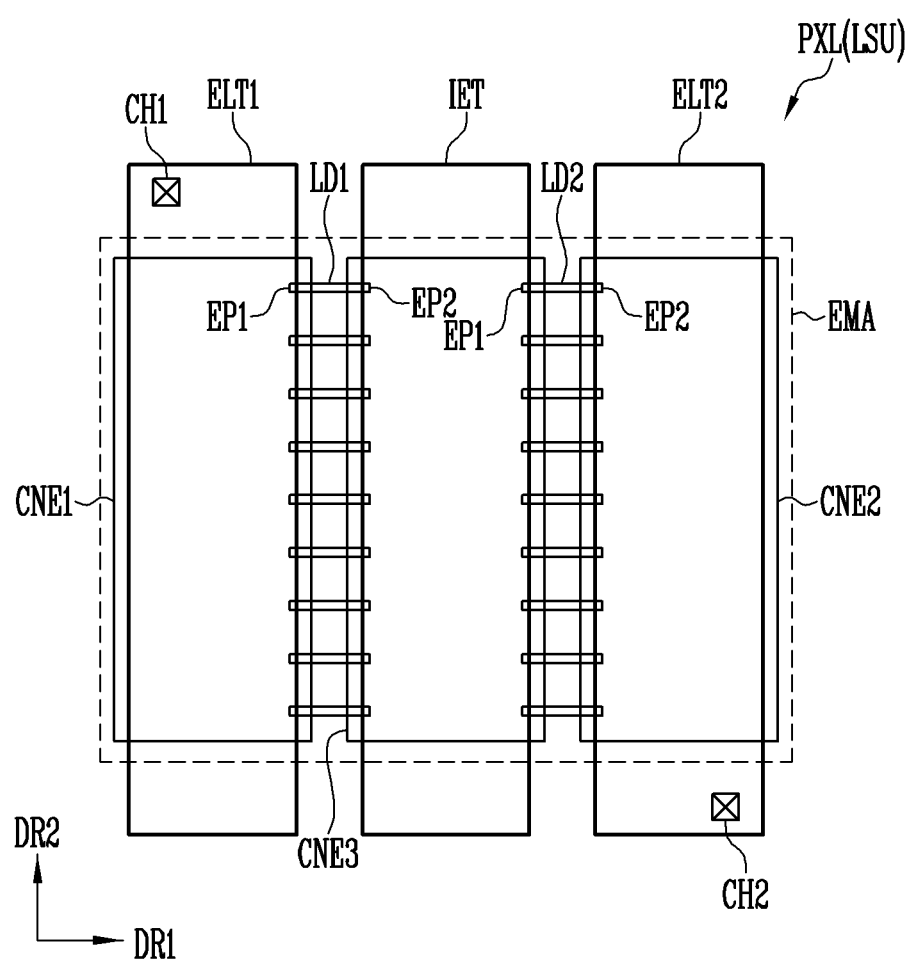

FIG. 7A to FIG. 7D respectively illustrate a top plan view of a pixel PXL according to an embodiment. For example, FIG. 7A to FIG. 7C illustrate embodiments of the pixel PXL including a light source unit LSU having a parallel structure, and different embodiments related to shapes of the first and second electrodes ELT1 and ELT2 are illustrated. For example, FIG. 7D illustrates an embodiment of a pixel PXL including a light source unit LSU having a series/parallel mixed structure.

In FIG. 7A to FIG. 7D, a structure of the pixel PXL is illustrated based on the light source unit LSU of each pixel PXL. However, in an embodiment, each pixel PXL may selectively further include circuit elements (for example, a plurality of circuit elements configuring each pixel circuit PXC) electrically connected to the light source unit LSU.

For example, FIG. 7A to FIG. 7D illustrate an embodiment in which each light source unit LSU may be electrically connected to a predetermined power line (for example, the first and/or second power lines PL1 and PL2), a circuit element (for example, at least one circuit element configuring the pixel circuit PXC), and/or a signal line (for example, the scan line Si and/or the data line Dj), through first and second contact holes CH1 and CH2. However, the disclosure is not limited thereto. For example, in an embodiment, at least one of the first and second electrodes ELT1 and ELT2 of each pixel PXL may be electrically connected (or, directly electrically connected) to a predetermined power line and/or signal line without passing through a contact hole and/or a middle line.

First, referring to FIG. 5 to FIG. 7C, the pixel PXL may include the first electrode ELT1 and the second electrode ELT2 disposed in each light emitting area EMA, and at least one light emitting element LD (for example, a plurality of light emitting elements LD electrically connected in parallel between the first and second electrodes ELT1 and ELT2) disposed between the first and second electrodes ELT1 and ELT2. For example, the pixel PXL may further include a first contact electrode CNE1 (also referred to as a "third electrode") and a second contact electrode CNE2 (also referred to as a "fourth electrode") for electrically connecting the light emitting element LD between the first and second electrodes ELT1 and ELT2.

The first electrode ELT1 and the second electrode ELT2 may be disposed in each pixel area in which each PXL is provided and/or formed or disposed. For example, the first electrode ELT1 and the second electrode ELT2 may be disposed in the light emitting area EMA of each pixel PXL.

In an embodiment, each pixel area may generally mean a pixel circuit area in which circuit elements for configuring the corresponding pixel PXL are disposed, and a light emitting area EMA in which the light source unit LSU of the pixel PXL is disposed. For example, the light emitting area EMA may be an area in which the light emitting elements LD (for example, effective light sources completely electrically connected between the first and second electrodes ELT1 and ELT2) configuring the light source unit LSU of each pixel PXL are disposed. For example, one or an area of predetermined electrodes electrically connected to the light emitting elements LD (for example, the first and second electrodes ELT1 and ELT2 and/or the first and second contact electrodes CNE1 and CNE2) or of the above-mentioned electrodes may be disposed in the light emitting area EMA.

The light emitting area EMA may be surrounded by a light-blocking and/or reflective bank structure (for example, a pixel defining layer and/or black matrix) formed or disposed between the pixels PXL to define each pixel area and the light emitting area EMA therein. For example, a bank structure (corresponding to a "second bank BNK2" in FIG. 8A and FIG. 8B) surrounding the light emitting area EMA may be disposed around the light emitting area EMA.

The first and second electrodes ELT1 and ELT2 may be disposed apart from each other. For example, the first and second electrodes ELT1 and ELT2 may be spaced apart side by side by a predetermined interval along a first direction DR1 in each light emitting area EMA. In an embodiment, the first direction DR1 may be a horizontal direction (or row direction), but is not limited thereto.

In an embodiment, the first and/or second electrodes ELT1 and ELT2 may have a pattern separated for each pixel PXL or a pattern that may be commonly electrically connected to a plurality of pixels PXL. For example, as illustrated in FIG. 7A, the first and second electrodes ELT1 and ELT2 may have an independent pattern with both ends disconnected outside the corresponding light emitting area EMA or inside the light emitting area EMA. In an embodiment, as illustrated in FIG. 7B and FIG. 7C, the first electrode ELT1 may have an independent pattern disconnected outside the light emitting area EMA or inside the light emitting area EMA, and one or an end of the second electrode ELT2 may extend in the first direction DR1 or second direction DR2 to be integrally connected to the second electrode ELT2 of another pixel PXL adjacent in the first direction DR1 or second direction DR2. In an embodiment, the second direction DR2 may be a vertical direction (or column direction), but is not limited thereto.

On the other hand, before the process of forming the pixel PXL, for example before the alignment of the light emitting elements LD is completed, the first electrodes ELT1 of the pixels PXL disposed in the display area DA may be electrically connected to each other, and the second electrodes ELT2 of the pixels PXL may be electrically connected to each other. The first and second electrodes ELT1 and ELT2 may receive a first alignment signal (or first alignment voltage) and a second alignment signal (or second alignment voltage), respectively, in an alignment step of the light emitting elements LD. For example, one of the first and second electrodes ELT1 and ELT2 may be supplied with an AC-type alignment signal, and the other of the first and second electrodes ELT1 and ELT2 may be supplied with an alignment voltage (for example, a ground voltage) having a constant voltage level.

For example, a predetermined alignment signal may be applied to the first and second electrodes ELT1 and ELT2 in the alignment step of the light emitting elements LD. Accordingly, an electric field may be formed or disposed between the first and second electrodes ELT1 and ELT2. The light emitting elements LD provided or disposed in each pixel area (for example, the light emitting area EMA of each pixel PXL) may be self-aligned between the first and second electrodes ELT1 and ELT2 by the electric field. After the alignment of the light emitting elements LD is completed, by disconnecting the at least first electrodes ELT1 between the pixels PXL, the pixels PXL may be formed in a form capable of being individually driven.

The first and second electrodes ELT1 and ELT2 may have various shapes. For example, as illustrated in FIG. 7A and FIG. 7B, each of the first and second electrodes ELT1 and ELT2 may have a substantially bar-like shape extending along one direction. For example, each of the first and second electrodes ELT1 and ELT2 may have a substantially bar-like shape extending along the second direction DR2 intersecting (for example, orthogonal) to the first direction DR1.

In an embodiment, as illustrated in FIG. 7C, the first and second electrodes ELT1 and ELT2 may have a substantially bar-like shape extending along the second direction DR2 in the light emitting area EMA, and may extend along the first direction DR1 in an outer or periphery area of the light emitting area EMA. For example, the first electrode ELT1 may have a structure bent to extend along the first direction DR1 at an upper end of the light emitting area EMA, and the second electrode ELT2 may have a structure bent to extend along the first direction DR1 at a lower end of the light emitting area EMA.

For example, the shape and/or structure of the first and second electrodes ELT1 and ELT2 may be variously changed. For example, the first electrode ELT1 and/or second electrode ELT2 may be formed as a substantially spiral or substantially circular electrode.

FIG. 7A to FIG. 7C illustrate an embodiment in which one first electrode ELT1 and one second electrode ELT2 are disposed in each light emitting area EMA, but the number and/or mutual arrangement structure of the first and second electrodes ELT1 and ELT2 disposed in each pixel PXL may be variously changed. For example, in an embodiment, a plurality of first electrodes ELT1 and/or second electrodes ELT2 may be disposed in the light emitting area EMA of each pixel PXL.

In a case that a plurality of first electrodes ELT1 are disposed in one pixel PXL, the first electrodes ELT1 may be integrally or non-integrally connected to each other. For example, the first electrodes ELT1 may be integrally connected, or may be connected to each other by a bridge pattern positioned on a different layer (for example, a circuit layer on which the pixel circuit PXC is disposed) from the first electrodes. Similarly, in a case that a plurality of second electrodes ELT2 are disposed in one pixel PXL, the second electrodes ELT2 may be integrally or non-integrally connected to each other. For example, the second electrodes ELT2 may be integrally connected to each other, or may be connected to each other by a bridge pattern positioned on a different layer from the second electrodes.

For example, in the disclosure, the shape, number, arrangement direction, and/or mutual disposed relationship of the first and second electrodes ELT1 and ELT2 disposed in each pixel PXL may be variously changed.

The first electrode ELT1 may be electrically connected to a predetermined circuit element (for example, at least one transistor configuring the pixel circuit PXC), a power line (for example, the first power line PL1), and/or a signal line (for example, the scan line Si, the data line Dj, or a predetermined control line), through a first contact hole CH1. However, the disclosure is not limited thereto. For example, in an embodiment, the first electrode ELT1 may be electrically connected (or, directly electrically connected) to a predetermined power wire or signal wire.

In an embodiment, the first electrode ELT1 may be electrically connected to a predetermined circuit element disposed thereunder through the first contact hole CH1, and to a first wire through the circuit element. The first wire may be a first power wire PL1 for supplying the first power source VDD, but is not limited thereto. For example, the first wire may be a signal wire to which a predetermined first driving signal (for example, a scan signal, a data signal, or a predetermined control signal) is supplied.

The second electrode ELT2 may be electrically connected to a predetermined circuit element (for example, at least one transistor configuring the pixel circuit PXC), a power line (wire) (for example, the second power line (wire) PL2), and/or a signal line (for example, the scan line Si, the data line Dj, or a predetermined control line), through a second contact hole CH2. However, the disclosure is not limited thereto. For example, in an embodiment, the second electrode ELT2 may be electrically connected (or, directly electrically connected) to a predetermined power wire or signal wire.

In an embodiment, the second electrode ELT2 may be electrically connected to the second wire disposed thereunder through the second contact hole CH2. The second wire may be a second power wire PL2 for supplying the second power source VSS, but is not limited thereto. For example, the second wire may be a signal wire to which a predetermined second driving signal (for example, a scan signal, a data signal, or a predetermined control signal) is supplied.

Each of the first and second electrodes ELT1 and ELT2 may be a single layer or a multilayer. For example, the first electrode ELT1 may include at least one reflective electrode layer including a reflective conductive material, and may optionally further include at least one transparent electrode layer and/or a conductive capping layer. Similarly, the second electrode ELT2 may include at least one reflective electrode layer including a reflective conductive material, and may optionally further include at least one transparent electrode layer and/or a conductive capping layer. The reflective conductive material may be one of various metallic materials including aluminum (Al) as an example, but is not limited thereto.

The light emitting elements LD may be electrically connected in parallel between the first electrode ELT1 and the second electrode ELT2. For example, each light emitting element LD may be disposed between the first electrode ELT1 and the second electrode ELT2 in the first direction DR1, and thus may be electrically connected between the first and second electrodes ELT1 and ELT2.

FIG. 7A to FIG. 7D illustrate that all of the light emitting elements LD are uniformly aligned in the first direction DR1, but the disclosure is not limited thereto. For example, at least one of the light emitting elements LD may be arranged in the display area DA in an oblique direction between the first and second electrodes ELT1 and ELT2.

In an embodiment, each light emitting element LD may be an ultra-small light emitting element using a material having an inorganic crystal structure, for example, having a size as small as a nano-scale or a micro-scale. For example, each light emitting element LD may be an ultra-small light emitting element having a size ranging from a nano scale to a micro scale, as illustrated in FIG. 1A to FIG. 4B. However, the type and/or size of the light emitting element LD may be variously changed according to each light emitting device using the light emitting element LD as a light source, for example, according to a design condition of the pixel PXL.

Each light emitting element LD may include the first end portion EP1 disposed toward the first electrode ELT1 and the second end EP2 disposed toward the second electrode ELT2. In an embodiment, each light emitting element LD may overlap the first and/or second electrodes ELT1 and/or ELT2, or may not overlap the first and/or second electrodes ELT1 and/or ELT2. For example, the first end portion EP1 of the light emitting element LD may or may not overlap the first electrode ELT1. For example, the second end portion EP2 of the light emitting element LD may or may not overlap the second electrode ELT2.

In an embodiment, the first end portion EP1 of each of the light emitting elements LD may be electrically connected to the first electrode ELT1, and the second end portion EP2 of each of the light emitting elements LD may be electrically connected to the second electrode ELT2. For example, the first end portion EP1 of each of the light emitting elements LD may be electrically connected to the first electrode ELT1 through the first contact electrode CNE1, and the second end portion EP2 of each of the light emitting elements LD may be electrically connected to the second electrode ELT2 through the second contact electrode CNE2. In an embodiment, the first end portion EP1 of each of the light emitting elements LD may electrically contact (or directly electrically contact) the first electrode ELT1, and thus, may be electrically connected to the first electrode ELT1. Similarly, the second end portion EP2 of each of the light emitting elements LD may electrically contact (or directly electrically contact) the second electrode ELT2, and thus, may be electrically connected to the second electrode ELT2. The first contact electrode CNE1 and/or second contact electrode CNE2 may be selectively formed.

In an embodiment, the light emitting elements LD may be prepared in a form dispersed in a predetermined solution to be supplied to each pixel area (for example, the light emitting area EMA of each pixel PXL) through various methods including an inkjet method or a slit coating method. For example, the light emitting elements LD may be mixed with a volatile solvent, and may be supplied to the light emitting area EMA of each pixel PXL. In a case that a predetermined alignment voltage (or alignment signal) is applied to the first and second electrodes ELT1 and ELT2 of the pixels PXL, an electric field is formed or disposed between the first and second electrodes ELT1 and ELT2, and thus, the light emitting elements LD are aligned between the first and second electrodes ELT1 and ELT2. After the light emitting elements LD are aligned, the light emitting elements LD may be stably arranged or disposed between the first and second electrodes ELT1 and ELT2 by volatilizing the solvent or eliminating it in other ways.

In an embodiment, the first contact electrode CNE1 and second contact electrode CNE2 may be formed or disposed on both end portions of the light emitting elements LD, for example, the first and second end portions EP1 and EP2 thereof, respectively. Accordingly, the light emitting elements LD may be more stably electrically connected between the first and second electrodes ELT1 and ELT2.

The first contact electrode CNE1 may be disposed on the first electrode ELT1 and the first end portion EP1 of the light emitting element LD to overlap the first electrode ELT1 and the first end portion EP1 of the at least one light emitting element LD adjacent to the first electrode. For example, the first contact electrode CNE1 may be disposed on the first electrode ELT1 and the first end portions EP1 of the light emitting elements LD to overlap the first electrode ELT1 and the first end portions EP1 of a plurality of light emitting elements LD adjacent to the first electrode.

The first contact electrode CNE1 may electrically connect the first electrode ELT1 and the first end portions EP1 of the light emitting elements LD. For example, the first contact electrode CNE1 may stably fix the first end portions EP1 of the light emitting elements LD. On the other hand, in an embodiment, in a case that the first contact electrode CNE1 may not be formed, the first end portions EP1 of the light emitting elements LD may be disposed to overlap the first electrode ELT1 adjacent thereto to be electrically connected (or, directly electrically connected) to the first electrode ELT1.

The second contact electrode CNE2 may be disposed on the second electrode ELT2 and the second end portion EP2 of the light emitting element LD to overlap the second electrode ELT2 and the second end portion EP2 of the at least one light emitting element LD adjacent to the second electrode. For example, the second contact electrode CNE2 may be disposed on the second electrode ELT2 and the second end portions EP2 of the light emitting elements LD to overlap the second electrode ELT2 and the second end portions EP2 of a plurality of light emitting elements LD adjacent to the second electrode.

The second contact electrode CNE2 may electrically connect the second electrode ELT2 and the second end portions EP2 of the light emitting elements LD. For example, the second contact electrode CNE2 may stably fix the second end portions EP2 of the light emitting elements LD. On the other hand, in an embodiment, in a case that the second contact electrode CNE2 may not be formed or disposed, the second end portions EP2 of the light emitting elements LD may be disposed to overlap the second electrode ELT2 adjacent thereto to be electrically connected (or, directly electrically connected) to the second electrode ELT2.

In a case that the light source unit LSU may include at least two serial stages, at least one additional electrode may be further formed or disposed in the light emitting area EMA of each pixel PXL. For example, in a case that the light source unit LSU of the pixel PXL has a series/parallel mixed structure including two serial stages, as illustrated in FIG. 7D, the pixel PXL may further include a middle electrode IET disposed between the first and second electrodes ELT1 and ELT2. The middle electrode IET is spaced apart from the first and second electrodes ELT1 and ELT2 between the first and second electrodes ELT1 and ELT2, and may be electrically connected to the first and second electrodes ELT1 and ELT2 through at least one first and second light emitting elements LD1 and LD2, respectively. For example, the pixel PXL may optionally further include a third contact electrode CNE3 for stably electrically connecting the middle electrode IET to the second end portions EP2 of the first light emitting elements LD1 and the first end portions EP1 of the second light emitting elements LD2.

In the above-described embodiment, each light emitting element LD electrically connected in a forward direction between the first and second electrodes ELT1 and ELT2 may form an effective light source of the corresponding pixel PXL. For example, the effective light sources may be gathered to form the light source unit LSU of the corresponding pixel PXL.

For example, in a case that the first power source VDD (or a predetermined first control signal in addition to a scan signal or a data signal) is applied to the first end portions EP1 of the light emitting elements LD via the first power line PL1, the first electrode ELT1, and/or the first contact electrode CNE1 and in a case that the second power source VSS (or a predetermined second control signal in addition to a scanning signal or a data signal) is applied to the second end portions EP2 of the light emitting elements LD via the second power line PL2, the second electrode ELT2, and/or the second contact electrode CNE2, the light emitting elements LD electrically connected in a forward direction between the first and second electrodes ELT1 and ELT2 emit light. Accordingly, light is emitted from the pixel PXL.

Figure 8A:
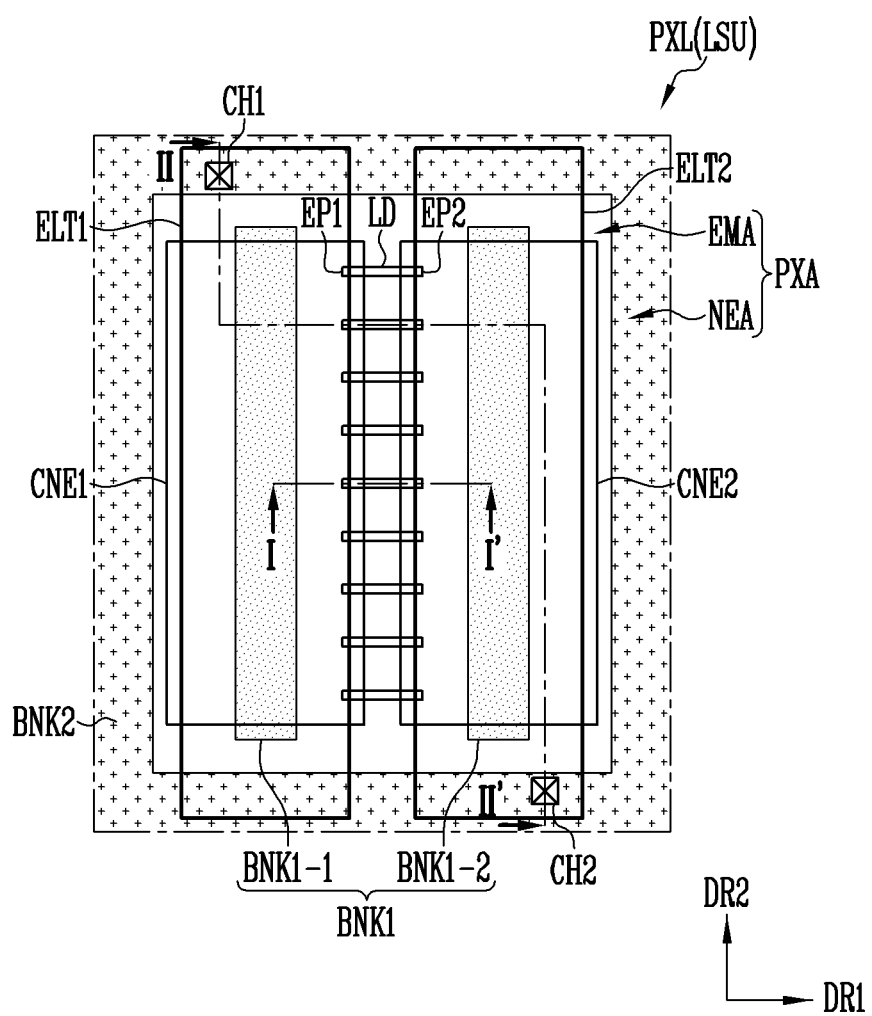
FIG. 8A and FIG. 8B respectively illustrate a top plan view of a pixel according to an embodiment.
Figure 8B:
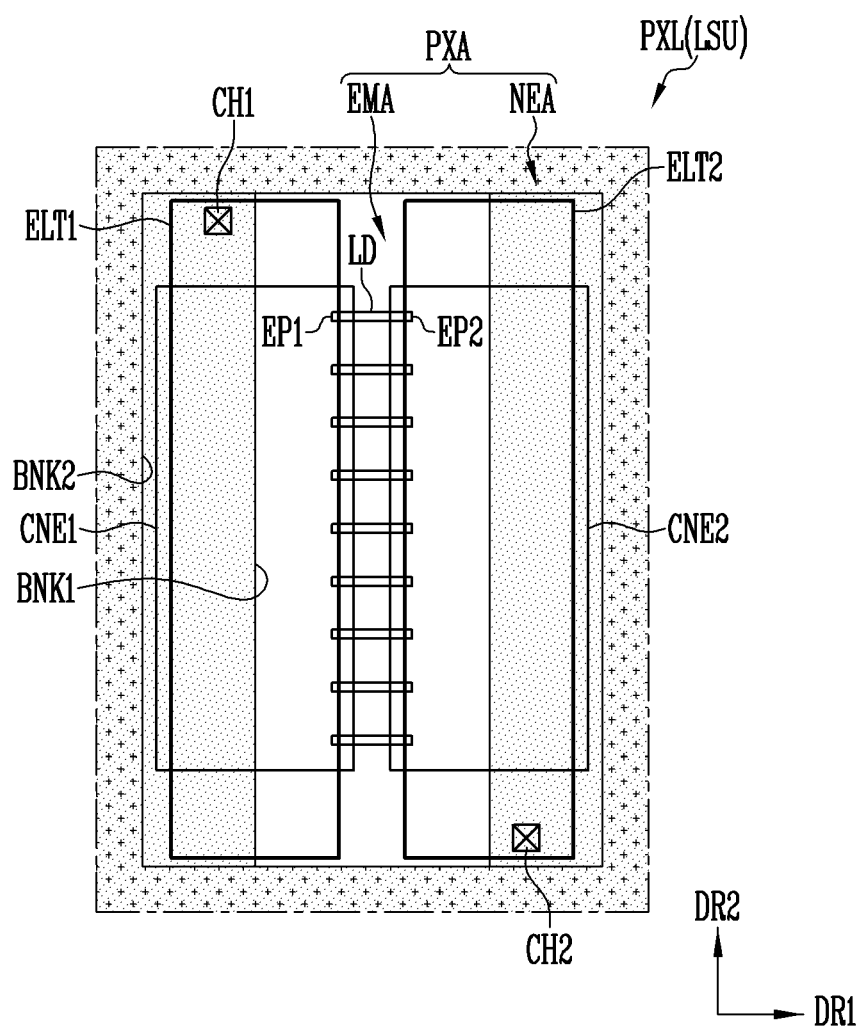

FIG. 8A and FIG. 8B respectively illustrate a top plan view of a pixel PXL according to an embodiment. For example, FIG. 8A and FIG. 8B illustrate a pixel PXL further including a first bank BNK1 and a second bank BNK2, for example different embodiments with respect to a shape and/or position of the first bank BNK1.

FIG. 8A and FIG. 8B illustrate a modified embodiment of the pixel PXL of FIG. 7A, but the pixel PXL to which the first and second banks BNK1 and BNK2 may be applied is not limited thereto. For example, the first and second banks BNK1 and BNK2 of FIG. 8A and FIG. 8B may be applied to the pixels PXL of FIG. 7B to FIG. 7D, or may be applied to pixels PXL having other structures.

Referring to FIG. 7A to FIG. 8B, each pixel PXL may further include the first bank BNK1 overlapping the first and second electrodes ELT1 and ELT2, and the second bank BNK2 surrounding each light emitting area EMA.

The first bank BNK1 (also referred to as a "partition wall") may be disposed under or below the first and second electrodes ELT1 and ELT2. For example, the first bank BNK1 may be disposed under the first and second electrodes ELT1 and ELT2 to respectively overlap one area or an area or areas of the first and second electrodes ELT1 and ELT2.

The first banks BNK1 may be formed or disposed in a separate or integral pattern. For example, the first bank BNK1 may include, as illustrated in FIG. 8A, a (1–1)-th bank BNK1–1 disposed under or below the first electrode ELT1 to overlap one or an area of the first electrode ELT1, and a (1–2)-th bank BNK1–2 disposed under or below the second electrode ELT2 to overlap one or an area of the second electrode ELT2 and separated from the (1–1)-th bank BNK1–1. In an embodiment, the first bank BNK1 may include, as illustrated in FIG. 8B, an opening or groove that overlaps one or an area of each of the first and second electrodes ELT1 and ELT2 and the second bank BNK2 and that corresponds to an area in which the light emitting elements LD are disposed to surround the area in which the light emitting elements LD are disposed. The first bank BNK1 may be formed or disposed in an area including at least a portion of the light emitting area EMA and a non-light emitting area NEA around the light emitting area EMA.

Here, the non-light emitting area NEA may mean the remaining area of each pixel area PXA except for the light emitting area EMA.

As the first bank BNK1 is disposed under or below one or an area of each of the first and second electrodes ELT1 and ELT2, the first and second electrodes ELT1 and ELT2 may be protrude upward in an area in which the first bank BNK1 may be formed or disposed. This first bank BNK1 may form a reflective bank (also referred to as a "reflective partition wall") together with the first and second electrodes ELT1 and ELT2. For example, the first and second electrodes ELT1 and ELT2 and/or the first bank BNK1 may be formed of a reflective material, or at least one material layer having a reflective characteristic may be formed or disposed on the protruding side walls of the first and second electrodes ELT1 and ELT2 and/or the first bank BNK1. Accordingly, the light emitted from the first and second end portions EP1 and EP2 of the light emitting elements LD facing the first and second electrodes ELT1 and ELT2 may be induced to be more directed toward a front direction of the display panel PNL. Here, the front direction of the display panel PNL may mean a normal direction to the display panel PNL, and for example, it may comprehensively mean a direction included in a predetermined viewing angle range. As such, in a case that one or an area of each of the first and second electrodes ELT1 and ELT2 is protruded in the upper direction by the first bank BNK1, a ratio of the light directed to the front direction of the display panel PNL with respect to the light generated from the pixel PXL may be increased, and thus, it is possible to improve a light efficiency of the pixel PXL.

In an embodiment, the pixel PXL may not include the first bank BNK1. The first and second electrodes ELT1 and ELT2 may be formed to be substantially flat, or may be formed to have a protrusion and depression surface. For example, by forming each of the first and second electrodes ELT1 and ELT2 to have a different thickness for each area to form a protrusion and depression surface, one or an area of the first and second electrodes ELT1 and ELT2 may be protruded in the upper direction. Accordingly, the light emitted from the light emitting elements LD may be more guided toward the front direction of the display panel PNL.

The second bank BNK2 is a structure defining the light emitting area EMA of each pixel PXL, and may be, for example, a pixel defining layer. For example, the second bank BNK2 may be disposed in a boundary area of each pixel area in which the pixel PXL may be provided or disposed and/or in an area between the pixels PXL adjacent thereto to surround the light emitting area EMA of each pixel PXL.

The second bank BNK2 may or may not partially overlap the first and/or second electrodes ELT1 and/or ELT2. For example, the second bank BNK2 may overlap one area or an area or areas (for example, both end portions) of the first and second electrodes ELT1 and ELT2 as illustrated in FIG. 8A. The first and second contact holes CH1 and CH2 may be formed or disposed in the non-light emitting area NEA to overlap the second bank BNK2, or may be formed or disposed inside of the light emitting area EMA to not overlap the second bank BNK2. In an embodiment, the second bank BNK2 may not overlap the first and second electrodes ELT1 and ELT2 as illustrated in FIG. 8B. In an embodiment, the second bank BNK2 does not overlap one (for example, the first electrode ELT1) of the first and second electrodes ELT1 and ELT2, and may overlap only the remaining electrode (for example, the second electrode ELT2) thereof.

The second bank BNK2 may include at least one light-blocking and/or reflective material to prevent light leakage between adjacent pixels PXL. For example, the second bank BNK2 may include at least one black matrix material (for example, at least one light-blocking material) among various types of black matrix materials, and/or a color filter material of a specific or predetermined color. For example, the second bank BNK2 may be formed in a black opaque pattern to block light transmission. In an embodiment, a reflective layer (not illustrated) may be formed or disposed on a surface (for example, a side surface) of the second bank BNK2 to further increase a light efficiency of the pixel PXL.

For example, the second bank BNK2 may function as a dam structure that defines each light emitting area EMA in which the light emitting elements LD should be supplied at the step of supplying the light emitting elements LD to each pixel PXL. For example, each light emitting area EMA is partitioned by the second bank BNK2, so that a desired type and/or amount of light emitting element ink may be supplied into the light emitting area EMA.

In an embodiment, the second bank BNK2 may be simultaneously formed or disposed in the same layer as the first banks BNK1 in the process of forming the first banks BNK1 of the pixels PXL. In an embodiment, the second bank BNK2 may be formed or disposed in the same or different layer as or from the first banks BNK1 through a separate process from the process of forming the first banks BNK1.

Figure 9A:
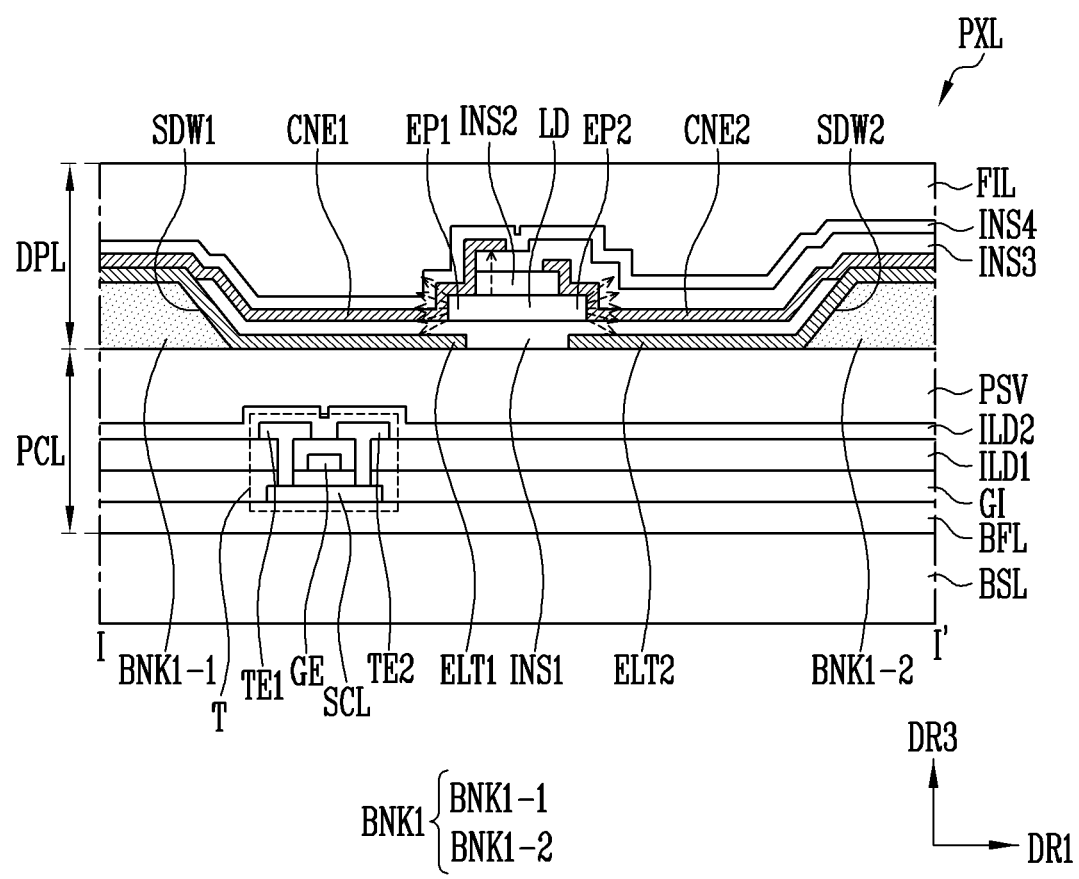
FIG. 9A to FIG. 9D respectively illustrate a schematic cross-sectional view of a pixel according to an embodiment.
Figure 9B:
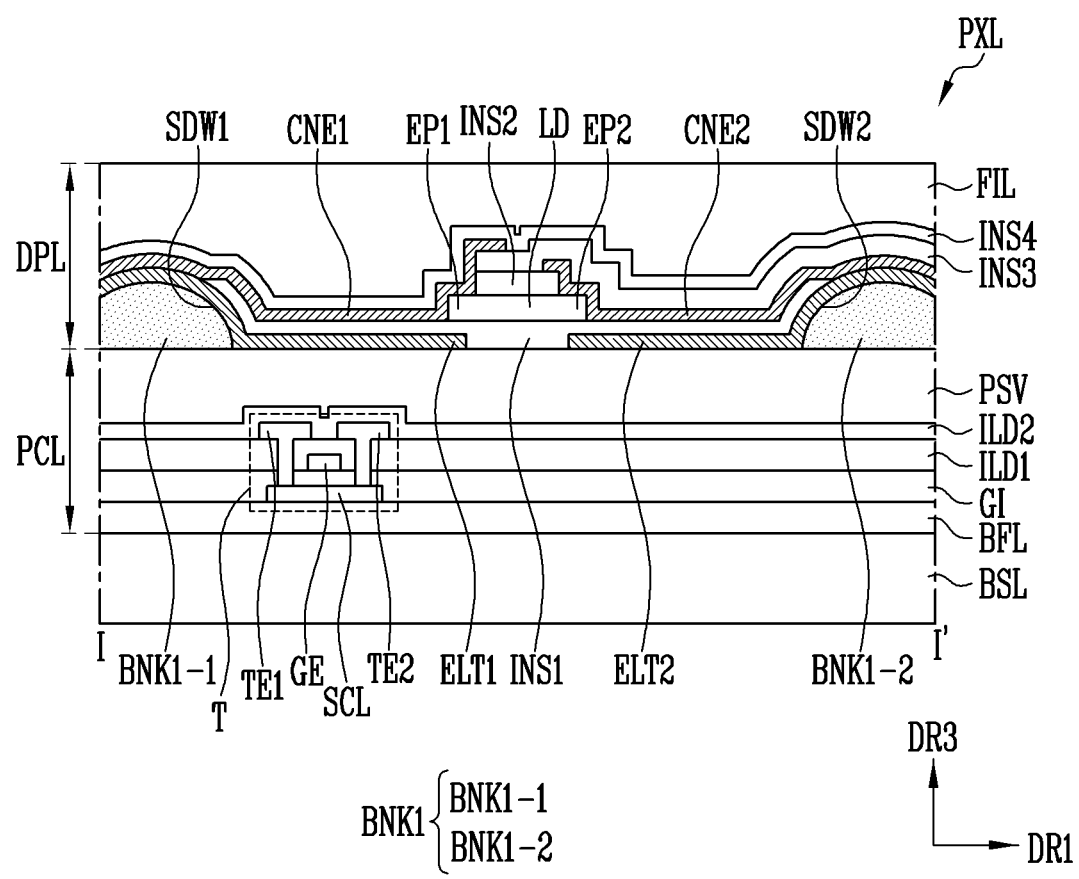
Figure 9C:
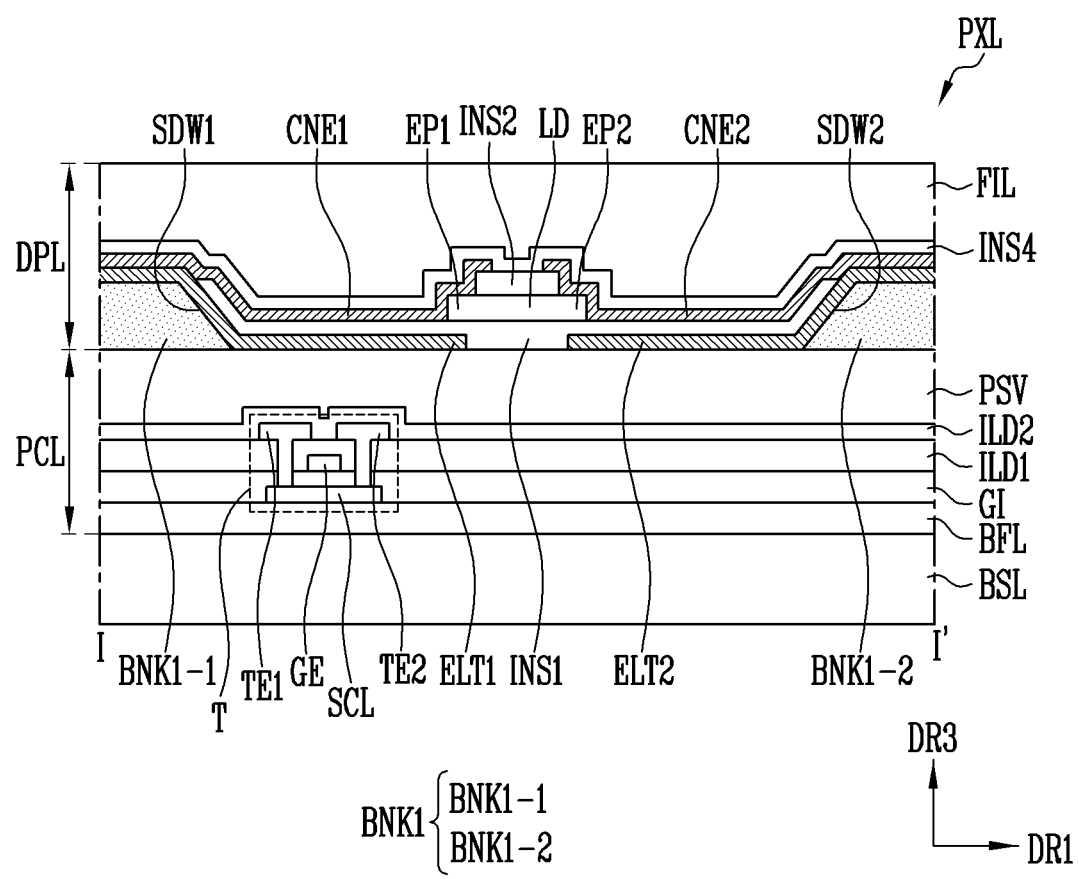
Figure 9D:
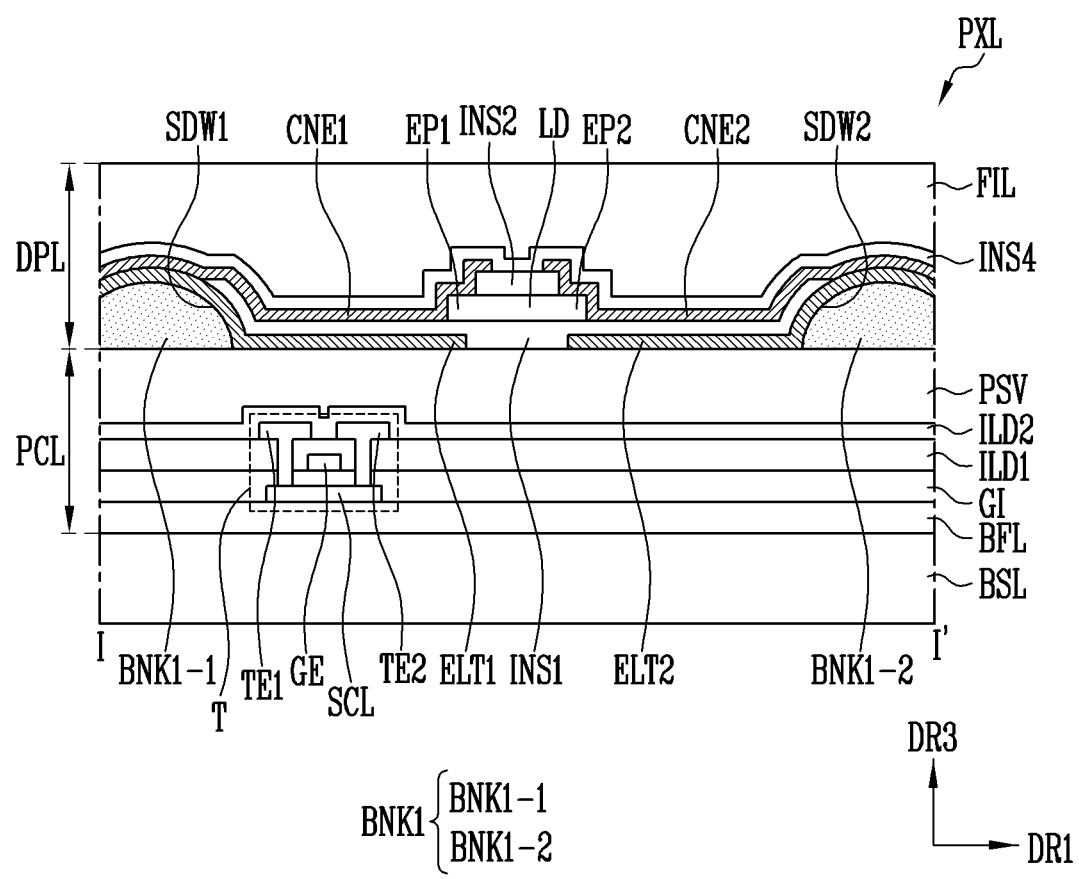
Figure 10:
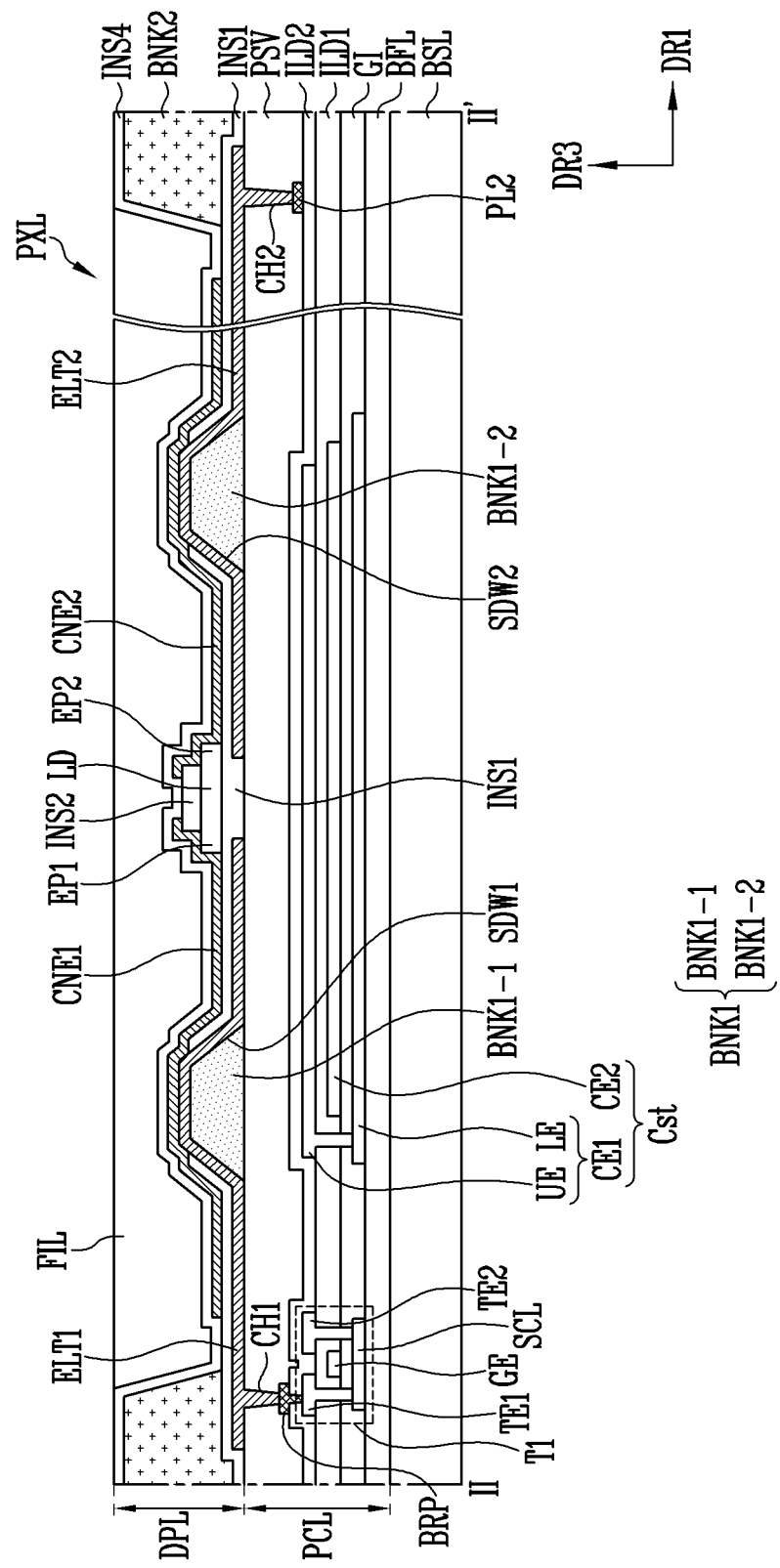
FIG. 10 illustrates a schematic cross-sectional view of a pixel according to an embodiment.

FIG. 9A to FIG. 9D and FIG. 10 respectively illustrate a schematic cross-sectional view of a pixel PXL according to an embodiment. For example, FIG. 9A to FIG. 9D illustrate schematic cross-sectional views of the pixel PXL taken along line I-I' of FIG. 8A according to different embodiments, and FIG. 10 illustrates a schematic cross-sectional view of the pixel PXL taken along line II-IP of FIG. 8A according to an embodiment. In an embodiment, the pixels PXL disposed in the display area DA may have substantially the same or similar cross-sectional structure.

In order to illustrate various circuit elements included in the pixel circuit PXC, FIG. 9A to FIG. 9D illustrate an arbitrary transistor T among the circuit elements, and FIG. 10 illustrates a transistor (for example, the first transistor T1 of FIG. 6A and FIG. 6B) electrically connected to the first electrode ELT1 and a storage capacitor Cst among the circuit elements. Hereinafter, when it is not necessary to separately specify the first transistor T1, the first transistor T1 will also be referred to as a "transistor T".

Structures of the transistors T and the storage capacitor Cst and/or a position of each layer thereof are not limited to embodiments illustrated in FIG. 9A to FIG. 9D and FIG. 10, and may be variously changed according to embodiments. For example, in an embodiment, the transistors T included in each pixel circuit PXC may have substantially the same or similar structure to each other, but are not limited thereto. For example, in an embodiment, at least one of the transistors T included in the pixel circuit PXC may have a different cross-sectional structure from the remaining other transistors T, and/or may be disposed at a different position in a cross-section view.

Referring to FIG. 5 to FIG. 10, the pixel PXL and the display device including the same according to an embodiment may include a circuit layer PCL and a display layer DPL disposed to overlap each other on one or a surface of a base layer BSL. For example, the display area DA may include the circuit layer PCL disposed on one or a surface of the base layer BSL, and the display layer DPL disposed on the circuit layer PCL.

In an embodiment, circuit elements included in the pixel circuit PXC of each pixel PXL and various wires electrically connected thereto may be disposed in the circuit layer PCL. For example, electrodes (for example, the first and second electrodes ELT1 and ELT2 and/or the first and second contact electrodes CNE1 and CNE2) and the light emitting elements LD included in the light source unit LSU of each pixel PXL may be disposed in the display layer DPL.

The circuit layer PCL may include at least one circuit element electrically connected to the light emitting elements LD of each pixel PXL. For example, the circuit layer PCL may include a plurality of transistors T and a storage capacitor Cst that are disposed in each pixel area to form a pixel circuit PXC of a corresponding pixel PXL. For example, the circuit layer PCL may further include at least one power wire and/or signal wire electrically connected to each pixel circuit PXC and/or light source unit LSU. For example, the circuit layer PCL may include the first power wire PL1, the second power wire PL2, and the scan line Si and the data line Dj of each pixel PXL. On the other hand, in a case that the pixel circuit PXC is omitted and the light source unit LSU of each pixel PXL may be electrically connected (or, directly electrically connected) to the first and second power wires PL1 and PL2 (or predetermined signal wires), the circuit layer PCL may be omitted.

For example, the circuit layer PCL may include a plurality of insulation layers. For example, the circuit layer PCL may include a buffer layer BFL, a gate insulation layer GI, a first interlayer insulation layer ILD1, a second interlayer insulation layer ILD2, and/or a passivation layer PSV, sequentially stacked each other on one or a side of the base layer BSL. For example, the circuit layer PCL may selectively further include at least one light blocking pattern (not illustrated) and the like disposed under or below at least some or a number of the transistors T.

The buffer layer BFL may prevent impurities from diffusing into each circuit element. The buffer layer BFL may be formed as a single layer, but may also be formed as a multilayer of at least two layers or more. In a case that the buffer layer BFL is provided or disposed as the multilayer, respective layers may be made of the same or similar material or different materials. Various circuit elements such as the transistors T and the storage capacitor Cst, and various wires electrically connected to the circuit elements may be disposed on the buffer layer BFL. In an embodiment, the buffer layer BFL may be omitted, and at least one circuit element and/or wire may be disposed on (or, directly disposed on) one or a surface of the base layer BSL.

Each transistor T may include a semiconductor pattern SCL (also referred to as a "semiconductor layer" or "active layer"), a gate electrode GE, first and second transistor electrodes TE1 and TE2. FIG. 9A to FIG. 10 illustrate an embodiment in which each transistor T may include the first and second transistor electrodes TE1 and TE2 formed separately from the semiconductor pattern SCL, but the disclosure is not limited thereto. For example, in an embodiment, the first and/or second transistor electrodes TE1 and/or TE2 provided or disposed in at least one transistor T may be integrated with each semiconductor pattern SCL.

The semiconductor pattern SCL may be disposed on the buffer layer BFL. For example, the semiconductor pattern SCL may be disposed between the base layer BSL on which the buffer layer BFL may be formed or disposed and the gate insulation layer GI. The semiconductor pattern SCL may include a first region electrically contacting each first transistor electrode TE1, a second region electrically contacting each second transistor electrode TE2, and a channel region disposed between the first and second regions. In an embodiment, one of the first and second regions may be a source region, and the other thereof may be a drain region.

In an embodiment, the semiconductor pattern SCL may be a semiconductor pattern made of polysilicon, amorphous silicon, an oxide semiconductor, or the like within the spirit and the scope of the disclosure. For example, the channel area of the semiconductor pattern SCL may be an intrinsic semiconductor as a semiconductor pattern that may not be doped with impurities, and each of the first and second regions of the semiconductor pattern SCL may be a semiconductor pattern doped with predetermined impurities.

In an embodiment, the semiconductor patterns SCL of the transistors T included in each pixel circuit PXC may be made of substantially the same or similar material. For example, the semiconductor pattern SCL of the transistors T may be made of one material of polysilicon, amorphous silicon, and an oxide semiconductor. In an embodiment, some or a number of the transistors T and the remaining some or number thereof may include the semiconductor patterns SCL made of different materials. For example, the semiconductor pattern SCL of some or a number of the transistors T may be made of polysilicon or amorphous silicon, and the semiconductor pattern SCL of other some or a number of the transistors T may be made of an oxide semiconductor.

The gate insulation layer GI may be disposed on the semiconductor pattern SCL. For example, the gate insulation layer GI may be disposed between the semiconductor pattern SCL and the gate electrode GE. The gate insulation layer GI may be formed as a single layer or as a multilayer, and may include at least one inorganic insulating material and/or organic insulating material. For example, the gate insulation layer GI may include a silicon nitride ($SiN_x$), a silicon oxide ($SiO_x$), or a silicon oxynitride ($SiO_xN_y$), and various types of organic/inorganic insulating materials.

The gate electrode GE may be disposed on the gate insulation layer GI. For example, the gate electrode GE may be disposed to overlap the semiconductor pattern SCL with the gate insulation layer GI interposed therebetween. FIG. 9A to FIG. 10 illustrate a top-gate structure of transistor T, but in an embodiment, the transistor T may have a bottom-gate structure. The gate electrode GE may be disposed to overlap the semiconductor pattern SCL under or below the semiconductor pattern SCL.

The first interlayer insulation layer ILD1 may be disposed on the gate electrode GE. For example, the first interlayer insulation layer ILD1 may be disposed between the gate electrode GE and the first and second transistor electrodes TE1 and TE2. The first interlayer insulation layer ILD1 may be formed as a single layer or as a multilayer, and may include at least one inorganic insulating material and/or organic insulating material. For example, the first interlayer insulation layer ILD1 may include a silicon nitride (SiNx), a silicon oxide ($SiO_x$), or silicon oxynitride ($SiO_xN_y$), and various types of organic/inorganic insulating materials, and the materials included in the first interlayer insulation layer ILD1 are not particularly limited.

The first and second transistor electrodes TE1 and TE2 may be disposed on each semiconductor pattern SCL with at least one first interlayer insulation layer ILD1 therebetween. For example, the first and second transistor electrodes TE1 and TE2 may be disposed on different end portions of the semiconductor pattern SCL with the gate insulation layer GI and the first interlayer insulation layer ILD1 therebetween. The first and second transistor electrodes TE1 and TE2 may be electrically connected to each semiconductor pattern SCL. For example, the first and second transistor electrodes TE1 and TE2 may be electrically connected to the first and second regions of the semiconductor pattern SCL through respective contact holes passing through the gate insulation layer GI and the first interlayer insulation layer ILD1. In an embodiment, one of the first and second transistor electrodes TE1 TE2 may be a source electrode, and the other thereof may be a drain electrode.

At least one transistor T provided or disposed in the pixel circuit PXC may be electrically connected to at least one pixel electrode. For example, the first transistor T1 illustrated in FIG. 6A to FIG. 6C or the sixth and seventh transistors T6 and T7 illustrated in FIG. 6D may be electrically connected to may be electrically connected to the first electrode ELT1 of the corresponding pixel PXL through a contact hole (for example, the first contact hole CH1) and/or a bridge pattern BRP penetrating the passivation layer PSV.

The storage capacitor Cst may include a first capacitor electrode CE1 and a second capacitor electrode CE2 overlapping each other. Each of the first and second capacitor electrodes CE1 and CE2 may be a single layer or a multilayer. For example, at least one of the first and second capacitor electrodes CE1 and CE2 may be disposed on the same layer as at least one electrode or the semiconductor pattern SCL configuring the first transistor T1.

For example, the first capacitor electrode CE1 may be a multilayer electrode that may include a lower electrode LE disposed on the same layer as the semiconductor pattern SCL of the first transistor T1, and an upper electrode UE disposed on the same layer as the first and second transistor electrodes TE1 and TE2 of the first transistor T1 and electrically connected to the lower electrode LE. For example, the second capacitor electrode CE2 may be as a single layer electrode that may be disposed on the same layer as the gate electrode of the first transistor T1 and may be disposed between the lower electrode LE and the upper electrode UE of the first capacitor electrode CE1.

However, the structure and/or position of each of the first and second capacitor electrodes CE1 and CE2 may be variously changed. For example, in an embodiment, one of the first and second capacitor electrodes CE1 and CE2 may include a conductive pattern disposed on a layer different from the electrodes (for example, the gate electrode GE, and the first and second transistor electrodes TE1 and TE2) and the semiconductor pattern SCL that configure or form the first transistor T1. For example, the first capacitor electrode CE1 or the second capacitor electrode CE2 may have a single-layered or multi-layered structure including a conductive pattern disposed on the second interlayer insulation layer ILD2.

In an embodiment, at least one signal wire and/or power wire electrically connected to each pixel PXL may be disposed on the same layer as one electrode of circuit elements included in the pixel circuit PXC. For example, the scan line Si of each pixel PXL may be disposed on the same layer as the gate electrodes GE of transistors T, and the data line Dj of each pixel PXL may be disposed on the same layer as the first and second transistor electrodes TE1 and TE2 of transistors T.

The first and/or second power wires PL1 and PL2 may be dispose on the same layer as or different layers from the gate electrodes GE or first and second transistor electrodes TE1 and TE2 of the transistors T. For example, the second power wire PL2 for supplying the second power source VSS may be disposed on the second interlayer insulation layer ILD2 to be at least partially covered or overlapped by the passivation layer PSV. The second power wire PL2 may be electrically connected to the second electrode ELT2 of the light source unit LSU disposed on the passivation layer PSV through the second contact hole CH2 passing through the passivation layer PSV. However, the position and/or structure of the first and/or second power wires PL1 and PL2 may be variously changed. For example, in an embodiment, the second power line PL2 may be disposed on the same layer as the gate electrodes GE of the transistors T or the first and second transistor electrodes TE1 and TE2 to be electrically connected to the second electrode ELT2 through at least one bridge pattern (not illustrated) and/or the second contact hole CH2.

The second interlayer insulation layer ILD2 may be disposed at an upper portion of the first interlayer insulation layer ILD1, and may cover or overlap the first and second transistor electrodes TE1 and TE2 and/or storage capacitor Cst disposed on the first interlayer insulation layer ILD1. The second interlayer insulation layer ILD2 may be formed as a single layer or as a multilayer, and may include at least one inorganic insulating material and/or organic insulating material. For example, the second interlayer insulation layer ILD2 may include a silicon nitride ($SiN_x$), a silicon oxide ($SiO_x$), or silicon oxynitride ($SiO_xN_y$), and various types of organic/inorganic insulating materials, and the materials included in the second interlayer insulation layer ILD2 are not particularly limited. The bridge pattern BRP, the first power wire PL1, and/or the second Power wire PL2 for electrically connecting at least one circuit element (for example, the first transistor T1) provided or disposed in the pixel circuit PXC to the first electrode ELT1 may be disposed on the second interlayer insulation layer ILD2.

However, in an embodiment, the second interlayer insulation layer ILD2 may be omitted. The bridge pattern BRP of FIG. 10 may be omitted, and the second power wire PL2 may be disposed on a layer in which one electrode of the transistor T is disposed.

The passivation layer PSV may be disposed on the circuit elements including the transistors T and the storage capacitor Cst, and/or on the wires including the first and second power wires PL1 and PL2. The passivation layer PSV may be formed as a single layer or as a multilayer, and may include at least one inorganic insulating material and/or organic insulating material. For example, the passivation layer PSV may include at least one organic insulation layer, and may substantially flatten a surface of the circuit layer PCL. The display layer DPL may be disposed on the passivation layer PSV.

The display layer DPL may include the light source unit LSU of each pixel PXL. For example, the display layer DPL may include at least one pair of first electrodes ELT1 and second electrodes ELT2 disposed in the light emitting area EMA of each pixel PXL and configuring each light source unit LSU, and at least one light emitting element LD electrically connected between the first electrode ELT1 and the second electrode ELT2.

On the other hand, FIG. 9A to FIG. 10 each illustrates one light emitting element LD, but each pixel PXL may include a plurality of light emitting elements LD electrically connected in a forward direction between the first and second electrodes ELT1 and ELT2 as in embodiments of FIG. 6A to FIG. 8B. Therefore, in describing embodiments of FIG. 9A to FIG. 10 and an embodiment to be described later, each embodiment will be described assuming that the pixel PXL may include a plurality of light emitting elements LD. However, in an embodiment, it should be noted that the pixel PXL may include only a single light emitting element LD.

For example, the display layer DPL may further selectively include the first and second contact electrodes CNE1 and CNE2 for more stably electrically connecting the light emitting elements LD between the first and second electrodes ELT1 and ELT2, the first bank BNK1 for protruding an area of each of the first and second electrodes ELT1 and ELT2 upward, and/or the second bank BNK2 surrounding each light emitting area EMA. For example, the display layer DPL may further include at least one conductive layer and/or an insulation layer.

For example, the display layer DPL may include the first bank BNK1, the first and second electrodes ELT1 and ELT2, a first insulation layer INS1, the light emitting elements LD, a second insulation layer INS2, the first and second contact electrodes CNE1 and CNE2, a fourth insulation layer INS4, and a filler layer FIL, sequentially disposed and/or formed on the circuit layer PCL. In an embodiment, the first and second contact electrodes CNE1 and CNE2 may be separated from and disposed on different layers, and the display layer DPL may further include a third insulation layer INS3 interposed between the first and second contact electrodes CNE1 and CNE2.

The position of the second bank BNK2 may be variously changed in a cross-section view. In an embodiment, the second bank BNK2 may be formed or disposed on the first insulation layer INS1, but is not limited thereto. For example, in an embodiment, the second bank BNK2 may be disposed on the same layer as the first bank BNK1. For example, the second bank BNK2 may or may not overlap the first bank BNK1.

The first bank BNK1 may be disposed on one or a surface of the base layer BSL on which the circuit layer PCL may be selectively formed or disposed. The first bank BNK1 may be formed in a separate or integral pattern. The first bank BNK1 may be protruded in a height direction of the base layer BSL on one or a surface of the base layer BSL on which the circuit layer PCL may be formed or disposed.

The first bank BNK1 may include first and second side walls SDW1 and SDW2 (also referred to as the "first and second inclined surfaces") facing both end portions of the light emitting elements LD. For example, the first bank BNK1 may include a first side wall SDW1 disposed adjacent to the first end portions EP1 of the light emitting devices LD to face the first end portions EP1, and a second side wall SDW2 disposed adjacent to the second end portions EP2 of the light emitting devices LD to face the second end portions EP2.

The first bank BNK1 may have various shapes according to embodiments. In an embodiment, the first bank BNK1 may be formed to have an inclined surface inclined at an angle of a predetermined range with respect to the base layer (BSL) as illustrated in FIG. 9A, FIG. 9C, and FIG. 10. The first and second side walls SDW1 and SDW2 may have a slope of a certain or type of angle. In an embodiment, the first bank BNK1 may have the first and second side walls SDW1 and SDW2 of a substantially curved shape as illustrated in FIG. 9B and FIG. 9D. The first bank BNK1 may have a cross-section of a substantially semicircle or semi-ellipse shape, but is not limited thereto.

The first and second electrodes ELT1 and ELT2 and/or the first insulation layer INS1 and the like disposed at an upper portion of the first bank BNK1 may have a shape substantially corresponding to that of the first bank BNK1. For example, the first electrode ELT1 may include a substantially inclined or curved surface that may be disposed on the first side wall SDW1 of the first bank BNK1 and has a shape substantially corresponding to the shape of the first side wall SDW1. Similarly, the second electrode ELT2 may include a substantially inclined or curved surface that may be disposed on the second side wall SDW2 of the first bank BNK1 and has a shape substantially corresponding to the shape of the second side wall SDW2. Similarly, the first insulation layer INS1 may include a substantially inclined or curved surface that covers or overlaps the first and second side walls SDW1 and SDW2 of the first bank BNK1 and has a shape substantially corresponding to that of the first and second side walls SDW1 and SDW2.

However, in the disclosure, the shapes of the first bank BNK1 and of predetermined electrodes (for example, the first and second electrodes ELT1 and ELT2) and/or an insulation layer (for example, the first insulation layer INS1) formed or disposed thereon are not particularly limited. For example, in an embodiment, the first bank BNK1 and the like may have a substantially step shape. In an embodiment, the pixel PXL may not include the first bank BNK1.

The first bank BNK1 may contain an insulating material including at least one inorganic material and/or an organic material. For example, the first bank BNK1 may include at least one layer of inorganic film that may include various inorganic insulating materials including a silicon nitride ($SiN_x$), a silicon oxide ($SiO_x$), or a silicon oxynitride ($SiO_xN_y$). For example, the first bank BNK1 may include at least one layer of organic film and/or photo resist film that include various organic insulating materials, or may include a single-layered or multi-layered insulator complexly including organic/inorganic materials. For example, the material and/or pattern shape of the first bank BNK1 may be variously changed.

In an embodiment, the first bank BNK1 may function as a reflective member. For example, the first bank BNK1, along with the first and second electrodes ELT1 and ELT2 provided or disposed thereon, may function as a reflective member that guides the light emitted from each light emitting element LD in a desired direction (for example, third direction DR3) to improve the light efficiency of the pixel PXL.

The first and second electrodes ELT1 and ELT2 included in the pixel electrodes of each pixel PXL may be disposed at the upper portion of the first bank BNK1. In an embodiment, the first and second electrodes ELT1 and ELT2 may have a shape substantially corresponding to the first bank BNK1. For example, the first and second electrodes ELT1 and ELT2 may have respective inclined or curved surfaces corresponding to the first bank BNK1, and may be protruded in a height direction of the base layer BSL. On the other hand, in a case that the first bank BNK1 may not be formed or disposed, the first and second electrodes ELT1 and ELT2 may be substantially formed flat on the passivation layer PSV or may have different thicknesses for each area, so that one or an area may be protruded in a height direction of the base layer BSL.

Each of the first and second electrodes ELT1 and ELT2 may contain at least one conductive material. For example, each of the first and second electrodes ELT1 and ELT2 may include at least one metal of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an alloy including the same; a conductive oxide such as an indium tin oxide (ITO), an indium zinc oxide (IZO), an indium tin zinc Oxide (ITZO), a zinc oxide (ZnO), an aluminum doped zinc oxide (AZO), a gallium doped zinc oxide (GZO), a zinc tin oxide (ZTO), a gallium tin oxide (GTO), and a fluorine doped tin oxide (FTO); and at least one conductive material among conductive polymers such as PEDOT, but are not limited thereto.

For example, each of the first and second electrodes ELT1 and ELT2 may contain other conductive materials in addition to carbon nanotube or graphene. For example, each of the first and second electrodes ELT1 and ELT2 may have conductivity by containing at least one of various conductive materials, but the materials included therein are not particularly limited. For example, the first and second electrodes ELT1 and ELT2 may contain the same conductive material, or may contain different conductive materials.

For example, each of the first and second electrodes ELT1 and ELT2 may be a single layer or a multilayer. For example, each of the first and second electrodes ELT1 and ELT2 may include a reflective electrode layer containing a reflective conductive material. For example, each of the first and second electrodes ELT1 and ELT2 may selectively further include at least one of at least one transparent electrode layer disposed at an upper portion and/or a lower portion of the reflective electrode layer and at least one conductive capping layer covering or overlapping an upper portion of the reflective electrode layer and/or the transparent electrode layer.

In an embodiment, the reflective electrode layer may include a conductive material having a uniform reflectivity. For example, the reflective electrode layer may include at least one metal of various metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, or an alloy thereof, but is not limited thereto. For example, the reflective electrode layer included in each of the first and second electrodes ELT1 and ELT2 may include various reflective conductive materials.

In a case that each of the first and second electrodes ELT1 and ELT2 may include the reflective electrode layer, among the light emitted from both ends of each of the light emitting elements LD, for example, the first and second end portions EP1 and EP2, a ratio of light directed in a direction in which an image is displayed (for example, the third direction DR3) may be increased. In a case that the first and second electrodes ELT1 and ELT2 are disposed to face the first and second end portions EP1 and EP2 of the light emitting elements LD while having inclined or curved surfaces corresponding to the first and second side walls SDW1 and SDW2 of the first bank BNK1, the light emitted from the first and second end portions EP1 and EP2 of each of the light emitting elements LD is reflected by the adjacent first and second electrodes ELT1 and ELT2 to be further directed in the front direction of the display panel PNL (for example, a direction of a predetermined viewing angle range including the third direction DR3). Accordingly, it is possible to more efficiently utilize the light generated by the light emitting elements LD.

For example, the transparent electrode layer may include various transparent conductive materials. For example, the transparent electrode layer may include at least one of ITO, IZO, ITZO, ZnO, AZO, GZO, ZTO, GTO, and FTO, but is not limited thereto. In an embodiment, each of the first and second electrodes ELT1 and ELT2 may be a triple layer having a stacked structure of ITO/Ag/ITO. In a case that each of the first and second electrodes ELT1 and ELT2 is a multilayer, voltage drop due to signal delay (RC delay) may be minimized. Accordingly, it is possible to effectively transmit a desired voltage to the light emitting elements LD.

Each of the first and second electrodes ELT1 and ELT2 may include a conductive capping layer covering or overlapping the reflective electrode layer and/or the transparent electrode layer. Thus, it is possible to prevent damage to the reflective electrode layers of the first and second electrodes ELT1 and ELT2 due to defects occurring in a manufacturing process of the pixel PXL. However, the conductive capping layer may be selectively included in each of the first and second electrodes ELT1 and ELT2, and may be omitted according to embodiments. For example, the conductive capping layer may be regarded as a constituent element of each of the first and second electrodes ELT1 and ELT2, or may be regarded as a separate constituent element disposed on the first and second electrodes ELT1 and ELT2.

The first insulation layer INS1 may be disposed on one or an area of the first and second electrodes ELT1 and ELT2. For example, the first insulation layer INS1 may be formed or disposed to cover or overlap one or an area of each of the first and second electrodes ELT1 and ELT2, and may include an opening exposing the other or another area of each of the first and second electrodes ELT1 and ELT2. In the area in which the first insulation layer INS1 may be opened, the first and second electrodes ELT1 and ELT2 may be electrically connected to the first and second contact electrodes CNE1 and CNE2, respectively.

For example, the first insulation layer INS1 may expose one or an area of each of the first and second electrodes ELT1 and ELT2 in one or an area of the first bank BNK1, and cover or overlap the remaining area of each of the first and second electrodes ELT1 and ELT2. In an embodiment, the first insulation layer INS1 may be omitted. The light emitting elements LD may be disposed on (or, directly disposed on) the passivation layer PSV and/or one or an end of each of first and second electrodes ELT1 and ELT2.

In an embodiment, the first insulation layer INS1 may be first formed or disposed to entirely cover or overlap the first and second electrodes ELT1 and ELT2. After the light emitting elements LD are supplied and arranged or disposed on the first insulation layer INS1, the first insulation layer INS1 may be partially opened to expose one or an area of the first and second electrodes ELT1 and ELT2. For example, the first insulation layer INS1 has an opening exposing one or an area of the first and second electrodes ELT1 and ELT2 on an upper surface of the first bank BNK1, and may at least partially cover or overlap the inclined or curved surfaces of the first and second electrodes ELT1 and ELT2. For example, in an embodiment, the first insulation layer INS1 may be patterned in a form of an individual pattern that may be locally disposed only under or below the light emitting elements LD after the light emitting elements LD are completely supplied and arranged or disposed.

The first insulation layer INS1 may be formed or disposed to cover or overlap the first and second electrodes ELT1 and ELT2 after the first and second electrodes ELT1 and ELT2 are formed or disposed. Accordingly, it is possible to prevent the first and second electrodes ELT1 and ELT2 from being damaged in a subsequent process.

The first insulation layer INS1 may be formed as a single layer or as a multilayer, and may include at least one inorganic insulating material and/or organic insulating material. For example, the first insulation layer INS1 may include a silicon nitride ($SiN_x$), a silicon oxide ($SiO_x$), a silicon oxynitride ($SiO_xN_y$), or an aluminum oxide ($Al_xO_y$), and various types of organic/inorganic insulating materials.

The light emitting elements LD may be supplied and arranged or disposed in the light emitting area EMA in which the first insulation layer INS1 or the like may be formed or disposed. Before the light emitting elements LD are supplied, the second bank BNK2 may be formed or disposed around the light emitting area EMA. For example, the second bank BNK2 may be formed or disposed in the display area DA to surround each light emitting area EMA.

The light emitting elements LD may be supplied to each pixel area PXA in which the first bank BNK1, the first and second electrodes ELT1 and ELT2, the first insulation layer INS1, the second bank BNK2, and the like are formed to be arranged or disposed between the first and second electrodes ELT1 and ELT2. For example, a plurality of light emitting elements LD may be supplied to the light emitting area EMA of each pixel PXL through an inkjet method, a slit coating method, or various other methods, and the light emitting elements LD may be aligned between the first and second electrodes ELT1 and ELT2 with directionality by a predetermined alignment signal (or alignment voltage) applied to each of the first and second electrodes ELT1 and ELT2.

In an embodiment, at least some or a number of the light emitting elements LD may be disposed in a horizontal direction or an oblique direction between the pair of first and second electrodes ELT1 and ELT2 so that both end portions thereof in a longitudinal direction (for example, the first and second end portions EP1 and EP2) overlap an adjacent pair of first and second electrodes ELT1 and ELT2. In an embodiment, at least some or a number of the light emitting elements LD may be disposed to not overlap the first and/or second electrodes ELT1 and ELT2 between a pair of adjacent first and second electrodes ELT1 and ELT2, and may be electrically connected to the pair of first and second electrodes ELT1 and ELT2 through the first and second contact electrodes CNE1 and CNE2, respectively. For example, in an embodiment, the light emitting elements LD may or may not overlap the first and/or second electrodes ELT1 and ELT2, and may be electrically connected between the first and second electrodes ELT1 and ELT2 by the first and second contact electrodes CNE1 and CNE2.

The second insulation layer INS2 may be disposed on one or an area of the light emitting elements LD. For example, the second insulation layer INS2 may be disposed on one or an area of each of the light emitting elements LD to expose the first and second end portions EP1 and EP2 of each of the light emitting elements LD. For example, the second insulation layer INS2 may be locally disposed only at an upper portion of one or an area including a central area of each of the light emitting elements LD.

The second insulation layer INS2 may be formed in an independent pattern in the light emitting area EMA of each pixel PXL, but is not limited thereto. In an embodiment, the second insulation layer INS2 may be omitted, and one or an end of each of the first and second contact electrodes CNE1 and CNE2 may be disposed on (or, directly disposed on) the upper surface of the light emitting elements LD.

The second insulation layer INS2 may be formed as a single layer or as a multilayer, and may include at least one inorganic insulating material and/or organic insulating material. For example, the second insulation layer INS2 may include a silicon nitride ($SiN_x$), a silicon oxide ($SiO_x$), a silicon oxynitride ($SiO_xN_y$), an aluminum oxide ($Al_xO_y$), or a photo resist (PR) material, and various types of organic/inorganic insulating materials.

In a case that the second insulation layer INS2 is formed or disposed on the light emitting elements LD after the alignment of the light emitting elements LD is completed, it is possible to prevent the light emitting elements LD from deviating from an aligned position. In an embodiment, in a case that a separation space exists between the first insulation layer INS1 and the light emitting elements LD by a step formed by the first and second electrodes ELT1 and ELT2, the separation space forms the second insulation layer INS2 may be filled with an insulating material introduced in a process of forming the second insulation layer INS2. Accordingly, the light emitting elements LD may be more stably supported. However, in an embodiment, the separation space may not be completely filled. For example, the second insulation layer INS2 may be formed or disposed only at the upper portion of the light emitting elements LD, or may be formed or disposed at both upper and lower portions of the light emitting elements LD.

Both end portions of the light emitting elements LD that may not be covered or overlapped by the second insulation layer INS2, for example, the first and second end portions EP1 and EP2, may be covered or overlapped by the first and second contact electrodes CNE1 and CNE2, respectively. The first and second contact electrodes CNE1 and CNE2 may be formed or disposed to be spaced apart from each other. For example, the adjacent first and second contact electrodes CNE1 and CNE2 may be spaced apart from each other on the first and second end portions EP1 and EP2 of at least one adjacent the light emitting element LD, with the second insulation layer INS2 therebetween.

For example, the first and second contact electrodes CNE1 and CNE2 may be disposed at the upper position of the first and second electrodes ELT1 and ELT2 to cover or overlap the exposed area of each of the first and second electrodes ELT1 and ELT2. For example, the first and second contact electrodes CNE1 and CNE2 may be disposed on at least one or an area of each of the first and second electrodes ELT1 and ELT2 to be in electrical contact with each of the first and second electrodes ELT1 and ELT2 at the upper portion of the first bank BNK1 or around the first bank BNK1.

Accordingly, the first and second contact electrodes CNE1 and CNE2 may be electrically connected to the first and second electrodes ELT1 and ELT2, respectively. For example, through the first and second contact electrodes CNE1 and CNE2, the first and second electrodes ELT1 and ELT2 may be electrically connected to the first or second end portions EP1 and EP2 of at least one light emitting element LD adjacent thereto, respectively.

In an embodiment, the first and second contact electrodes CNE1 and CNE2 may be sequentially formed or disposed in different layers on one or a surface of the base layer BSL as illustrated in FIG. 9A and FIG. 9B. The third insulation layer INS3 may be additionally disposed between the first contact electrode CNE1 and the second contact electrode CNE2.

The third insulation layer INS3 may be disposed on the second contact electrode CNE2 to cover or overlap the second contact electrode CNE2. For example, the third insulation layer INS3 may be disposed on the second insulation layer INS2 and the second contact electrode CNE2 such that one or an end portion thereof may be interposed between the first contact electrode CNE1 and the second contact electrode CNE2.

For example, the third insulation layer INS3 may be interposed between one or an end portion or end portions of the first and second contact electrodes CNE1 and CNE2 adjacent to each other. For example, one or an end portion of the third insulation layer INS3 disposed at the upper portion of the light emitting elements LD may cover or overlap one or an end portion of the second contact electrode CNE2 disposed at the upper portion of the light emitting elements LD, and one or an end portion of the first contact electrode CNE1 may be disposed on one or an end portion of the third insulation layer INS3. By forming the second and third insulation layers INS2 and INS3, it is possible to effectively prevent a short circuit defect from occurring between the first and second ends EP1 and EP2 of the light emitting elements LD.

The third insulation layer INS3 may be formed as a single layer or as a multilayer, and may include at least one inorganic insulating material and/or organic insulating material. For example, the third insulation layer INS3 may include a silicon nitride ($SiN_x$), a silicon oxide ($SiO_x$), a silicon oxynitride ($SiO_xN_y$), an aluminum oxide ($Al_xO_y$), or a photo resist (PR) material, and various types of organic/inorganic insulating materials.

However, the position and mutual arrangement relationship of the first and second contact electrodes CNE1 and CNE2 may be variously changed. For example, in an embodiment, as illustrated in FIG. 9C and FIG. 9D, the first and second contact electrodes CNE1 and CNE2 may be simultaneously formed or disposed on the same layer on one or a surface of the base layer BSL. Accordingly, a manufacturing process of the pixel PXL and the display device including the same may be simplified.

The first and second contact electrodes CNE1 and CNE2 may be made of various transparent conductive materials. For example, the first and second contact electrodes CNE1 and CNE2 may include at least one of various transparent conductive materials in addition to ITO, IZO, ITZO, ZnO, AZO, GZO, ZTO, GTO, and FTO, and may be implemented to be substantially transparent or transflective to satisfy a predetermined light transmittance. Accordingly, the light emitted from the light emitting elements LD through each of the first and second ends EP1 and EP2 may pass through the first and second contact electrodes CNE1 and CNE2 to be emitted to the outside of the display panel PNL.

A fourth insulation layer INS4 may be disposed on the first and second contact electrodes CNE1 and CNE2 and/or the third insulation layer INS3. For example, the fourth insulation layer INS4 may be entirely formed and/or disposed on the display area DA to cover or overlap the first and second banks BNK1 and BNK2, the first and second electrodes ELT1 and ELT2, the first, second, and/or third insulation layers INS1, INS2, and/or INS3, and the light emitting elements LD, and the first and second contact electrodes CNE1 and CNE2. The fourth insulation layer INS4 may include at least one layer of an inorganic layer and/or organic layer.

The fourth insulation layer INS4 may be formed as a single layer or as a multilayer, and may include at least one inorganic insulating material and/or organic insulating material. For example, the fourth insulation layer INS4 may include a silicon nitride (SiNx), a silicon oxide ($SiO_x$), a silicon oxynitride ($SiO_xN_y$), or an aluminum oxide ($Al_xO_y$), and various types of organic/inorganic insulating materials.

In an embodiment, the fourth insulation layer INS4 may include a thin film encapsulation layer of a multi-layered structure. For example, the fourth insulation layer INS4 may include a thin film encapsulation layer of a multi-layered structure that may include at least two inorganic insulation layers and at least one organic insulation layer interposed between the at least two inorganic insulation layers. However, the material and/or structure of the fourth insulation layer INS4 may be variously changed. For example, in an embodiment, at least one filler layer FIL and/or upper substrate may be further disposed on the fourth insulation layer INS4.

The filler layer FIL may include an epoxy- or siloxane-based filler, but is not limited thereto. The filler layer FIL may include a material having a relatively low refractive index (for example, about 1.5 to 1.6) so that the light emitted from the light emitting elements LD may be smoothly emitted in the front direction of the display panel PNL in addition to the third direction DR3.

Similarly, the first and fourth insulation layers INS1 and INS4 may also be made of a material with a relatively low refractive index, so that the light emitted from the light emitting elements LD may be more smoothly emitted in the front direction of the display panel PNL. For example, each of the first and fourth insulation layers INS1 and INS4 may include a low refractive material having a similar or same refractive index (for example, about 1.4 to 1.6) to or as that of the filler layer FIL. For example, each of the first and fourth insulation layers INS1 and INS4 may include a silicon oxide ($SiO_x$) having a refractive index of 1.52.

For example, the light emitted from the light emitting elements LD is controlled to be further directed in the front direction of the display panel PNL through refractive index matching with at least some or a number of the insulation layers and/or the filler layer FIL formed or disposed in the display layer DPL, thus the light efficiency of the pixel PXL may be improved.

The second and/or third insulation layers INS2 and INS3 may include a low refractive material having a similar or same refractive index to or as that of the first and fourth insulation layers INS1 and INS4, for example, a silicon oxide ($SiO_x$), but are not limited thereto. For example, in an embodiment, the second and third insulation layers INS2 and INS3 may be formed with a predetermined thickness or more to ensure electrical stability between the first and second end portions EP1 and EP2 of the light emitting elements LD, and they may be simultaneously etched for process simplification. For example, after the second insulation layer INS2 is entirely formed or disposed in the display area DA in which the light emitting elements LD are arranged or disposed, it may be first etched to expose the second end portion EP2 of the light emitting elements LD. Thereafter, the second insulation layer INS2 may be etched again after the third insulation layer INS3 is first formed. For example, after the third insulation layer INS3 is first entirely formed or disposed to cover or overlap the second contact electrode CNE2, the second and third insulation layers INS2 and INS3 may be simultaneously etched so that the first end portion EP1 of the light emitting elements LD is exposed.

In order to prevent damage to the light emitting elements LD disposed under or below the second and third insulation layers INS2 and INS3 while smoothly simultaneously etching the second and third insulation layers INS2 and INS3, the second and third insulation layers INS2 and INS3 may be made of a material having a good etching ratio. For example, the second and third insulation layers INS2 and INS3 may be made of the same or similar material, and for example, they may include a silicon nitride ($SiN_x$) having a good etching ratio. However, a silicon nitride ($SiN_x$) has a higher refractive index than that of a silicon oxide ($SiO_x$). Accordingly, the second and third insulation layers INS2 and INS3 may include a high refractive index material having a higher refractive index (for example, approximately 1.9) than that of the first and fourth insulation layers INS1 and INS4.

For example, the first and second contact electrodes CNE1 and CNE2 disposed on a path through which the light emitted from the light emitting elements LD may proceed may include a transparent electrode material such as ITO, and the first and second contact electrodes CNE1 and CNE2 may also have a higher refractive index (for example, about 1.95) than that of the first and fourth insulation layers INS1 and INS4.

The pixel PXL according to the above-described embodiment emits light having a desired luminance by using the light emitting elements LD as a light source. For example, a driving current corresponding to a gray to be expressed in the pixel PXL may be supplied to the light emitting elements LD by using the pixel circuit PXC. Light may be generated inside the light emitting elements LD by the driving current, and the generated light may pass through at least one electrode, the insulation layer, and/or the filler layer FIL disposed on the display layer DPL to be emitted to the outside of the pixel PXL.

In an embodiment, some of the light generated in the light emitting elements LD may be emitted in the third direction DR3 to pass through the second, third, and/or fourth insulation layers INS2, INS3, and/or INS4, the first or second contact electrodes CNE1 or CNE2, and/or the filler layer FIL, and it may be discharged in the front direction of the display panel PNL. For example, other some of the light generated by the light emitting elements LD is first emitted in the first direction DR1 from the light emitting elements LD through the first and second end portions EP1 and EP2, and it may proceed in the front direction of the display panel PNL.

For example, some of the light emitted from the first and second end portions EP1 and EP2 of the light emitting elements LD may proceed towards the first and second electrodes ELT1 and ELT2 to be reflected by the first and second electrodes ELT1 and ELT2, and, it may pass through the first insulation layer INS1, the first or second contact electrode CNE1 or CNE2, the third and/or fourth insulation layer INS3 and/or INS4, and/or the filler layer FIL to be directed in the front direction of the display panel PNL.

Other some of the light emitted from the first and second end portions EP1, and EP2 of the light emitting elements LD is not incident on the first and second electrodes ELT1 and ELT2, but it may pass through a high refractive layer such as the first or second contact electrode CNE1 or CNE2 and/or the third insulation layer INS3 and may be discharged in the front direction of the display panel PNL.

However, in this process, light loss in the pixel PXL may occur. For example, some of the light emitted from the light emitting elements LD may be lost due to light absorption by the first and second electrodes ELT1 and ELT2, and/or due to optical waveguide in a non-front direction (for example, the first or second direction DR1 or DR2) of the display panel PNL by a high refractive layer such as the first and second contact electrodes CNE1 and CNE2 and the third insulation layer INS3. For example, some of the light incident on the first and second electrodes ELT1 and ELT2 may be absorbed and lost by the first and second electrodes ELT1 and ELT2. For example, some of the light incident on a high refractive layer such as the first and second contact electrodes CNE1 and CNE2 and the third insulation layer INS3 may not be emitted to the outside of the pixel PXL while being in-plane propagated inside the high refractive layer through total reflection and the like. Accordingly, the light efficiency of the pixel PXL may be reduced.

Therefore, hereinafter, various embodiments that may improve the light efficiency of the pixel PXL by reducing or preventing the loss of the light emitted from the light emitting elements LD will be disclosed.

FIG. 11A to FIG. 11F respectively illustrate a top plan view of a pixel PXL according to an embodiment. For example, FIG. 11A to FIG. 11F illustrate modified embodiments of the pixel PXL according to an embodiment of FIG. 7A. In an embodiment, the pixel PXL according to embodiments of FIG. 11A to FIG. 11F may selectively further include the first bank BNK1 as in embodiments of FIG. 8A to FIG. 10. The first bank BNK1 may be formed in a separate or integral pattern as in embodiments of FIG. 8A and FIG. 8B, and the shape, size and/or position of the first bank BNK1 are not particularly limited. Therefore, FIG. 11A to FIG. 11F, instead of illustrating the first bank BNK1, schematically illustrate only points SP1 and SP2 at which the first and second side walls SDW1 and SDW2 of the first bank BNK1 start in the first direction DR1, and a bank area BA in which the first bank BNK1 may be formed or disposed.

Figure 11A:
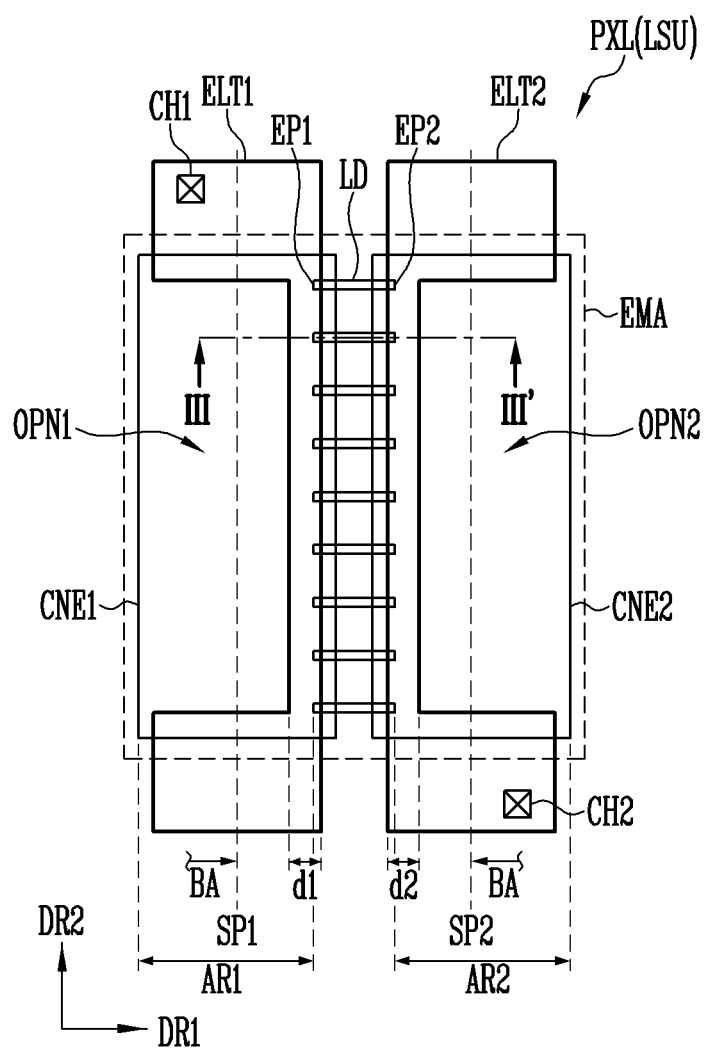
FIG. 11A to FIG. 11F respectively illustrate a top plan view of a pixel according to an embodiment.
Figure 12A:
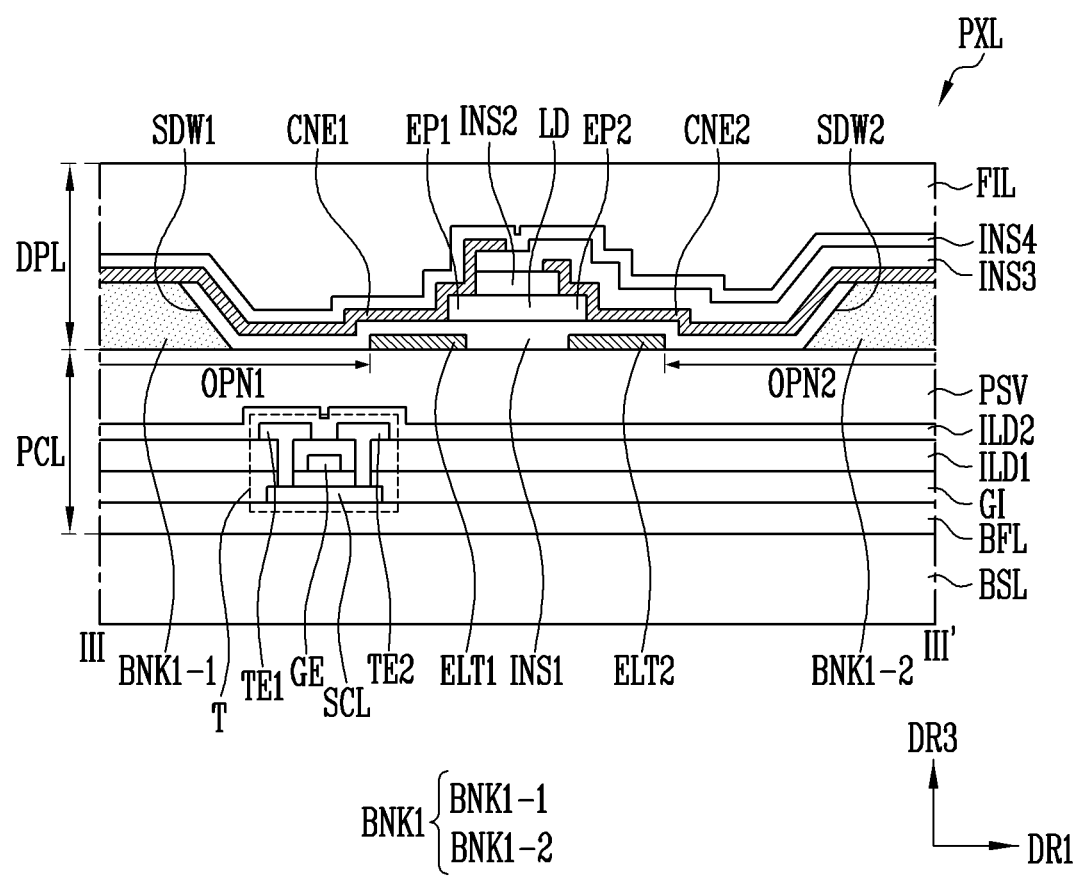
FIG. 12A and FIG. 12B respectively illustrate a schematic cross-sectional view of a pixel according to an embodiment.
Figure 12B:
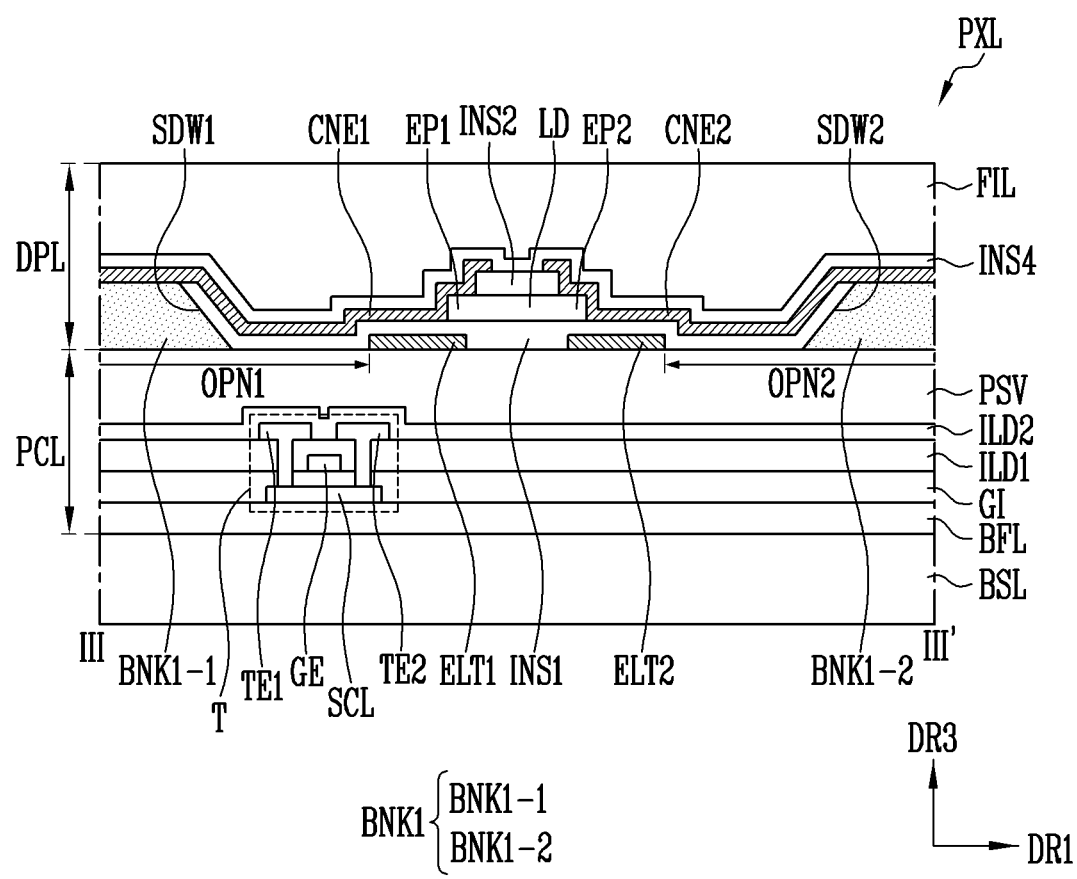

FIG. 12A and FIG. 12B respectively illustrate a schematic cross-sectional view of a pixel PXL according to an embodiment. For example, FIG. 12A and FIG. 12B illustrate different embodiments of a cross-section of the pixel PXL taken along line III-III' of FIG. 11A. For example, FIG. 12A illustrates an embodiment in which the first and second contact electrodes CNE1 and CNE2 are formed in different processes as in an embodiment of FIG. 9A and the third insulation layer INS3 is interposed between the first and second contact electrodes CNE1 and CNE2. FIG. 12B illustrates an embodiment in which the first and second contact electrodes CNE1 and CNE2 are formed or disposed on the same layer as in an embodiment of FIG. 9C. In a case that first and second contact electrodes CNE1 and CNE2 are formed or disposed on the same layer, the first and second contact electrodes CNE1 and CNE2 may be simultaneously or sequentially formed or disposed.

In embodiments of FIG. 11A and FIG. 12B, the same reference numerals are denoted to similar or identical constituent elements (for example, constituent elements corresponding to each other) as embodiments described above, and detailed descriptions thereof will be omitted.

Referring to FIG. 11A to FIG. 12B, on a path through which the light emitted from the light emitting elements LD may pass, an opening may be formed in at least one of the first and second electrodes ELT1 and ELT2 and the first and second contact electrodes CNE1 and CNE2 of the pixel PXL. For example, the pixel PXL may include a first opening OPN1 formed in a first area AR1 adjacent to the first end portions EP1 of the light emitting elements LD, and a second opening OPN2 formed in a second area AR2 adjacent to the second end portions EP2 of the light emitting elements LD. In embodiments of FIG. 11A to FIG. 12B, the first opening OPN1 and the second opening OPN2 may be formed in the first electrode ELT1 and the second electrode ELT2, respectively.

The first area AR1 is an area adjacent to the first end portions EP1 of the light emitting elements LD, and may comprehensively mean an area in which an opening may be formed in the first electrode ELT1 and/or first contact electrode CNE1 at one or a side of the light emitting elements LD. For example, the first area AR1 may comprehensively mean an area in which the first electrode ELT1 and/or first contact electrode CNE1 are formed from the first end portions EP1 of the light emitting elements LD, in the first direction DR1.

Similarly, the second area AR2 is an area adjacent to the second end portions EP2 of the light emitting elements LD, and may comprehensively mean an area in which an opening may be formed in the second electrode ELT2 and/or second contact electrode CNE2 at the other or another side of the light emitting elements LD. For example, the second area AR2 may comprehensively mean an area in which the second electrode ELT2 and/or second contact electrode CNE2 are formed from the second end portions EP2 of the light emitting elements LD, in the first direction DR1.

In an embodiment, the first opening OPN1 and the second opening OPN2 may have shapes that may be symmetrical or substantially symmetrical to each other, and may have substantially the same or similar size to each other. For example, the first opening OPN1 and the second opening OPN2 may have or may be formed of the same shape and/or size. For example, the first opening OPN1 and the second opening OPN2 may have shapes that may be symmetrical or substantially symmetrical to each other based on an area in which the light emitting elements LD may be disposed.

In an embodiment, the first opening OPN1 and the second opening OPN2 may be spaced apart from the light emitting elements LD by a substantially equivalent or similar distance. For example, the first opening OPN1 may be separated by a first distance d1 from one or a side of first electrode ELT1 facing the second electrode ELT2, and the second opening OPN2 may be separated by a second distance d2 from one or a side of the second electrode ELT2 facing the first electrode ELT1. The second distance d2 may be substantially the same as the first distance d1. Here, "substantially the same" may mean that they are similar or the same within a predetermined error range (for example, a permissible error range in a process).

The shape, size, and/or position of the first and second openings OPN1 and OPN2 may be variously changed according to embodiments. For example, as illustrated in FIG. 11A, the first and second openings OPN1 and OPN2 may be formed to have a shape in which one or an area of each of the first and second electrodes ELT1 and ELT2 disposed in an opposite direction of the light emitting elements LD may be opened or eliminated so that a groove may be formed in each of the first and second electrodes ELT1 and ELT2.

For example, in a pixel PXL in which the first electrode ELT1 is disposed at a left or a side of the light emitting elements LD and the second electrode ELT2 is disposed at a right or another side of the light emitting elements LD, a left or an area of the first electrode ELT1 is opened to form the opening OPN1, and a right or another area of the second electrode ELT2 is opened to form the second opening OPN2. For example, the second electrode ELT2 may have a right-open or other open second opening OPN2 such as a "⊐" or substantially "C" shape and may have a shape back-facing the light emitting elements LD, and the first electrode ELT1 may have a left-open or other open first opening OPN1 that may be symmetrical or substantially symmetrical to the second electrode ELT2 and may have a shape back-facing the light emitting elements LD.

In an embodiment, the first and second openings OPN1 and OPN2 may be positioned inside the first and second electrodes ELT1 and ELT2, respectively, as illustrated in FIG. 11B to FIG. 11F. For example, when viewed in a plan view, the first opening OPN1 may be positioned inside the first electrode ELT1 and the first contact electrode CNE1, and the second opening OPN2 may be positioned inside the second electrode ELT2 and the second contact electrode CNE2.

In an embodiment, the second opening OPN2 may have substantially the same shape and/or size as that of the first opening OPN1. For example, in order to uniformly guide the light emitted from the first and second end portions EP1 and EP2 of the light emitting elements LD in the front direction of the display panel PNL, the first and second openings OPN1 and OPN2 may be formed to have substantially the same size and shape, and the first and second openings OPN1 and OPN2 may be formed at positions symmetrical substantially symmetrical to each other around an area in which the light emitting elements LD may be disposed. However, the disclosure is not limited thereto. For example, in an embodiment, in a case that amounts of the light emitted from the first and second end portions EP1 and EP2 of the light emitting elements LD are different, it is possible to uniformly match them, or for other purposes, the first and second openings OPN1 and OPN2 may be formed to have different shapes and/or sizes, or the first and second openings OPN1 and OPN2 may be formed or disposed at asymmetrical positions. For example, in an embodiment, only one of the first and second openings OPN1 and OPN2 may be selectively formed.

Figure 11B:
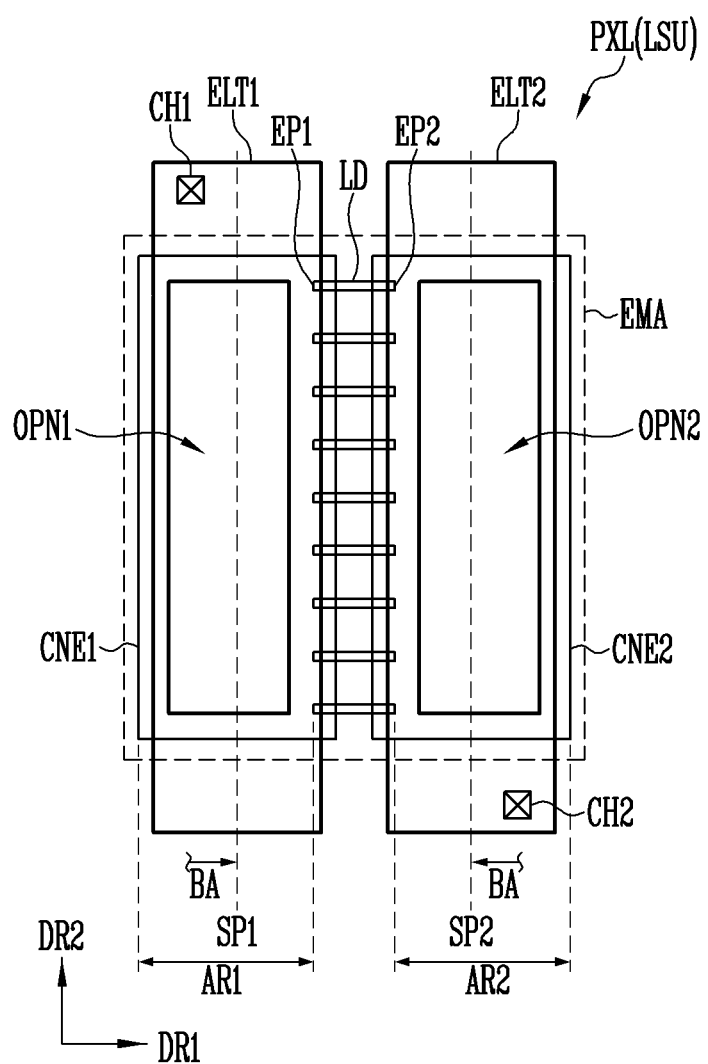
Figure 11C:
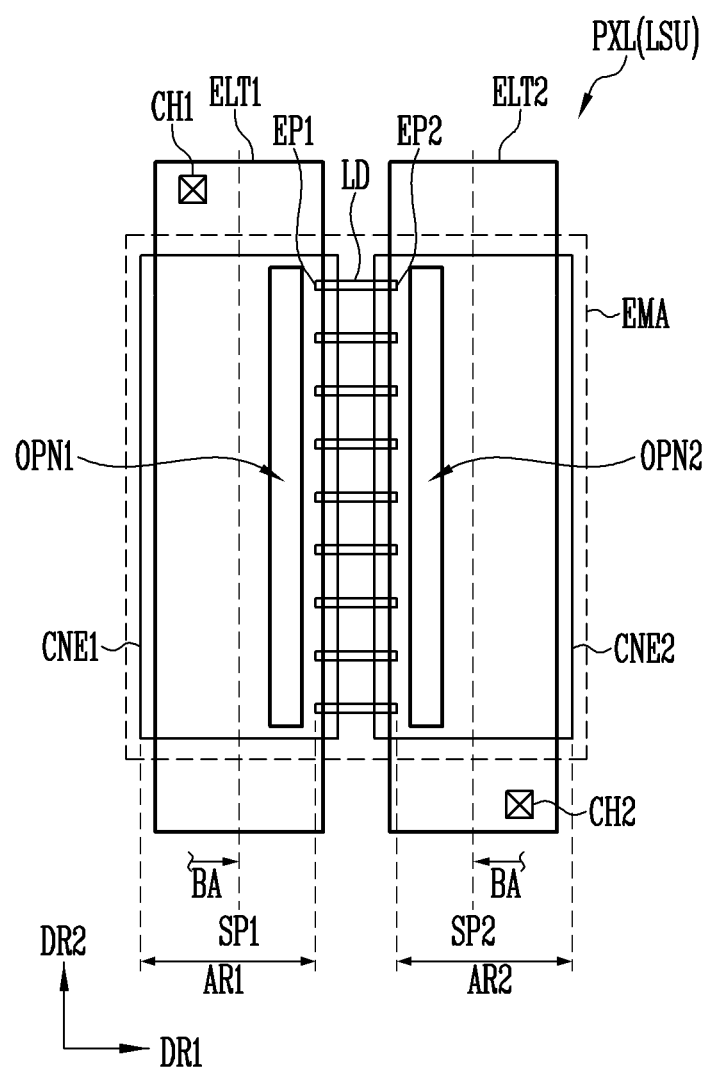
Figure 11D:
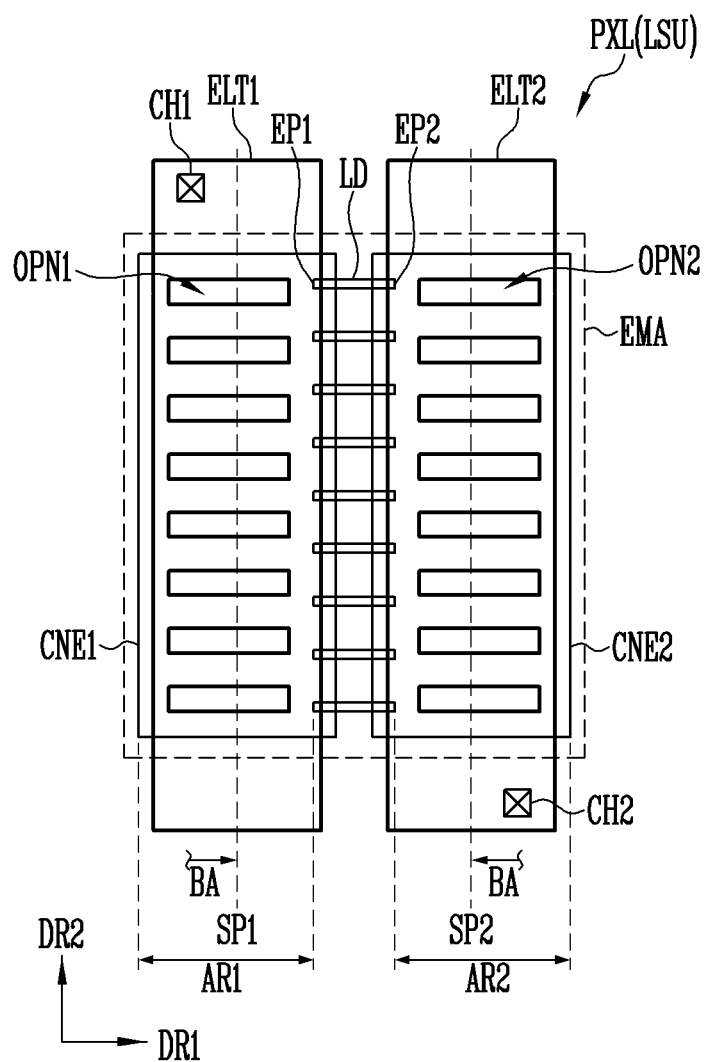
Figure 11E:
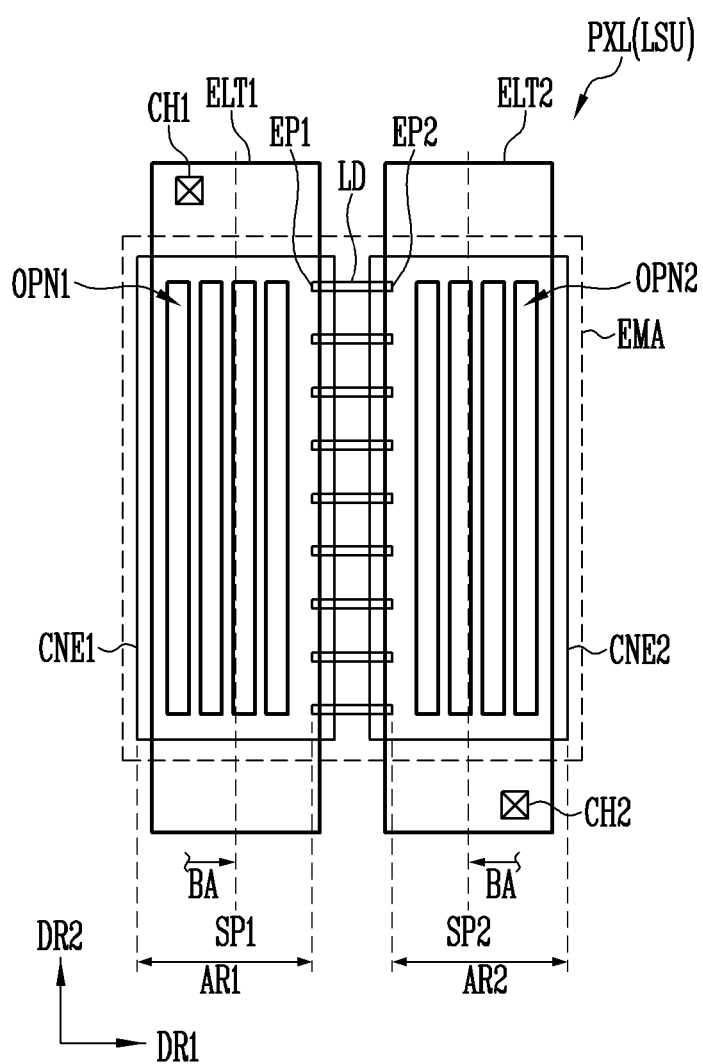
Figure 11F:
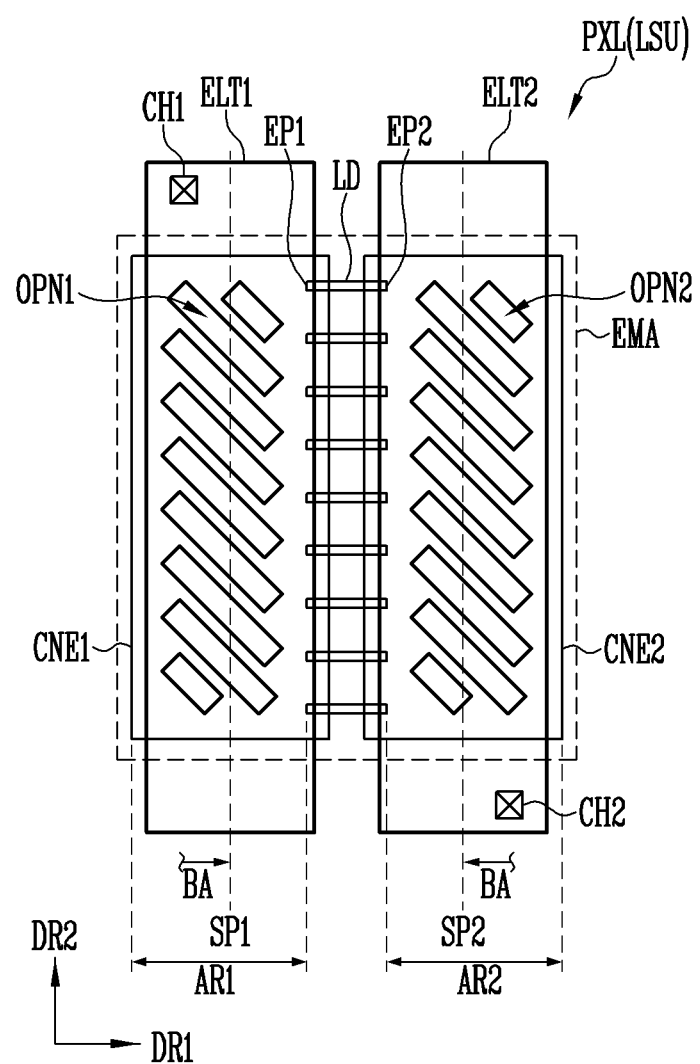

Each of the first and second openings OPN1 and OPN2 may be formed as a single opening, or may be formed of a plurality of openings. For example, as illustrated in FIG. 11A to FIG. 11C, a single first opening OPN1 may be disposed in the first area AR1, and a single second opening OPN2 may be disposed in the second area AR2. For example, as illustrated in FIG. 11D to FIG. 11F, a plurality of first openings OPN1 may be arranged or disposed or formed in the first area AR1, and a plurality of second openings OPN2 may be arranged or disposed or formed in the second area AR2.

In a case that the plurality of first openings OPN1 and second openings OPN2 are arranged or disposed in the first area AR1 and the second area AR2, respectively, respective shapes and/or sizes and arrangement directions of the first openings OPN1 and second openings OPN2 may be variously changed according to embodiments. For example, the first openings OPN1 may have shapes that substantially extend in a horizontal direction (for example, the first direction DR1) as illustrated in FIG. 11D, substantially extend in a vertical direction (for example, the second direction DR2) as illustrated in FIG. 11E, or substantially extend in a diagonal direction (for example, a direction crossing or intersecting the first direction DR1 and the second direction DR2 in a plan view) as illustrated in FIG. 11F, in the first area AR1. As an example, each of the first openings OPN1 may have a substantially bar-like shape of a substantially rectangular shape, but is not limited thereto. Similarly, the second openings OPN2 may have shapes (for example, substantially bar-like shapes of a substantially rectangular shape) that extend substantially in the horizontal direction, substantially the vertical direction, or substantially the diagonal direction, respectively, in the second area AR2.

Further, the shapes of the first and second openings OPN1 and OPN2 may be variously changed. For example, each of the first and second openings OPN1 and OPN2 may have various shapes such as a substantially polygonal shape, a substantially circular shape, or a substantially elliptical shape. For example, the first openings OPN1 may be regularly arranged or disposed or formed along a predetermined direction, or may be irregularly distributed, in the first area AR1. Similarly, the second openings OPN2 may be regularly arranged or disposed or formed along a predetermined direction, or may be irregularly distributed, in the second area AR2. For example, the first openings OPN1 and the second openings OPN2 may have the same pattern, direction, and/or arrangement form, or may have different patterns, directions, and/or arrangement forms.

In the above-described embodiments, the sizes and positions of the first and second openings OPN1 and OPN2 may be variously changed. For example, at the positions at which the light emitting elements LD should be aligned, the first and second electrodes ELT1 and ELT2 may be formed to have a line width sufficient to form an electric field required for self-alignment of the light emitting elements LD, and they be opened in other areas. For example, at the positions to be electrically connected to the first and second contact electrodes CNE1 and CNE2, the first and second electrodes ELT1 and ELT2 may be formed to have a line width that may be necessary for the electrical connection with the first and second contact electrodes CNE1 and CNE2, and they may be opened in other areas.

In an embodiment, in a case that the pixel PXL may include the first bank BNK1 disposed under or below the first and second electrodes ELT1 and ELT2, the first and second openings OPN1 and OPN2 may be at least disposed between the light emitting elements LD and the first bank BNK1. For example, the first and second openings OPN1 and OPN2 may be formed in the first and second electrodes ELT1 and ELT2 at positions adjacent to (or, directly adjacent to) the first and second end portions EP1 and EP2 of the light emitting elements LD. Accordingly, it is possible to effectively reduce or prevent the light emitted from the first and second end portions EP1 and EP2 of the light emitting elements LD from being absorbed by the first and second electrodes ELT1 and ELT2.

For example, the first and second openings OPN1 and OPN2 may selectively overlap the first bank BNK1. For example, as illustrated in FIG. 11A, FIG. 11B, and FIG. 11D to FIG. 11F, the first and second openings OPN1 and OPN2 may respectively extend from an area between the bank area BA in which the first bank BNK1 is disposed and the light emitting elements LD to an area overlapping the bank area BA, in the first area AR1 and the second area AR2. By opening the first and second electrodes ELT1 and ELT2 by a wider area, the amount of light absorbed by the first and second electrodes ELT1 and ELT2 may be effectively reduced.

In an embodiment, as illustrated in FIG. 11C, the first and second openings OPN1 and OPN2 may be respectively disposed in an area between the bank area BA in which the first bank BNK1 is disposed and the light emitting elements LD, in the first area AR1 and second area AR2, and they may be formed with a narrow width not to overlap the first bank BNK1. By a reflective partition wall formed by the first and second side walls SDW1 and SDW2 of the first bank BNK1 and the first and second electrodes ELT1 and ELT2 thereon, it is possible to increase a ratio of light reflected to be directed in the front direction of the display panel PNL with respect to the light emitted from the light emitting elements LD.

For example, in consideration of the structure of the pixel PXL, light characteristics, and/or process conditions, the first and second openings OPN1 and OPN2 may be formed to overlap or to not overlap the first bank BNK1. For example, as in an embodiment of FIG. 7D, in a case that the pixel PXL further may include at least one middle electrode IET, an opening may be selectively formed in the middle electrode IET.

In a case that the first and second openings OPN1 and OPN2 are formed in the first and second electrodes ELT1 and ELT2, the first and second electrodes ELT1 and ELT2 may be respectively electrically connected to the first and second contact electrodes CNE1 and CNE2 in an area in which the first and second openings OPN1 and OPN2 may not be formed. For example, the first electrode ELT1 and the first contact electrode CNE1 may be electrically connected to each other at an outer periphery of the first opening OPN1 (for example, an edge area of the first contact electrode CNE1), and the second electrode ELT2 and the second contact electrode CNE2 may be electrically connected to each other at an outer periphery of the second opening OPN2 (for example, an edge area of the second contact electrode CNE2).

According to embodiments described above, by forming the first and second openings OPN1 and OPN2 in the first and second electrodes ELT1 and ELT2 on a path through which the light emitted from the light emitting elements LD may pass, it is possible to reduce or prevent absorption of light by the first and second electrodes ELT1 and ELT2. Therefore, the light efficiency may be improved by reducing the light loss of the pixel PXL.

FIG. 13A to FIG. 13F respectively illustrate a top plan view of a pixel PXL according to an embodiment. For example, FIG. 13A to FIG. 13F illustrate modified embodiments of the pixel PXL according to embodiments of FIG. 11A to FIG. 11F.

Figure 13C:
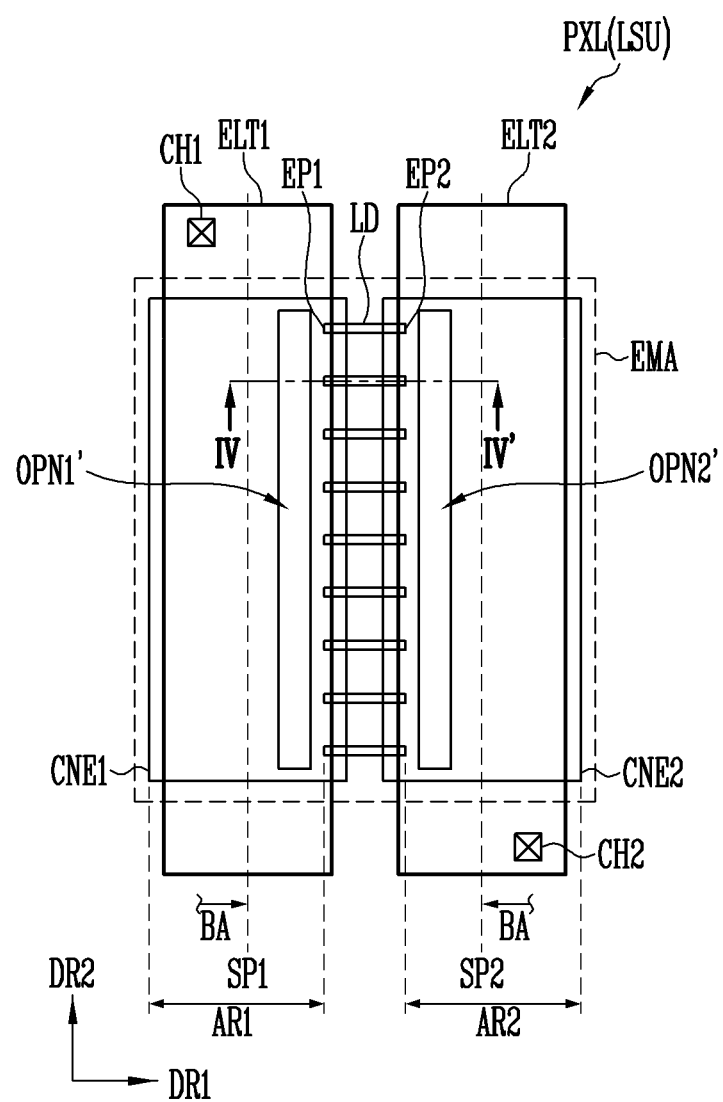
Figure 14A:
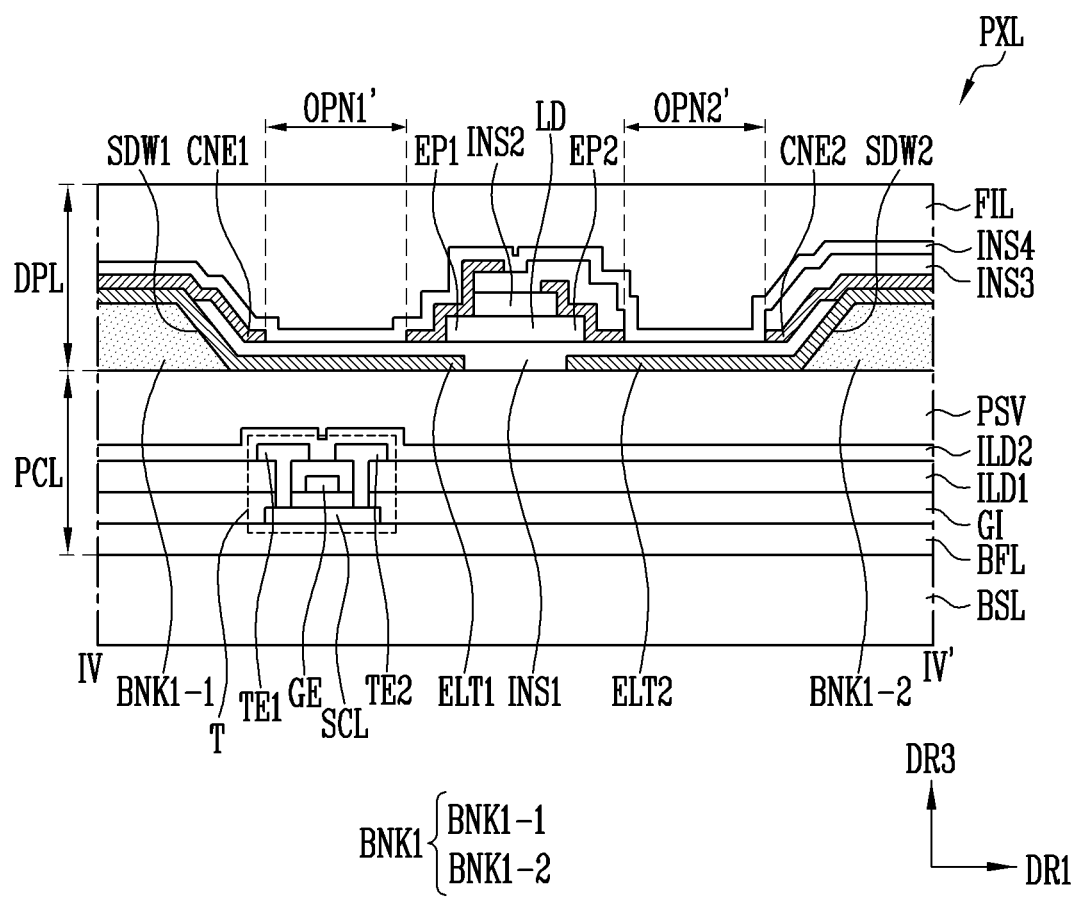
FIG. 14A and FIG. 14B respectively illustrate a schematic cross-sectional view of a pixel according to an embodiment.
Figure 14B:
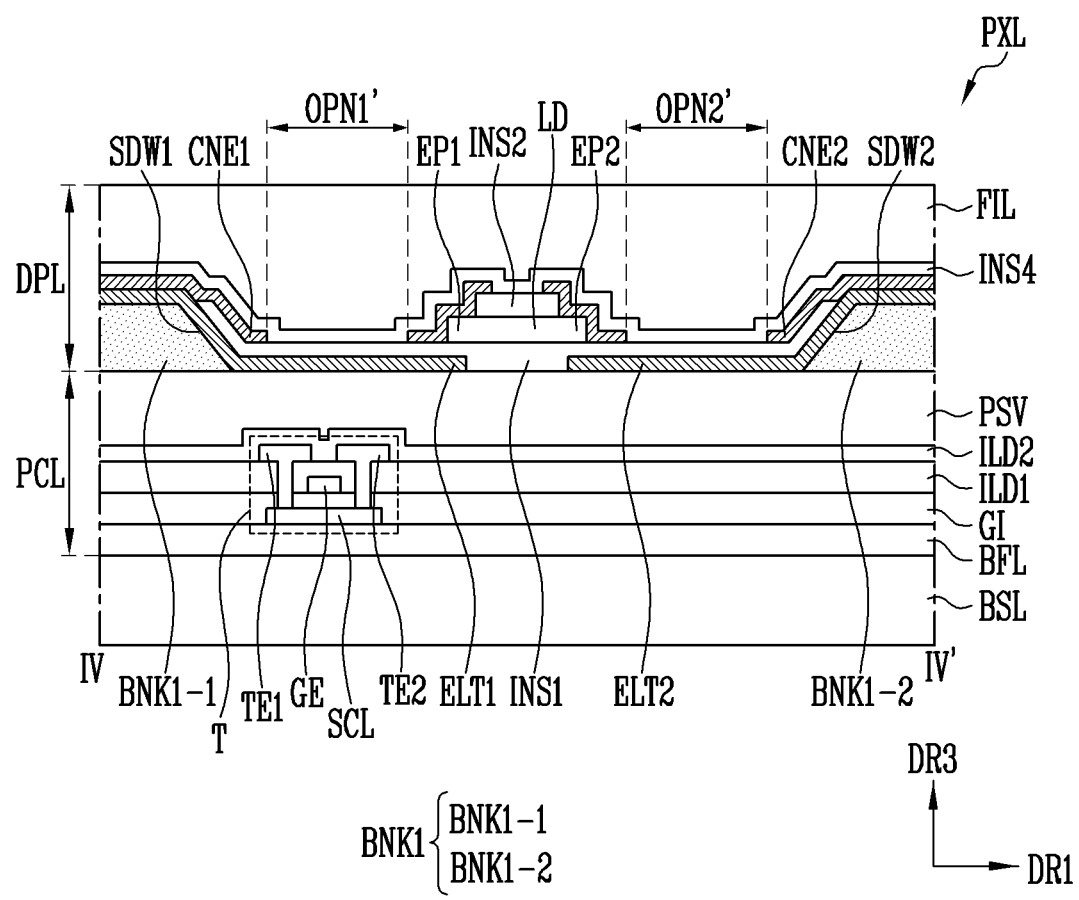

FIG. 14A and FIG. 14B respectively illustrate a schematic cross-sectional view of a pixel PXL according to an embodiment. For example, FIG. 14A and FIG. 14B illustrate different embodiments of a cross-section of the pixel PXL taken along line IV-IV' of FIG. 13C. For example, FIG. 14A illustrates an embodiment in which the first and second contact electrodes CNE1 and CNE2 are formed in different processes and the third insulation layer INS3 is interposed between the first and second contact electrodes CNE1 and CNE2. FIG. 14B illustrates an embodiment in which the first and second contact electrodes CNE1 and CNE2 are formed or disposed on the same layer.

In embodiments of FIG. 13A to FIG. 14B, detailed descriptions of similar or same configurations as those of the above-described embodiments (for example, embodiments of FIG. 11A to FIG. 12B) will be omitted.

Referring to FIG. 13A to FIG. 14B, the pixel PXL may include a first opening OPN1' formed in the first area AR1 adjacent to the first end portions EP1 of the light emitting elements LD, and a second opening OPN2' formed in the second area AR2 adjacent to the second end portions EP2 of the light emitting elements LD. In an embodiments of FIG. 13A to FIG. 14B, the first opening OPN1' and the second opening OPN2' may be formed in the first contact electrode CNE1 and the second contact electrode CNE2, respectively.

The first opening OPN1' and the second opening OPN2' may have shapes that are symmetrical or substantially symmetrical to each other, and may have substantially the same or similar size to each other. For example, the, the first opening OPN1' and the second opening OPN2' may have the same shape and/or size, and may have shapes that are symmetrical or substantially symmetrical to each other based on an area in which the light emitting elements LD are disposed. For example, the first opening OPN1' and the second opening OPN2' may be spaced apart from the light emitting elements LD by a substantially equivalent or similar distance.

Figure 13A:
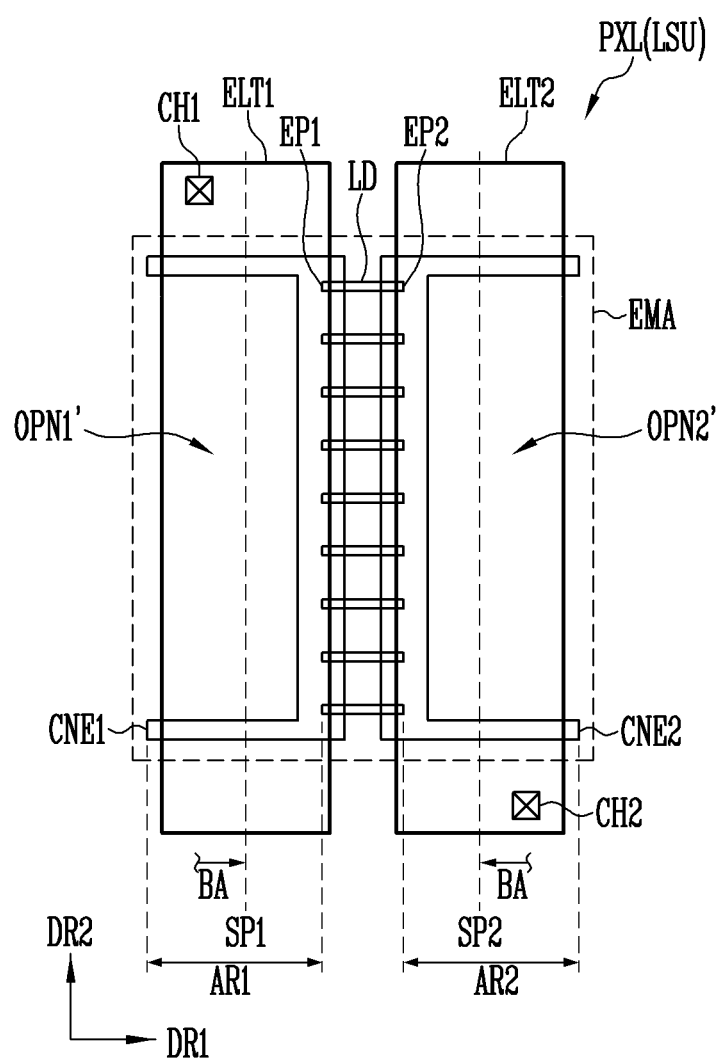
FIG. 13A to FIG. 13F respectively illustrate a top plan view of a pixel according to an embodiment.

The shape, size, and/or position of the first opening OPN1' and the second opening OPN2' may be variously changed. For example, as illustrated in FIG. 13A, the first and second openings OPN1' and OPN2' may be formed to have a shape in which one or an area of each of the first and second contact electrodes CNE1 and CNE2 disposed in an opposite direction of the light emitting elements LD is opened or eliminated so that a groove may be formed in each of the first and second contact electrodes CNE1 and CNE2.

For example, in a pixel PXL in which the first contact electrode CNE1 is disposed at a left or a side of the light emitting elements LD and the second contact electrode CNE2 is disposed at a right or a side of the light emitting elements LD, a left or an area of the first contact electrode CNE1 is opened to form the opening OPN1, and a right or another area of the second contact electrode CNE2 is opened to form the second opening OPN2. For example, the second contact electrode CNE2 may have a right-open or other open second opening OPN2' such as a "E" or substantially "C" shape and may have a shape back-facing the light emitting elements LD, and the first contact electrode CNE1 may have a left-open or other open first opening OPN1' that may be symmetrical or substantially symmetrical to the second contact electrode CNE2 and may have a shape back-facing the light emitting elements LD.

In an embodiment, the first and second openings OPN1' and OPN2' may be positioned inside the first and second contact electrodes CNE1 and CNE2, respectively, as illustrated in FIG. 13B to FIG. 13F. For example, when viewed in a plan view, the first opening OPN1' may be positioned inside the first electrode ELT1 and the first contact electrode CNE1, and the second opening OPN2' may be positioned inside the second electrode ELT2 and the second contact electrode CNE2.

In an embodiment, the first and second openings OPN1' and OPN2' may have a substantially equivalent size and/or shape, but are not limited thereto. For example, the first and second openings OPN1' and OPN2' may be formed at positions symmetrical to each other, but are not limited thereto. For example, in an embodiment, only one of the first and second openings OPN1' and OPN2' may be formed.

Figure 13B:
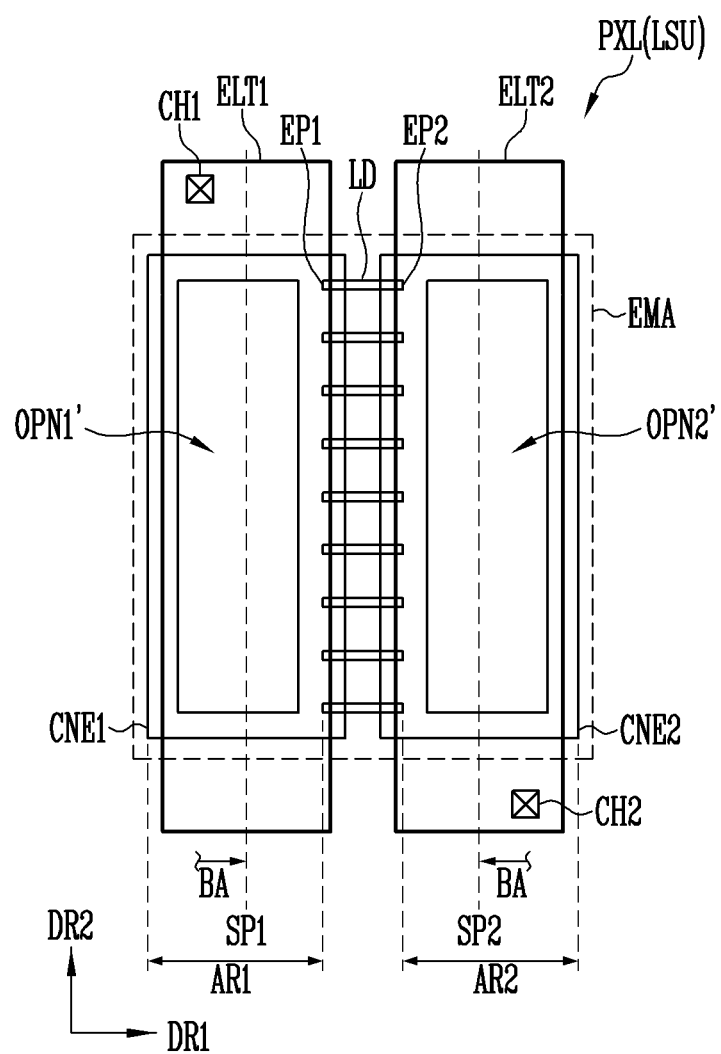
Figure 13D:
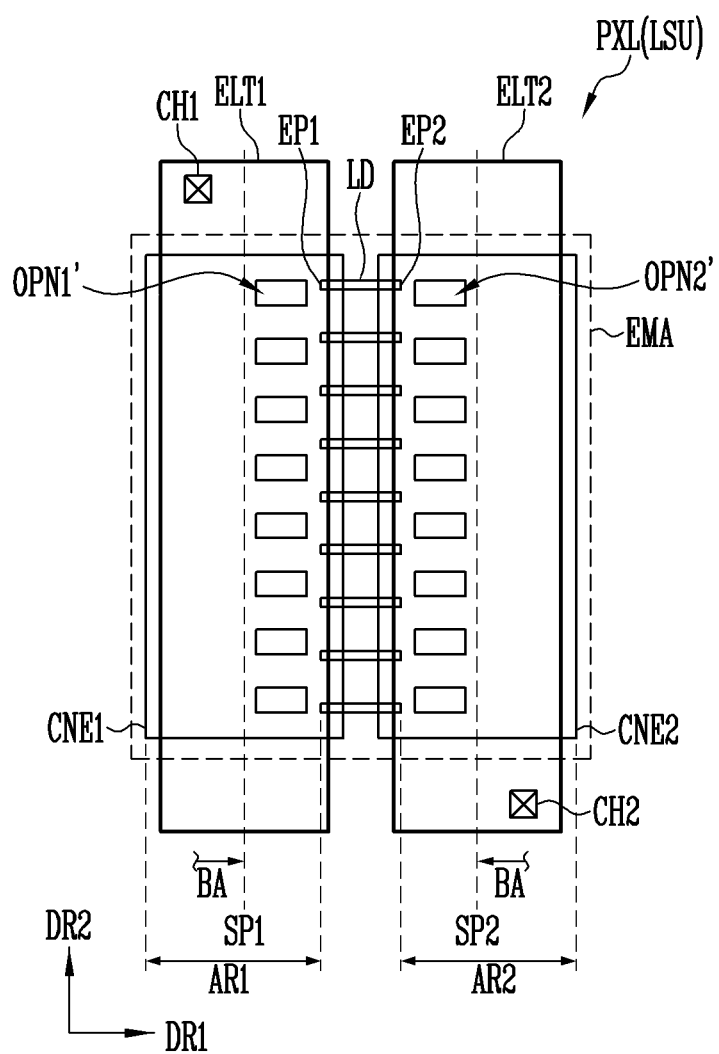
Figure 13E:
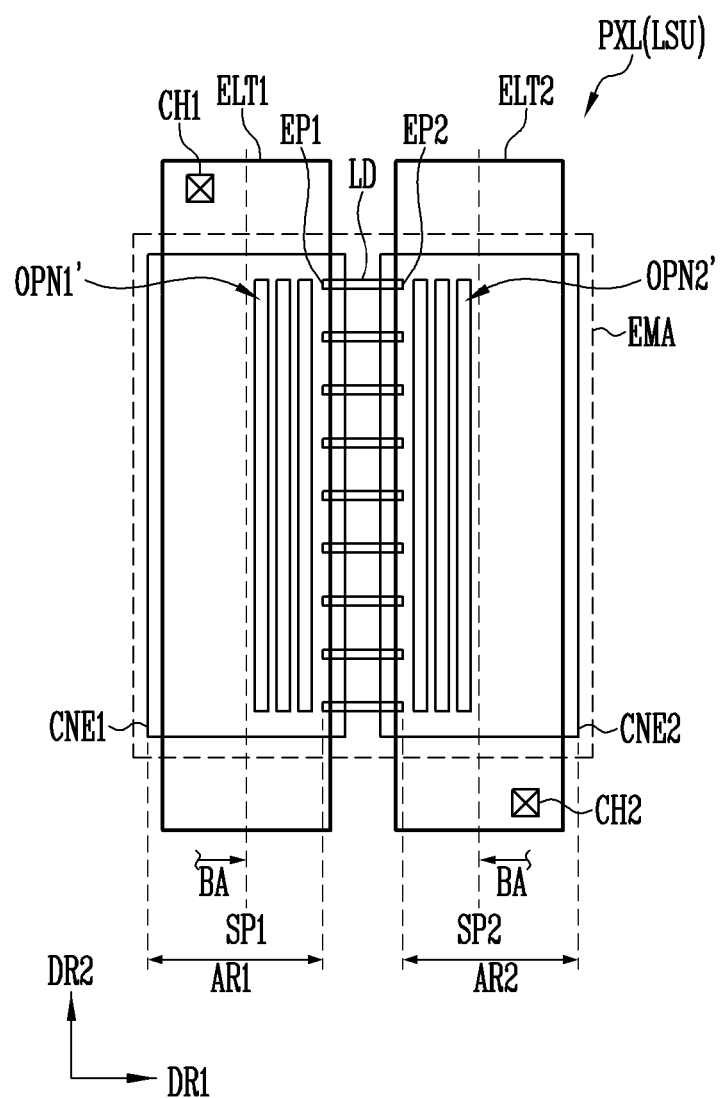
Figure 13F:
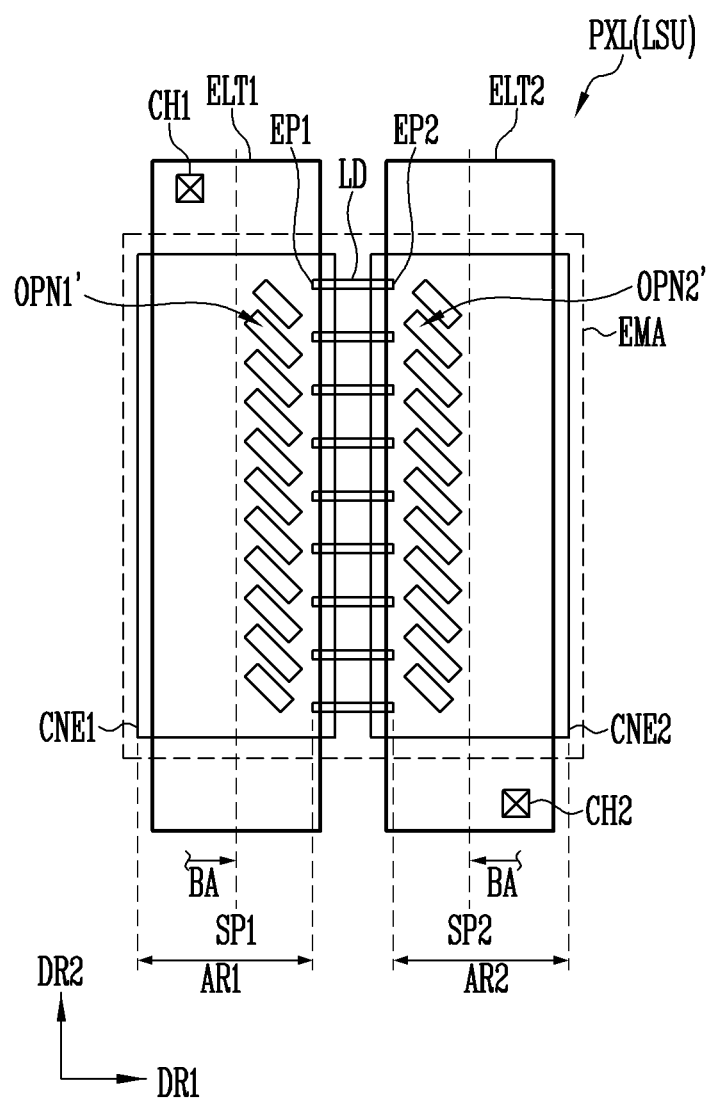

Each of the first and second openings OPN1' and OPN2' may be formed as a single opening, or may be formed of a plurality of openings. For example, as illustrated in FIG. 13A to FIG. 13C, a single first opening OPN1' may be disposed in the first area AR1, and a single second opening OPN2' may be disposed in the second area AR2. For example, as illustrated in FIG. 13D to FIG. 13F, a plurality of first openings OPN1' may be arranged or disposed or formed in the first area AR1, and a plurality of second openings OPN2' may be arranged or disposed or formed in the second area AR2.

In a case that the plurality of first openings OPN1' and second openings OPN2' are arranged or disposed or formed in the first area AR1 and the second area AR2, respectively, respective shapes and/or sizes and arrangement directions of the first openings OPN1' and the second openings OPN2' may be variously changed according to embodiments. For example, the first openings OPN1' may have shapes that extend substantially horizontally, or substantially vertically, or substantially diagonally in the first area AR1, respectively, and the second openings OPN2' may have shapes that extend substantially horizontally, or substantially vertically, or substantially diagonally in the second area AR2, as illustrated in FIG. 13D, FIG. 13E and FIG. 13F.

For example, the shapes of the first and second openings OPN1' and OPN2' may be variously changed, and for example, each of the first and second openings OPN1' and OPN2' may have various shapes such as a substantially polygonal shape, a substantially circular shape, or a substantially elliptical shape. For example, the first openings OPN1' may be regularly arranged or disposed or formed along a predetermined direction, or may be irregularly distributed, in the first area AR1. Similarly, the second openings OPN2' may be regularly arranged or disposed or formed along a predetermined direction, or may be irregularly distributed, in the second area AR2. For example, the first openings OPN1' and the second openings OPN2' may have the same pattern, direction, and/or arrangement form, or may have different patterns, directions, and/or arrangement forms.

Further, the sizes and positions of the first and second openings OPN1' and OPN2' may be variously changed. For example, at the positions to be electrically connected to the light emitting elements LD and the first and second electrodes ELT1 and ELT2, the first and second contact electrodes CNE1 and CNE2 may be formed or disposed to have a line width that may be necessary for the electrical connection with the light emitting elements LD and the first and second electrodes ELT1 and ELT2, and they may be opened in other areas.

In an embodiment, in a case that the pixel PXL may include the first bank BNK1 disposed under or below the first and second electrodes ELT1 and ELT2, the first and second openings OPN1' and OPN2' may be at least disposed between the light emitting elements LD and the first bank BNK1. For example, the first and second openings OPN1' and OPN2' may be formed in the first and second contact electrodes CNE1 and CNE2 at positions (for example, directly) adjacent to the first and second end portions EP1 and EP2 of the light emitting elements LD. Accordingly, it is possible to effectively reduce or prevent the light emitted from the first and second end portions EP1 and EP2 of the light emitting elements LD from in-plane propagating in the second direction DR2 inside the first and second contact electrodes CNE1 and CNE2.

In a case that the first and second openings OPN1' and OPN2' are formed in the first and second contact electrodes CNE1 and CNE2, the first and second contact electrodes CNE1 and CNE2 may be respectively electrically connected to the first and second electrodes ELT1 and ELT2 in an area in which the first and second openings OPN1' and OPN2' may not be formed.

The first and second openings OPN1' and OPN2' may selectively overlap the first bank BNK1. For example, as illustrated in FIG. 13A and FIG. 13B, the first and second openings OPN1' and OPN2' may respectively extend from an area between the bank area BA in which the first bank BNK1 is disposed and the light emitting elements LD to an area overlapping the bank area BA, in the first area AR1 and the second area AR2. By opening the first and second contact electrodes CNE1 and CNE2 by a wider area, the amount of light propagating inside the first and second contact electrodes CNE1 and CNE2 may be effectively reduced.

In an embodiment, as illustrated in FIG. 13C to FIG. 13F, the first and second openings OPN1' and OPN2' may be respectively disposed in an area between the bank area BA in which the first bank BNK1 may be disposed and the light emitting elements LD, in the first area AR1 and second area AR2, and they may be formed with a narrow width not to overlap the first bank BNK1. An increase in resistance of the first and second contact electrodes CNE1 and CNE2 due to the formation of first and second openings OPN1' and OPN2' may be minimized, and a sufficient area of a connecting portion for electrically connecting the first and second electrodes ELT1 and ELT2 and the first and second contact electrodes CNE1 and CNE2 may be secured.

For example, in order to reduce a path through which light propagates inside the first and second contact electrodes CNE1 and CNE2, it may be advantageous to open the first and second contact electrodes CNE1 and CNE2 wider, however, in consideration of an increase in resistance of the first and second contact electrodes CNE1 and CNE2 or a connection problem with the first and second electrodes ELT1 and ELT2, the first and second openings OPN1' and OPN2' may be determined. For example, as in an embodiment of FIG. 7D, in a case that the pixel PXL further may include the third contact electrode CNE3 and the like, an opening may be selectively formed or disposed in the third contact electrode CNE3.

In a case that the third insulation layer INS3 may be formed or disposed on the second contact electrode CNE2 as in an embodiment of FIG. 14A, the third insulation layer INS3 may be opened together with the second contact electrode CNE2. For example, the third insulation layer INS3 may also be opened in the second area AR2. The second opening OPN2' may include an opening formed in each of the second contact electrode CNE2 and the third insulation layer INS3. In an embodiment, the second opening OPN2' of the same size and/or position may be formed in each of the second contact electrode CNE2 and the third insulation layer INS3, but the disclosure is not limited thereto.

An area in which the first and second contact electrodes CNE1 and CNE2 and/or the third insulation layer INS3 are opened (for example, the first and second openings OPN1' and OPN2') may be filled with a material having a lower refractive index than that of the first and second contact electrodes CNE1 and CNE2 and/or the third insulation layer INS3, for example, the fourth insulation layer INS4 and/or the filler layer FIL. Accordingly, a ratio of light emitted to the outside of the pixel PXL may be increased.

On the other hand, in the case of the second insulation layer INS2 that may be simultaneously etched together with the third insulation layer INS3, it may include the same high refractive material as that of the third insulation layer INS3 (for example, a material having a greater refractive index than those of the first and fourth insulation layers INS1 and INS4). However, in the case of the second insulation layer INS2, it is locally disposed only on the remaining area excluding the first and second end portions EP1 and EP2 of the light emitting elements LD, and for example, it may not be disposed in the first and second areas AR1 and AR2. Therefore, by the second insulation layer INS2, light loss due to in-plane light propagation as in the third insulation layer INS3 may not occur as much.

For example, as described above, the first and fourth insulation layers INS1 and INS4 and the filler layer FIL may be made of a low refractive material for refractive index matching. For example, the first and fourth insulation layers INS1 and INS4 and the filler layer FIL may have a smaller refractive index than those of the first and second electrodes ELT1 and ELT2, the first and second contact electrodes CNE1 and CNE2, and/or the second and third insulation layers INS2 and INS3.

According to the above-described embodiment, by forming the first and second openings OPN1' and OPN2' in a high refractive layer (for example, the first and second contact electrodes CNE1 and CNE2 and/or the third insulation layer INS3) that may serve as a path for in-plane light propagation on a path through which the light emitted from the light emitting elements LD may pass, it is possible to reduce or prevent optical waveguide in a non-front direction of the display panel PNL due to the high refractive layer. For example, by at least partially opening the high refractive layer in the first area AR1 and the second area AR2, it is possible to reduce the amount of light that may be trapped in the optical waveguide formed by the high refractive layer and not emitted to the outside of the pixels PXL. Therefore, the light efficiency may be improved by reducing the light loss of the pixel PXL.

Figure 15B:
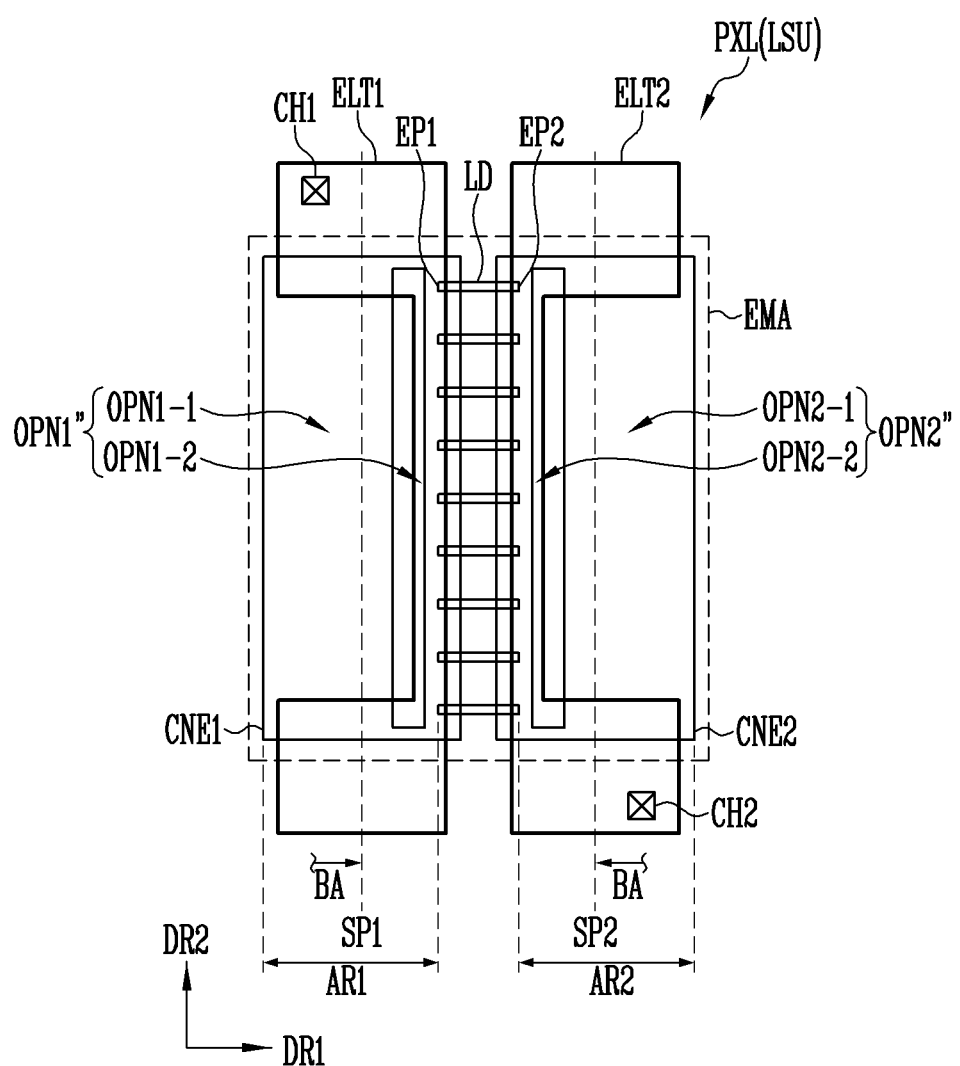

FIG. 15A and FIG. 15B respectively illustrate a top plan view of a pixel PXL according to an embodiment. For example, FIG. 15A and FIG. 15B illustrate modified embodiments of the pixel PXL by a combination of embodiments of FIG. 11A to FIG. 11F and embodiments of FIG. 13A to FIG. 13F.

Figure 16A:
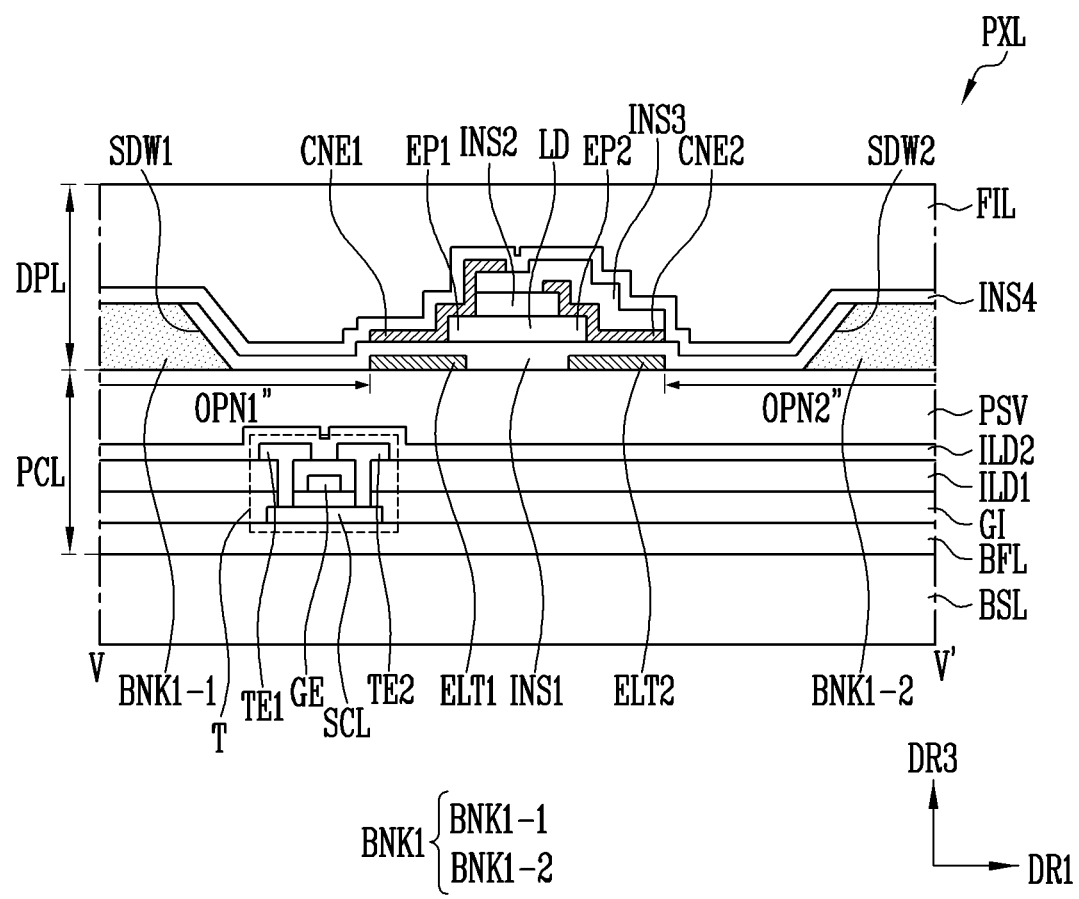
FIG. 16A and FIG. 16B respectively illustrate a schematic cross-sectional view of a pixel according to an embodiment.
Figure 16B:
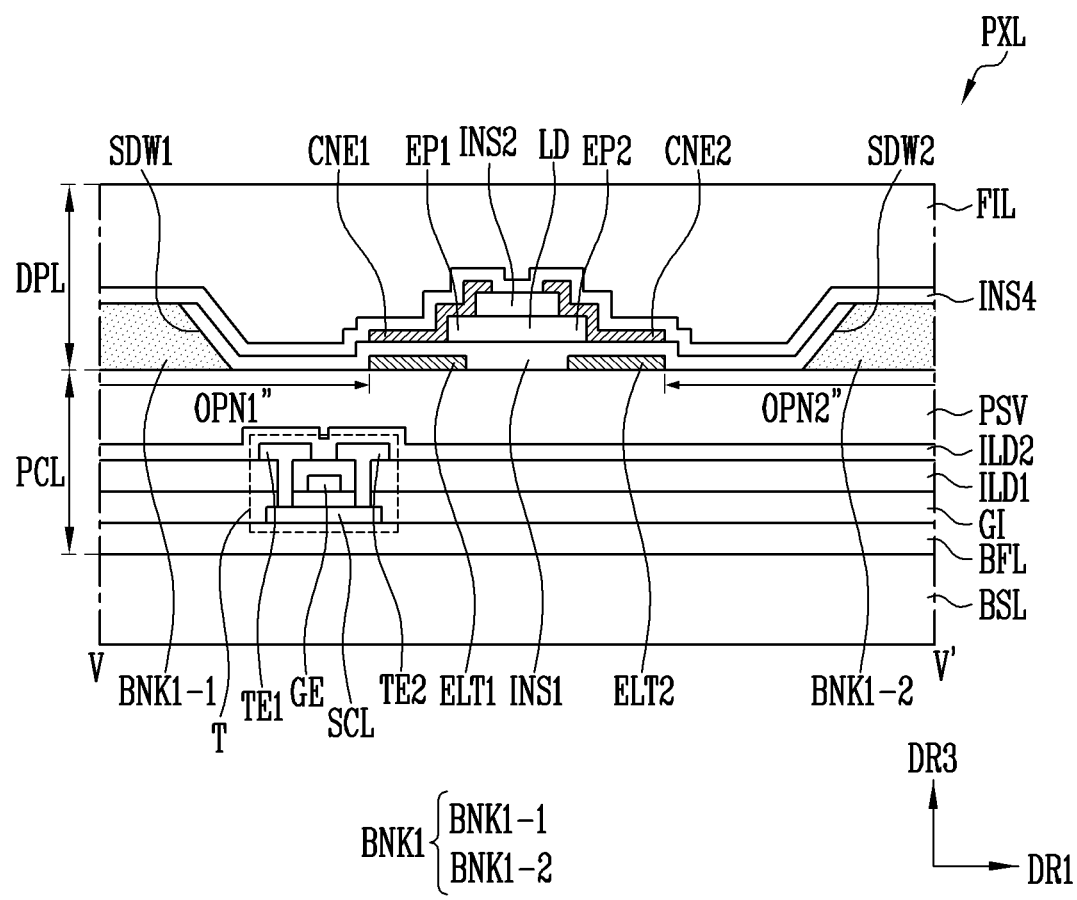

FIG. 16A and FIG. 16B respectively illustrate a schematic cross-sectional view of a pixel PXL according to an embodiment. For example, FIG. 16A and FIG. 16B illustrate different embodiments of a cross-section of the pixel PXL taken along line V-V' of FIG. 15A. For example, FIG. 16A illustrates an embodiment in which the first and second contact electrodes CNE1 and CNE2 are formed in different processes and the third insulation layer INS3 is interposed between the first and second contact electrodes CNE1 and CNE2. FIG. 16B illustrates an embodiment in which the first and second contact electrodes CNE1 and CNE2 are formed or disposed on the same layer.

In embodiments of FIG. 15A to FIG. 16B, detailed descriptions of configurations similar to or identical to those of the above-described embodiments will be omitted.

Referring to FIG. 15A to FIG. 16B, the pixel PXL may include a first opening OPN1" formed in the first area AR1 adjacent to the first end portions EP1 of the light emitting elements LD, and a second opening OPN2" formed in the second area AR2 adjacent to the second end portions EP2 of the light emitting elements LD. In embodiments of FIG. 15A to FIG. 16B, the first opening OPN1" may be formed in the first electrode ELT1 and the first contact electrode CNE1, and the second opening OPN2" may be formed in the second electrode ELT2 and the second contact electrode CNE2.

For example, the first opening OPN1" may include a (1-1)-th opening OPN1-1 formed in the first electrode ELT1 and a (1-2)-th opening OPN1-2 formed in the first contact electrode CNE1. In an embodiment, the (1-1)-th opening OPN1-1 and the (1-2)-th opening OPN1-2 may have the same or similar shape and/or size. For example, as illustrated in FIG. 15A, the (1-1)-th opening OPN1-1 and the (1-2)-th opening OPN1-2 may have similar shapes and sizes to each other. In an embodiment, the (1-1)-th opening OPN1-1 and the (1-2)-th opening OPN1-2 may have different shapes and/or sizes. For example, as illustrated in FIG. 15B, the (1-1)-th opening OPN1-1 and the (1-2)-th opening OPN1-2 may have different shapes and sizes. For example, one end or an end or ends of the (1-1)-th opening OPN1-1 and the (1-2) opening OPN1-2 may be disposed at the same point on the first direction DR1 as illustrated in FIG. 15A, or may be disposed at different points on the first direction DR1 as illustrated in FIG. 15B. For example, the (1-1)-th opening OPN1-1 and the (1-2)-th opening OPN1-2 may be formed at a similar or identical position, or may be formed at different positions. For example, the (1-1)-th opening OPN1-1 and the (1-2)-th opening OPN1-2 may overlap each other, but are not limited thereto.

Similarly, the second opening OPN2" may include a (2-1)-th opening OPN2-1 formed in the second electrode ELT2 and a (2-2)-th opening OPN2-2 formed in the second contact electrode CNE2. In an embodiment, the (2-1)-th opening OPN2-1 and the (2-2)-th opening OPN2-2 may have the same or similar shape and/or size. For example, as illustrated in FIG. 15A, the (2-1)-th opening OPN2-1 and the (2-2)-th opening OPN2-2 may have similar shapes and sizes to each other. In an embodiment, the (2-1)-th opening OPN2-1 and the (2-2)-th opening OPN2-2 may have different shapes and/or sizes. For example, as illustrated in FIG. 15B, the (2-1)-th opening OPN2-1 and the (2-2)-th opening OPN2-2 may have different shapes and sizes. For example, one end or an end or ends of the (2-1)-th opening OPN2-1 and the (2-2) opening OPN2-2 may be disposed at the same point on the first direction DR1 as illustrated in FIG. 15A, or may be disposed at different points on the first direction DR1 as illustrated in FIG. 15B. For example, the (2-1)-th opening OPN2-1 and the (2-2)-th opening OPN2-2 may be formed at a similar or identical position, or may be formed at different positions. For example, the (2-1)-th opening OPN2-1 and the (2-2)-th opening OPN2-2 may overlap each other, but are not limited thereto.

For example, as illustrated in FIG. 16A, in a case that the pixel PXL may include the third insulation layer INS3, the third insulation layer INS3 may also be opened in the second area AR2. The third insulation layer INS3 may be opened in an identical or similar shape and/or size to that of the (2-1)-th opening OPN2-1 and/or the (2-2)-th opening OPN2-2, or may be opened in different shapes and/or sizes from that of the (2-1)-th opening OPN2-1 and/or the (2-2)-th opening OPN2-2. For example, the third insulation layer INS3 may be opened in an area in which the (2-2)-th opening OPN2-2 may be formed, but is not limited thereto.

In addition to embodiments illustrated in FIG. 15A to FIG. 16B, the first and second openings OPN1" and OPN2" may be formed in the pixel PXL by combining at least one of embodiments of FIG. 11A to FIG. 12B and at least one of embodiments of FIG. 13A to FIG. 14B. For example, embodiments of FIG. 11A to FIG. 12B and embodiments of FIG. 13A to FIG. 14B may be combined in all possible combinations.

According to an above-described embodiment, on the path through which the light emitted from the light emitting elements LD may pass, by forming the first and second openings OPN1" and OPN2" in the first and second electrodes ELT1 and ELT2, the first and second contact electrodes CNE1 and CNE2, and/or the third insulation layer INS3, absorption of light by the first and second electrodes ELT1 and ELT2, and/or the optical waveguide in the non-front direction of the display panel PNL due to a high refractive index layer such as the first and second contact electrodes CNE1 and CNE2 and the third insulation layer INS3 may be reduced or prevented. Therefore, the light efficiency may be improved by reducing the light loss of the pixel PXL.

According to embodiments of FIG. 11A to FIG. 16B, in the first area AR1 adjacent to the first end portion EP1 of the light emitting element LD included in the light source of the pixel PXL, the first openings OPN1, OPN1', and OPN1" may be formed in at least one of the first electrode ELT1 and the first contact electrode CNE1. For example, in the second area AR2 adjacent to the second end portion EP2 of the light emitting element LD, the second openings OPN2, OPN2', and OPN2" are formed in at least one of the second electrode ELT2 and the second contact electrode CNE2. For example, in an embodiment, an opening may also be formed in at least one high refractive insulation film that is the path of the in-plane optical waveguide, for example, the third insulation layer INS3. Accordingly, it is possible to improve the light efficiency of the pixel PXL by reducing or preventing light loss that may occur within the pixel PXL.

On the other hand, in above-described embodiments, at least one first opening OPN1, OPN1', or OPN1" and at least one second opening OPN2, OPN2', or OPN2" are formed in the first area AR1 and the second area AR2, respectively, but the disclosure is not limited thereto. For example, depending on the structure of the pixel PXL and/or the desired light emitting characteristic, the first opening OPN1, OPN1', or OPN1" or the second opening OPN2, OPN2', or OPN2" may be formed only in the area adjacent to one of the first and second end portions EP1 and EP2 of the light emitting elements LD, while an opening may not be formed in an area adjacent to the remaining end portion.

Figure 17A:
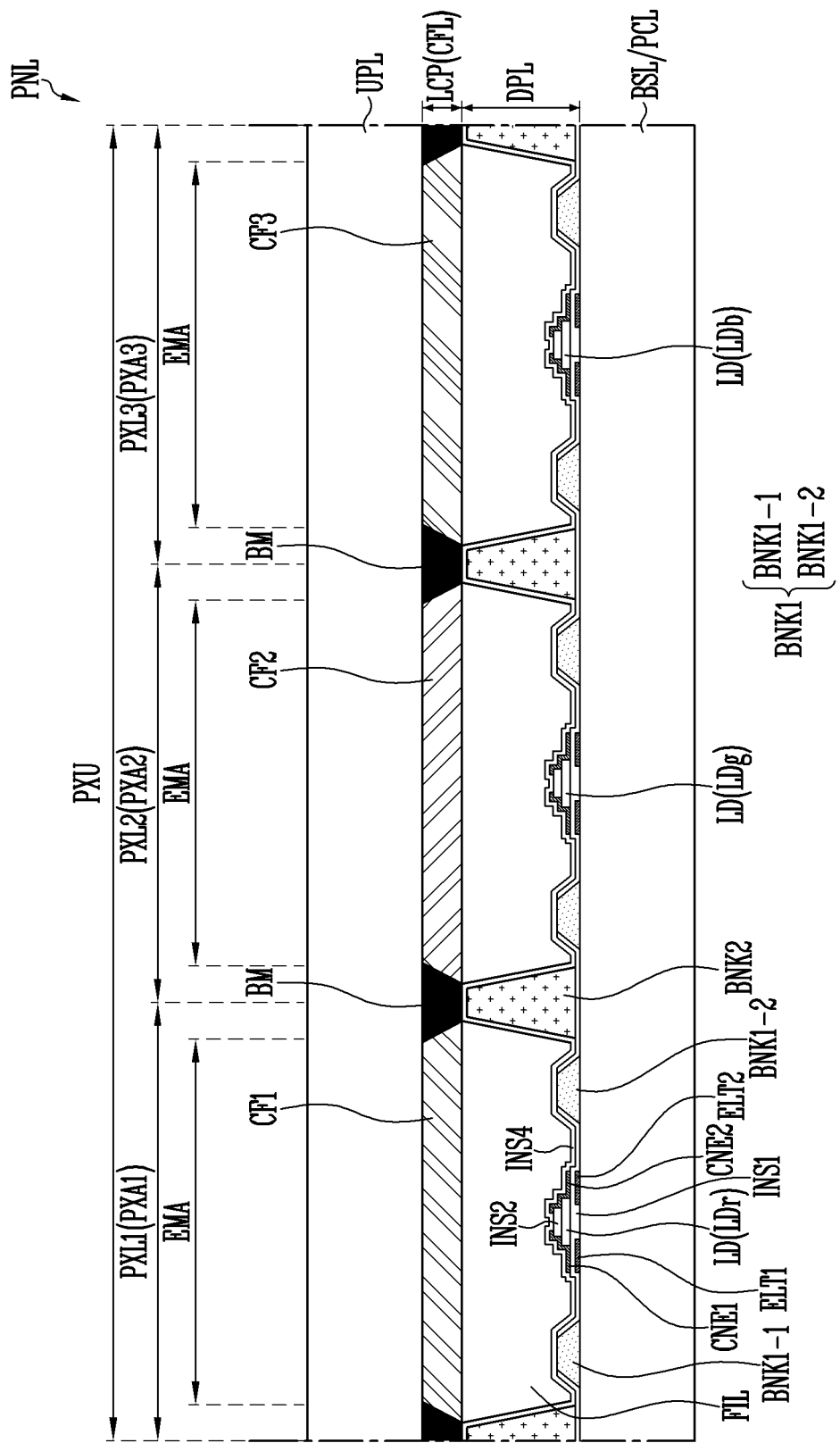
FIG. 17A and FIG. 17B respectively illustrate a schematic cross-sectional view of a pixel according to an embodiment.
Figure 17B:
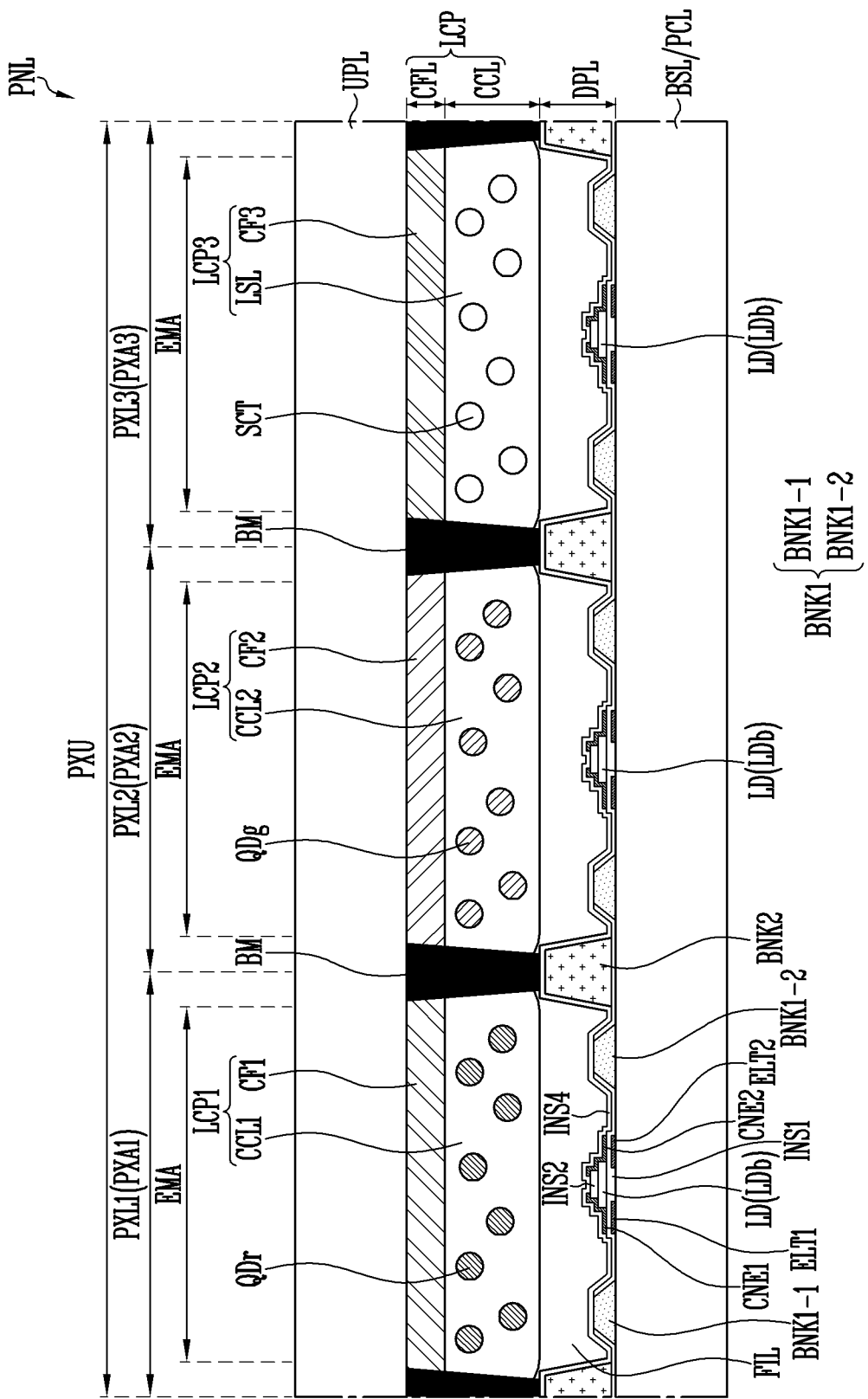

FIG. 17A and FIG. 17B respectively illustrate a schematic cross-sectional view of a pixel according to an embodiment. For example, FIG. 17A and FIG. 17B illustrate an embodiment of a cross-section of one or an area of the display panel PNL including the pixel PXL according to an embodiment of FIG. 16B. For example, FIG. 17A illustrates an embodiment of a display panel PNL that does not include color conversion particles (for example, red and green quantum dots QDr and QDg), and FIG. 17B illustrates an embodiment of a display panel PNL including the color conversion particles. For example, the display device according to the disclosure may selectively include the color conversion particles disposed at an upper portion of the pixels PXL.

In an embodiment, FIG. 17A and FIG. 17B illustrate schematic cross-sectional views of the display panel PNL, based on an area in which one pixel unit PXU including a first color pixel PXL1, a second color pixel PXL2, and a third color pixel PXL3 adjacent to each other is disposed. On the other hand, since the structure of an embodiment of each pixel PXL has been described in detail through above-described embodiments, FIG. 17A and FIG. 17B schematically illustrate the structure of each pixel PXL based on one light emitting element LD, respectively. For example, in embodiments of FIG. 17A and FIG. 17B, the same reference numerals are denoted to similar or identical constituent elements to those of embodiments described above, and detailed descriptions thereof will be omitted.

First, referring to FIG. 5 to FIG. 17A, the light source unit LSU of each pixel PXL may be disposed in the display layer DPL on the base layer BSL and/or the circuit layer PCL. For example, in each light emitting area EMA of the display layer DPL, the light source unit LSU of the corresponding pixel PXL may be disposed. For example, the second bank BNK2 for partitioning each light emitting area EMA may be disposed between adjacent light emitting areas EMA.

The light source unit LSU, which may be variously configured or structured according to embodiments, may be formed or disposed in the light emitting area EMA of each pixel PXL. For example, the first bank BNK1, the first and second electrodes ELT1 and ELT2, the light emitting elements LD, the first and second contact electrodes CNE1 and CNE2, and the first, second, and fourth insulation layers INS1, INS2, and INS4, which are illustrated in FIG. 16B, may be disposed in each light emitting area EMA. For example, the filler layer FIL may be disposed on the fourth insulation layer INS4. In an embodiment, the first and second electrodes ELT1 and ELT2 and/or the first and second contact electrodes CNE1 and CNE2 may be partially opened at both end portions of the light emitting elements LD.

The first, second, and third color pixels PXL1, PXL2, and PXL3 may have light emitting elements LD that emit light of different colors. For example, each first color pixel PXL1 may include a first color light emitting element LDr, each second color pixel PXL2 may include a second color light emitting element LDg, and each third color pixel PXL3 may include a third color light emitting element LDb. In an embodiment, the first color light emitting element LDr, the second color light emitting element LDg, and the third color light emitting element LDb may be a red light emitting element, a green light emitting element, and a blue light emitting element, respectively, but disclosure is not limited thereto.

The second bank BNK2 may be disposed in a boundary area of the first, second, and third color pixel areas PXA1, PXA2, and PXA3 in which the first, second, and third color pixels PXL1, PXL2, and PXL3 may be provided or disposed, respectively, to surround the light emitting area EMA of each pixel PXL. For example, the second bank BNK2 may be disposed at an edge of the display area DA to surround the display area DA in which the pixels PXL may be disposed. Hereinafter, when referring to an arbitrary pixel area among the first, second, and third color pixel areas PXA1, PXA2, and PXA3, or when comprehensively referring to two or more thereof, it will be referred to as the "pixel area PXA" or "pixel areas PXA".

The position of the second bank BNK2 (for example, the position of each layer in a cross-section view) or the formation step thereof may be variously changed according to embodiments. For example, the shape, size, and/or material of the second bank BNK2 may be variously changed according to the design conditions of the display panel PNL. For example, the second bank BNK2 may be a single-layered or multi-layered pattern having a cross-section of various shapes including substantially a trapezoid, semi-circle, or semi-ellipse, and its size (for example, width and/or height) or material may be variously changed.

In an embodiment, an upper substrate UPL may be disposed on the pixels PXL. For example, the upper substrate UPL (also referred to as the "encapsulation substrate" or "color filter substrate") that encapsulates at least display area DA may be disposed on one or a surface of the base layer BSL in which the pixels PXL.

The upper substrate UPL may selectively include a light conversion layer LCP overlapping the pixels PXL. For example, the light conversion layer LCP including a color filter layer CFL may be disposed on one or a surface of the upper substrate UPL facing the pixels PXL.

The color filter layer CFL may include a color filter that matches the color of each pixel PXL. For example, the color filter layer CFL may include a first color filter CF1 disposed at an upper portion of the first color pixel PXL1 to selectively transmit light generated by the first color pixel PXL1, a second color filter CF2 disposed at an upper portion of the second color pixel PXL2 to selectively transmit light generated by the second color pixel PXL2, and a third color filter CF3 disposed at an upper portion of the third color pixel PXL3 to selectively transmit light generated by the third color pixel PXL3. In an embodiment, the first color filter CF1, the second color filter CF2, and the third color filter CF3 may be a red color filter, a green color filter, and a blue color filter, respectively, but the disclosure is not limited thereto. Hereinafter, when referring to one of the first color filter CF1, the second color filter CF2, and the third color filter CF3, or when comprehensively referring to two or more thereof, it will be referred to as the "color filter CF" or "color filters CF".

The first color filter CF1 may include a color filter material that may be disposed between the first color pixel PXL1 and the upper substrate UPL, and selectively transmit light of the first color generated by the first color pixel PXL1. For example, in a case that the first color pixel PXL1 is a red pixel, the first color filter CF1 may include a red color filter material.

The second color filter CF2 may include a color filter material that may be disposed between the second color pixel PXL2 and the upper substrate UPL, and selectively transmit light of the second color generated by the second color pixel PXL2. For example, in a case that the second color pixel PXL2 is a green pixel, the second color filter CF2 may include a green color filter material.

The third color filter CF3 may include a color filter material that may be disposed between the third color pixel PXL3 and the upper substrate UPL, and selectively transmit light of the third color generated by the third color pixel PXL3. For example, in a case that the third color pixel PXL3 is a blue pixel, the third color filter CF3 may include a blue color filter material.

A black matrix BM may be disposed between the color filters CF. For example, the black matrix BM may be disposed on one or a surface of the upper substrate UPL to face the second bank BNK2. The black matrix BM may be disposed in boundary areas of the pixel areas PXA to not cover or overlap each light emitting area EMA.

The black matrix BM may include at least one black matrix material (for example, at least one light-blocking material) among various types of black matrix materials, and/or a color filter material of a specific or predetermined color. For example, the black matrix BM may be made of the same or similar material as that of the second bank BNK2, but is not limited thereto. For example, the black matrix BM and the second bank BNK2 may include the same or similar material, or different materials.

In an embodiment, a space between a lower panel of the display panel PNL including the base layer BSL and the display layer DPL and an upper panel of the display panel PNL including the upper substrate UPL and the light conversion layer LCP may be filled with the filler layer FIL having a relatively low refractive index in a range of approximately 1 to 1.6. In an embodiment, the space between the lower panel and the upper panel of the display panel PNL may be filled with a layer of air.

FIG. 17A illustrates an embodiment in which the upper substrate UPL is disposed on the base layer BSL in which the pixels PXL are disposed, but the disclosure is not limited thereto. For example, the pixels PXL may be sealed by using a thin film encapsulation layer or the like within the spirit and the scope of the disclosure. The color filters CF and/or the black matrix BM may be selectively provided or disposed in a window (not illustrated) disposed on the display panel PNL.

Referring to FIG. 17B, the upper substrate UPL may include the light conversion layer LCP overlapping the pixels PXL. The light conversion layer LCP may include the color filter layer CFL and/or the color conversion layer CCL that are disposed on the upper substrate UPL to face the pixels PXL. The color conversion layer CCL may be disposed between the color filter layer CFL and the pixels PXL, and may include respective color conversion particles.

The light conversion layer LCP may include a first light conversion layer LCP1 disposed on the first color pixel PXL1, a second light conversion layer LCP2 disposed on the second color pixel PXL2, and a third light conversion layer LCP3 disposed on the third color pixel PXL3. Hereinafter, when referring to one of the first light conversion layer LCP1, the second light conversion layer LCP2, and the third light conversion layer LCP3, or when comprehensively referring to two or more thereof, it will be referred to as the "light conversion layer LCP" or "light conversion layers LCP".

At least some or a number of the first, second, and third light conversion layers LCP1, LCP2, and LCP3 may include the color conversion layer CCL and/or the color filter layer CFL that correspond to a predetermined color. For example, the first light conversion layer LCP1 may include at least one of a first color conversion layer CCL1 including first color conversion particles corresponding to a first color and a first color filter CF1 selectively transmitting light of the first color. Similarly, the second light conversion layer LCP2 may include at least one of a second color conversion layer CCL2 including second color conversion particles corresponding to a second color and a second color filter CF2 selectively transmitting light of the second color. The third light conversion layer LCP3 may include at least one of a light scattering layer LSL including light scattering particles SCT and a third color filter CF3 selectively transmitting light of a third color.

In an embodiment, at least one insulation layer (not illustrated) may be disposed on a surface of each of the first color conversion layer CCL1, the second color conversion layer CCL2, and/or the light scattering layer LSL. For example, between the first color conversion layer CCL1, the second color conversion layer CCL2, and/or the light scattering layer LSL and each color filter CF, and/or on the surface of each of the first color conversion layer CCL1, the second color conversion layer CCL2, and/or the light scattering layer LSL, each insulation layer (for example, a capping layer, a buffer layer, and/or a barrier layer) for protecting the first color conversion layer CCL1, the second color conversion layer CCL2, and/or the light scattering layer LSL may be disposed.

In an embodiment, the first, second, and third color pixels PXL1, PXL2, and PXL3 may include the light emitting elements LD that emit light of the same color. For example, the first color, second color, and third color pixels PXL1, PXL2, and PXL3 may include third color light emitting elements LDb that emit blue light in a wavelength band in a range of approximately 400 nm to approximately 500 nm. For example, the color conversion layer CCL including at least one type of color conversion particles may be disposed on at least some or a number of the pixels PXL among the first, second, and third color pixels PXL1, PXL2, and PXL3. Thus, the display device according to an embodiment may display a full-color image.

The first color conversion layer CCL1 may be disposed on one or a surface of the upper substrate UPL to face the first color pixel PXL1, and may include the first color conversion particles that convert light of the third color emitted by the third color light emitting element LDb disposed in the first color pixel PXL1 into light of the first color. For example, in a case that the third color light emitting element LDb disposed in the first color pixel PXL1 is a blue light emitting element that emits blue light and the first color pixel PXL1 is a red pixel, the first color conversion layer CCL1 may include a red quantum dot QDr that converts blue light emitted from the blue light emitting element into red light.

For example, the first color conversion layer CCL1 may include a plurality of red quantum dots QDr dispersed in a predetermined matrix material such as a transparent resin. The red quantum dot QDr may absorbs blue light and shift a wavelength thereof according to energy transition to emit red light in a wavelength band in a range of approximately 620 nm to approximately 780 nm. In a case that the first color pixel PXL1 is a pixel of a different color, the first color conversion layer CCL1 may include a first quantum dot corresponding to a color of the first color pixel PXL1.

In an embodiment, the second color conversion layer CCL2 may be disposed on one or a surface of the upper substrate UPL to face the second color pixel PXL2, and may include the second color conversion particles that convert light of the third color emitted by the third color light emitting element LDb disposed in the second color pixel PXL2 into light of the second color. For example, in a case that the third color light emitting element LDb disposed in the second color pixel PXL2 is a blue light emitting element that emits blue light and the second color pixel PXL2 is a green pixel, the second color conversion layer CCL2 may include a green quantum dot QDr that converts blue light emitted from the blue light emitting element into green light.

For example, the second color conversion layer CCL2 may include a plurality of green quantum dots QDg dispersed in a predetermined matrix material such as a transparent resin. The green quantum dot QDg may absorbs blue light and shift a wavelength thereof according to energy transition to emit green light in a wavelength band in a range of approximately 500 nm to approximately 570 nm. In a case that the second color pixel PXL2 is a pixel of a different color, the second color conversion layer CCL2 may include a second quantum dot corresponding to a color of the second color pixel PXL2.

Each of the first and second quantum dots (for example, the red quantum dots QDr and the green quantum dots QDg) may be selected from a group II-IV compound, a group IV-VI compound, a group IV element, a group IV compound, and a combination thereof, but is not limited thereto.

The first and second quantum dots may have a full width of half maximum (FWHM) of a light emitting wavelength spectrum of approximately 45 nm or less, and light emitted through the first and second quantum dots may be emitted in a front direction. Accordingly, a viewing angle of the display device may be improved.

The first quantum dot and the second quantum dot may have a shape substantially that of a spherical, pyramidal, or multi-arm, or a cube of a nano particle, a nanotube, a nano wire, a nano fiber, a nano plate-shaped particle, for example, but the disclosure is not limited thereto. For example, the shapes of the first quantum dot and the second quantum dot may be variously changed.

In an embodiment, blue light having a relatively short wavelength among the visible ray bands is incident on the red quantum dot QDr and the green quantum dot (QDg), respectively, thereby increasing an absorption coefficient of the red quantum dot QDr and the green quantum dot QDg. Accordingly, the efficiency of light emitted from the first color pixel PXL1 and the second color pixel PXL2 may be finally increased, and excellent color reproducibility may be secured. For example, the light source unit LSU of the first color, second color, and third color pixels PXL1, PXL2, and PXL3 may be configured or formed by using the light emitting elements LD of the same color (for example, the third color light emitting elements LDb), thereby increasing the manufacturing efficiency of the display device.

In an embodiment, the light scattering layer LSL may be disposed on one or a surface of the upper substrate UPL to face the third color pixel PXL3. For example, the light scattering layer LSL may be disposed between the third color pixel PXL3 and the third color filter CF3.

In an embodiment, in a case that the third color light emitting element LDb disposed in the third color pixel PXL3 is a blue light emitting element emitting blue light, and in a case that the third color pixel PXL3 is a blue pixel, the light scattering layer LSL may be selectively provided or disposed to efficiently use the light emitted from the third color light emitting element LDb. The light scattering layer LSL may include at least one type of light scattering particles SCT.

For example, the light scattering layer LSL may include a plurality of light scattering particles SCT dispersed in a predetermined matrix material such as a transparent resin. For example, the light scattering layer LSL may include light scattering particles SCT such as a titanium dioxide ($TiO_2$) or silica. In the disclosure, the material included in the light scattering particles SCT is not particularly limited, and the light scattering layer LSL may include various types of light scattering particles SCT. On the other hand, the light scattering particles SCT need not be disposed only in the third pixel area PXA3 in which the third color pixel PXL3 may be formed or disposed. For example, the light scattering particles SCT may be selectively included in the first and/or second color conversion layers CCL1 and CCL2.

In an embodiment, the black matrix BM may at least extend in a thickness (or height) direction to be disposed between the first color conversion layer CCL1, the second color conversion layer CCL2, and the light scattering layer LSL. For example, the black matrix BM may have a single-layered or multi-layered pattern having a thickness corresponding to the total thickness of the light conversion layer LCP including the color filter layer CFL and the color conversion layer CCL (for example, a thickness substantially equal to or similar to the total thickness of the light conversion layer LCP). In a case that the black matrix BM is disposed between the first color conversion layer CCL1, the second color conversion layer CCL2, and the light scattering layer LSL in a form capable of partitioning areas in which the first color conversion layer CCL1, the second color conversion layer CCL2, and the light scattering layer LSL may be formed or disposed, the first color conversion layer CCL1, the second color conversion layer CCL2, and/or the light scattering layer LSL may be formed through an inkjet method or the like within the spirit and the scope of the disclosure.

According to an embodiment of FIG. 17B, the pixels PXL and the display device including the same may be easily manufactured by using the single color light emitting elements LD (for example, the third color light emitting elements LDb). For example, a full-color pixel unit PXU and a display device including the same may be manufactured by disposing the color conversion layer CCL on at least some or a number of the pixels PXL.

The disclosure has been described according to embodiments, but it will be understood that the foregoing embodiments are provided only for illustration while not limiting the disclosure. In addition, it will be understood by those skilled in the art that various changes in form and details may be made therein without departing from the scope of the disclosure.

The scope of the disclosure may be determined by the accompanying claims. In addition, all changes or modifications within the meaning and range of the claims and their equivalents will be interpreted as including the range of the disclosure.

What is claimed is:

1. A display device comprising:
    a pixel disposed in a display area, wherein the pixel includes:
        a first electrode and a second electrode spaced apart from each other;
        a light emitting element disposed between the first electrode and the second electrode, the light emitting element including a first end portion and a second end portion;
        a third electrode disposed on the first end portion of the light emitting element and electrically connecting the first end portion of the light emitting element to the first electrode; and
        a fourth electrode disposed on the second end portion of the light emitting element and electrically connecting the second end portion of the light emitting element to the second electrode; and an opening formed in at least one of the first electrode, the second electrode, the third electrode, and the fourth electrode and disposed in a first area and a second area that are adjacent to the first end portion and the second end portion of the light emitting element.

2. The display device of claim 1, wherein the opening includes:
   a first opening formed in at least one of the first electrode and the third electrode in the first area; and
   a second opening formed in at least one of the second electrode and the fourth electrode in the second area.

3. The display device of claim 2, wherein the first opening and the second opening are substantially symmetrical to each other in an area in which the light emitting element is disposed.

4. The display device of claim 2, wherein
   the first opening is spaced apart from a side of the first electrode facing the second electrode by a first distance, and
   the second opening is spaced apart from a side of the second electrode facing the first electrode by a second distance, the second distance being identical to the first distance.

5. The display device of claim 2, wherein
   the first electrode and the third electrode are disposed at a side of the light emitting element, and the second electrode and the fourth electrode are disposed at another side of the light emitting element;
   an opening in an area of the first electrode or the third electrode forms the first opening; and
   an opening in an area of the second electrode or the fourth electrode forms the second opening.

6. The display device of claim 2, wherein
   the first opening is formed inside the first electrode and the third electrode in a plan view; and
   the second opening is formed inside the second electrode and the fourth electrode in a plan view.

7. The display device of claim 1, wherein the pixel further includes a bank disposed below the first electrode and the second electrode.

8. The display device of claim 7, wherein the opening extends from an area between a bank area in which the bank is disposed and the light emitting element to an area overlapping the bank area, in each of the first area and the second area.

9. The display device of claim 7, wherein the opening is formed in an area between a bank area in which the bank is disposed and the light emitting element, in each of the first area and the second area.

10. The display device of claim 1, wherein the opening includes:
    a plurality of first openings formed in the first area, each of the plurality of first openings extending in a horizontal direction, a vertical direction, or a diagonal direction; and
    a plurality of second openings formed in the second area, each of the plurality of second openings extending in a horizontal direction, a vertical direction, or a diagonal direction.

11. The display device of claim 1, wherein the opening includes:
    a first opening formed in the first electrode in the first area; and
    a second opening formed in the second electrode in the second area.

12. The display device of claim 1, wherein the opening includes:
    a first opening formed in the third electrode in the first area; and
    a second opening formed in the fourth electrode in the second area.

13. The display device of claim 1, wherein the opening includes:
    a first opening formed in the first electrode and the third electrode in the first area; and
    a second opening formed in the second electrode and the fourth electrode in the second area.

14. The display device of claim 1, wherein the display device further includes at least one of:
    a first insulation layer disposed on an area of the first electrode and the second electrode and exposing another area of the first electrode and the second electrode;
    a second insulation layer disposed on an area of the light emitting element and exposing the first end portion and the second end portion of the light emitting element;
    a third insulation layer disposed on the second insulation layer and the fourth electrode; and
    a fourth insulation layer disposed on the first electrode, the second electrode, the third electrode, the fourth electrode, and the light emitting element.

15. The display device of claim 14, wherein the third insulation layer is opened in the second area.

16. The display device of claim 15, wherein
    the second insulation layer and the third insulation layer include a same material, and
    the second insulation layer is disposed on an area of the light emitting element and not disposed in the first area and the second area.

17. The display device of claim 14, further comprising a filler layer disposed on the fourth insulation layer.

18. The display device of claim 1, wherein
    the first electrode is electrically connected to the third electrode in an edge area of the third electrode; and
    the second electrode is electrically connected to the fourth electrode in an edge area of the fourth electrode.

19. A pixel comprising:
    a first electrode;
    a second electrode spaced apart from the first electrode;
    a light emitting element disposed between the first electrode and the second electrode, the light emitting element including a first end portion and a second end portion;
    a third electrode disposed on the first end portion of the light emitting element and electrically connecting the first end portion of the light emitting element to the first electrode;
    a fourth electrode disposed on the second end portion of the light emitting element and electrically connecting the second end portion of the light emitting element to the second electrode; and
    an opening formed in at least one of the first electrode, the second electrode, the third electrode, and the fourth electrode and disposed in a first area and a second area that are adjacent to the first end portion and the second end portion of the light emitting element.

20. The pixel of claim 19, further comprising an insulation layer disposed on the fourth electrode, wherein
    the insulation layer includes an end disposed between the third electrode and the fourth electrode, and
    the insulation layer is opened in the second area.

* * * * *